United States Patent
Liang et al.

(10) Patent No.: US 12,375,103 B2
(45) Date of Patent: Jul. 29, 2025

(54) 9B/10B ENCODING AND DECODING METHOD

(71) Applicant: NOREL SYSTEMS LIMITED, Tianjin (CN)

(72) Inventors: Ke Liang, Tianjin (CN); Yuanlong Wang, Tianjin (CN)

(73) Assignee: NOREL SYSTEMS LIMITED, Tianjin (CN)

( * ) Notice: Subject to any disclaimer, the term of this patent is extended or adjusted under 35 U.S.C. 154(b) by 180 days.

(21) Appl. No.: 18/279,425

(22) PCT Filed: Jan. 13, 2022

(86) PCT No.: PCT/CN2022/071737
§ 371 (c)(1),
(2) Date: Aug. 30, 2023

(87) PCT Pub. No.: WO2022/144030
PCT Pub. Date: Jul. 7, 2022

(65) Prior Publication Data
US 2024/0250695 A1  Jul. 25, 2024

(30) Foreign Application Priority Data
Dec. 30, 2020 (CN) .......................... 202011617755.8

(51) Int. Cl.
*H03M 7/00* (2006.01)
*H03M 7/30* (2006.01)
*H03M 7/46* (2006.01)

(52) U.S. Cl.
CPC ........... *H03M 7/46* (2013.01); *H03M 7/6005* (2013.01); *H03M 7/6011* (2013.01)

(58) Field of Classification Search
CPC .... H03M 7/46; H03M 7/6005; H03M 7/6011; H03M 5/145; H03M 5/14
(Continued)

(56) References Cited

U.S. PATENT DOCUMENTS 6,614,369 B1 * 9/2003 Widmer .................. H03M 5/04
341/59
6,747,580 B1 * 6/2004 Schmidt ............... H03M 5/145
341/50
(Continued)

FOREIGN PATENT DOCUMENTS

CN 101764617 A 6/2010
CN 101777966 A 7/2010
(Continued)

OTHER PUBLICATIONS

International Search Report, PCT/CN2022/071737, Mar. 29, 2022.

*Primary Examiner* — Jean B Jeanglaude
(74) *Attorney, Agent, or Firm* — Troutman Pepper Locke LLP; Tim Tingkang Xia, Esq.

(57) ABSTRACT

A 9B/10B encoding method is used for encoding a 9-bit source sequence set, including first type, second type and third type of 9-bit source sequence sets, into a 10-bit target sequence set. The first type of 9-bit source sequence set only includes 9-bit source sequences with difference values of 1 and −1. After inserting 1-bit data "0" or "1" in each sequence, each sequence is encoded as a 10-bit target balanced sequence; the second type of 9-bit source sequence set alternatively includes only 9-bit source sequences with difference values of 3 or −3. After inserting 1-bit data "0" or "1" into each sequence, each sequence is encoded into a pair of 10-bit target unbalanced sequences with a difference value of ±2; each sequence in the third type of 9-bit source sequence set is encoded as a pair of 10-bit target unbalanced sequences that are opposite numbers for each other.

42 Claims, 15 Drawing Sheets

(58) Field of Classification Search
USPC .................................................. 341/50, 51
See application file for complete search history.

(56) References Cited

U.S. PATENT DOCUMENTS

| | | | |
|---|---|---|---|
| 7,187,307 B1 * | 3/2007 | Schmidt | H04L 25/4908 |
| | | | 341/51 |
| 7,405,679 B1 | 7/2008 | Widmer | |
| 7,592,933 B2 * | 9/2009 | Widmer | H03M 7/20 |
| | | | 341/59 |
| 8,432,302 B2 * | 4/2013 | Feng | H03M 5/145 |
| | | | 341/58 |
| 2020/0090615 A1 * | 3/2020 | Zhu | H03M 7/30 |

FOREIGN PATENT DOCUMENTS

| | | |
|---|---|---|
| CN | 101847997 A | 9/2010 |
| CN | 112838868 A | 5/2021 |
| EP | 1988637 A2 | 11/2008 |

* cited by examiner (a) (b)

(c) (d)

(e) (f)

(g) (h)

9B/10B ENCODING AND DECODING METHOD

TECHNICAL FIELD

The present invention relates to the technical field of communication, in particular to a coding and decoding method of DC balanced codes.

BACKGROUND

DC balanced code is a common coding method in communication field. When transmitting signals on transmission lines, using DC balanced code can make the number of "0" and "1" in data basically equal, and eliminate the DC component of signals during data transmission, so as to recover the clock and data at the receiving end. Commonly used DC balance codes comprise 8B/10B code and 9B/10B code, among which 8B/10B code has low coding efficiency and 20% redundancy, while 9B/10B code can not only achieve DC balance, but also achieve high coding efficiency and reduce redundancy to 10%, which can be considered as a relatively better coding method.

Most of the existing 9B/10B codes encode 9-bit data by using look-up table method or complicated classification and calculation method, which leads to more resource consumption in implementation. Therefore, it is necessary to study a new 9B/10B coding and decoding method to simplify the implementation method and reduce the resource expenditure.

SUMMARY

The technical problem to be solved by the present invention is how to encode a 9-bit sequence set into a 10-bit sequence set, so as to eliminate the DC component of the signal in the data transmission process, so as to facilitate the recovery of the clock and data at the receiving end, and at the same time, to avoid the problems of simplifying the implementation method and reducing the resource overhead by using a table lookup method.

In order to solve the technical problems, the technical solution adopted by the present invention is as follows:

A 9B/10B encoding method according to the present invention is used for encoding a 9-bit source sequence set into a 10-bit target sequence set; each sequence in the 9-bit source sequence set is a 9-bit binary number, and each sequence in the encoded 10-bit target sequence set is a 10-bit binary number, and the 10-bit target sequence set comprises balanced sequences and unbalanced sequences, and different 9-bit source sequences are encoded into different 10-bit target sequences.

The 9-bit source sequence set comprises a first type of 9-bit source sequence set, a second type of 9-bit source sequence set and a third type of 9-bit source sequence set, wherein the three types of 9-bit source sequence sets are disjoint, and a unified set of the three types of 9-bit source sequence sets has 512 non-repetitive 9-bit source sequences in total.

The first type of 9-bit source sequence set only comprises 9-bit source sequences with difference values of 1 and −1, and each 9-bit source sequence in the first type of 9-bit source sequence set is encoded into a 10-bit target balanced sequence after inserting 1-bit data "0" or "1" at a same position of each 9-bit source sequence in the first type of 9-bit source sequence set.

Preferably, when i1-bit data is inserted at the same position of each 9-bit source sequence in the first type of 9-bit source sequence set, the same position is the leftmost or rightmost position of the 9-bit source sequence, and the inserted 1-bit data is at a highest or lowest bit in the encoded 10-bit target balanced sequence.

The second type of 9-bit source sequence set alternatively comprises only 9-bit source sequences with a difference value of 3 or only 9-bit source sequences with a difference value of −3.

If the second type of 9-bit source sequence set only comprises 9-bit source sequences with a difference value of 3, 1-bit data "0" is inserted into the 9-bit source sequence, and the formed 10-bit target sequence and an opposite number thereof form a pair of 10-bit target unbalanced sequences with a difference value of ±2, which are codes of the 9-bit source sequence with a difference value of 3.

If the second type of 9-bit source sequence set only comprises 9-bit source sequences with a difference value of −3, 1-bit data is inserted into the 9-bit source sequence, and the formed 10-bit target sequence and an opposite number thereof form a pair of 10-bit target unbalanced sequences with a difference value of ±2, which are codes of the 9-bit source sequence with a difference value of −3.

Preferably, when 1-bit data "0" is inserted into the 9-bit source sequence of the second type of 9-bit source sequence set, the position of inserting the data is as follows: after a count number of "1" in the 9-bit source sequence from a lowest bit to a high bit sequentially reaches 3, or after a count number of "1" in the 9-bit source sequence from a highest bit to the low bit sequentially reaches 3.

Preferably, when 1-bit data "1" is inserted into the 9-bit source sequence of the second type of 9-bit source sequence set, the position of inserting the data is: after a count number of "0" in the 9-bit source sequence from a lowest bit to a high bit sequentially reaches 3, or after a count number of "0" in the 9-bit source sequence from a highest bit to the low bit sequentially reaches 3.

Each 9-bit source sequence comprised in the third type of 9-bit source sequence set is encoded into a pair of 10-bit target unbalanced sequences that are opposite numbers for each other.

The third type of 9-bit source sequence set comprises a fourth type of 9-bit source sequence set and a fifth type of 9-bit source sequence set, which are disjoint, and a unified set of the fourth type of 9-bit source sequence set and the fifth type of 9-bit source sequence set is the third type of 9-bit source sequence set.

The fourth type of 9-bit source sequence set alternatively only comprises 9-bit source sequences with a difference value of 5 or only comprises 9-bit source sequences with a difference value of −5.

If the fourth type of 9-bit source sequence set only comprises 9-bit source sequences with a difference value of 5, 1-bit data "0" is inserted into the 9-bit source sequence, and the formed 10-bit target sequence and an opposite number thereof form a pair of 10-bit target unbalanced sequences with a difference value of ±4, which are codes of the 9-bit source sequence with a difference value of 5.

If the fourth type of 9-bit source sequence set only comprises 9-bit source sequences with a difference value of −5, 1-bit data is inserted into the 9-bit source sequence, and the formed 10-bit target sequence and an opposite number thereof form a pair of 10-bit target unbalanced sequences with a difference value of ±4, which are codes of the 9-bit source sequence with a difference value of −5.

Preferably, when 1-bit data "0" is inserted into a 9-bit source sequence in the fourth type of 9-bit source sequence set, the position of inserting data is as follows: after a count number of "1" in the 9-bit source sequence from a lowest bit to a high bit sequentially reaches 3, or after a count number of "1" in the 9-bit source sequence from a highest bit to the low bit sequentially reaches 3.

Preferably, when 1-bit data "1" is inserted into a 9-bit source sequence in the fourth type of 9-bit source sequence set, the position of inserting data is as follows: after a count number of "0" in the 9-bit source sequence from a lowest bit to a high bit sequentially reaches 3, or after a count number of "0" in the 9-bit source sequence from a highest bit to the low bit sequentially reaches 3.

Each 9-bit source sequence comprised in the fifth type of 9-bit source sequence set is encoded into a pair of 10-bit target unbalanced sequences that are opposite numbers for each other.

The 10-bit target sequence set only comprises sequences with difference values of −4, −2, 0, 2 and 4, and the 10-bit target sequence set optionally conforms to one of the following two characteristics, the first characteristic is: the 10-bit target sequence set does not comprise a sequence with the lowest 4 bits being 4 bits of "0000" or "1111" or a sequence with the highest 5 bits being 5 bits of "00000" or "11111"; the second characteristic is: the 10-bit target sequence set does not comprise a sequence with the lowest 5 bits being 5 bits of "00000" or "11111" or a sequence with the highest 4 bits being 4 bits of "0000" or "1111".

The 10-bit target sequence set comprises 784 codewords, comprising 240 10-bit target balanced sequences and 544 10-bit target unbalanced sequences, which can form 272 pairs of 10-bit target unbalanced sequences which are opposite numbers for each other.

The 240 10-bit target balanced sequences and the 272 pairs of 10-bit target unbalanced sequences are the codes of 512 9-bit source sequences in the 9-bit source sequence set.

The 272 pairs of 10-bit target unbalanced sequences which are opposite numbers for each other comprise 189 pairs of 10-bit target unbalanced sequences with a difference value of ±2 and 83 pairs of 10-bit target unbalanced sequences with a difference value of ±4.

The 10-bit target sequence set further comprises 16 10-bit target unbalanced sequences to represent control characters, and the 16 10-bit target unbalanced sequences can form 8 pairs of 10-bit target unbalanced sequences which are opposite numbers for each other, wherein each pair of 10-bit target unbalanced sequences which are opposite numbers for each other is a code of a control character.

A 9B/10B encoding method according to the present invention is used for encoding a 9-bit source sequence set into a 10-bit target sequence set; each sequence in the 9-bit source sequence set is a 9-bit binary number, and each sequence in the encoded 10-bit target sequence set is a 10-bit binary number, and the 10-bit target sequence set comprises a balanced sequence and an unbalanced sequence, and different 9-bit source sequences are encoded into different 10-bit target sequences The 9-bit source sequence set comprises a first type of 9-bit source sequence set, a second type of 9-bit source sequence set and a third type of 9-bit source sequence set, wherein the three types of 9-bit source sequence sets are disjoint, and a unified set of the three types of 9-bit source sequence sets has 512 non-repetitive 9-bit source sequences.

The first type of 9-bit source sequence set only comprises 9-bit source sequences with difference values of 1 and −1, and each 9-bit source sequence in the first type of 9-bit source sequence set is encoded into a 10-bit target balanced sequence after inserting 1-bit data "0" or "1" at a same position.

Preferably, when inserting 1-bit data at a same position of each 9-bit source sequence in the first type of 9-bit source sequence set, the same position is a leftmost or rightmost position of the 9-bit source sequence, and the inserted 1-bit data is at a highest or lowest bit in the encoded 10-bit target balanced sequence.

The second type of 9-bit source sequence set alternatively comprises only 9-bit source sequences with a difference value of 3 or only 9-bit source sequences with a difference value of −3.

If the second type of 9-bit source sequence set only comprises 9-bit source sequences with a difference value of 3, 1-bit data "0" is inserted into the 9-bit source sequence, and the formed 10-bit target sequence and an opposite number thereof form a pair of 10-bit target unbalanced sequences with a difference value of ±2, which are codes of the 9-bit source sequence with a difference value of 3.

If the second type of 9-bit source sequence set only comprises 9-bit source sequences with a difference value of −3, 1-bit data is inserted into the 9-bit source sequence, and the formed 10-bit target sequence and an opposite number thereof form a pair of 10-bit target unbalanced sequences with a difference value of ±2, which are codes of the 9-bit source sequence with a difference value of −3.

Preferably, when 1-bit data "0" is inserted into the 9-bit source sequence of the second type of 9-bit source sequence set, the position of inserting data is as follows: after a count number of "1" in the 9-bit source sequence from a lowest bit to a high bit sequentially reaches 3, or after a count number of "1" in the 9-bit source sequence from a highest bit to the low bit sequentially reaches 3.

When 1-bit data "1" is inserted into the 9-bit source sequence of the second type of 9-bit source sequence set, the position of inserting data is: after a count number of "0" in the 9-bit source sequence from a lowest bit to a high bit sequentially reaches 3, or after a count number of "0" in the 9-bit source sequence from a highest bit to the low bit sequentially reaches 3.

The third type of 9-bit source sequence set comprises a third type of 9-bit source sequence subset A and a third type of 9-bit source sequence subset B, which are disjoint, and a unified set of the third type of 9-bit source sequence subset A and the third type of 9-bit source sequence subset B is the third type of 9-bit source sequence set.

Each 9-bit source sequence comprised in the third type 9-bit source sequence subset A is encoded into a 10-bit target balanced sequence.

Each 9-bit source sequence comprised in the third type of 9-bit source sequence subset B is encoded into a pair of 10-bit target unbalanced sequences that are opposite numbers for each other.

Preferably, the third type of 9-bit source sequence subset A comprises two sequences: "00000000" and "11111111".

The third type of 9-bit source sequence subset B comprises a sixth type of 9-bit source sequence set and a seventh type of 9-bit source sequence set, which are disjoint, and a unified set of the sixth type of 9-bit source sequence set the seventh type of 9-bit source sequence set is the third type of 9-bit source sequence subset B.

The sixth type of 9-bit source sequence set alternatively comprises only 9-bit source sequences with a difference value of 5 or only 9-bit source sequences with a difference value of −5.

If the sixth type of 9-bit source sequence set only comprises 9-bit source sequences with a difference value of 5, 1-bit data "0" is inserted into the 9-bit source sequence, and the formed 10-bit target sequence and an opposite number thereof form a pair of 10-bit target unbalanced sequences with a difference value of ±4, which are codes of the 9-bit source sequence with a difference value of 5.

If the sixth type of 9-bit source sequence set only comprises 9-bit source sequences with a difference value of −5, 1-bit data is inserted into the 9-bit source sequence, and the formed 10-bit target sequence and an opposite number thereof form a pair of 10-bit target unbalanced sequences with a difference value of ±4, which are codes of the 9-bit source sequence with a difference value of −5.

Preferably, when 1-bit data "0" is inserted into the 9-bit source sequence in the sixth type of 9-bit source sequence set, the position of inserting data is as follows: after a count number of "1" in the 9-bit source sequence from a lowest bit to a high bit sequentially reaches 3, or after a count number of "1" in the 9-bit source sequence from a highest bit to the low bit sequentially reaches 3.

Preferably, when 1-bit data "1" is inserted into a 9-bit source sequence in the sixth type of 9-bit source sequence set, the position of the inserted data is: after a count number of "0" in the 9-bit source sequence from a lowest bit to a high bit sequentially reaches 3, or after a count number of "0" in the 9-bit source sequence from a highest bit to the low bit sequentially reaches 3.

Each 9-bit source sequence comprised in the seventh type of 9-bit source sequence set is encoded into a pair of 10-bit target unbalanced sequences that are opposite numbers for each other.

The 10-bit target sequence set only comprises sequences with difference values of −4, −2, 0, 2 and 4, and the 10-bit target sequence set optionally conforms to one of the following two characteristics, the first characteristic is: the 10-bit target sequence set does not comprise a sequence with the lowest 4 bits being 4 bits of "0000" or "1111" or a sequence with the highest 5 bits being 5 bits of "00000" or "11111"; the second characteristic is: the 10-bit target sequence set does not comprise a sequence with the lowest 5 bits being 5 bits of "00000" or "11111" or a sequence with the highest 4 bits being 4 bits of "0000" or "1111".

The 10-bit target sequence set comprises 784 codewords, comprising 240 10-bit target balanced sequences and 544 10-bit target unbalanced sequences, which can form 272 pairs of 10-bit target unbalanced sequences which are opposite numbers for each other.

The 240 10-bit target balanced sequences and the 272 pairs of 10-bit target unbalanced sequences are the codes of 512 9-bit source sequences in the 9-bit source sequence set.

The 272 pairs of 10-bit target unbalanced sequences which are opposite numbers for each other comprise 189 pairs of 10-bit target unbalanced sequences with a difference value of ±2 and 83 pairs of 10-bit target unbalanced sequences with a difference value of ±4.

The 10-bit target sequence set further comprises 16 10-bit target unbalanced sequences to represent control characters, and the 16 10-bit target unbalanced sequences can form 8 pairs of 10-bit target unbalanced sequences which are opposite numbers for each other, wherein each pair of 10-bit target unbalanced sequences which are opposite numbers for each other is a code of a control character.

A 9B/10B decoding method according to the present invention is used for decoding a 10-bit target sequence set into a 9-bit source sequence set; the decoding method is an inverse transformation of an encoding method, and the encoding method is used for encoding the 9-bit source sequence set into a 10-bit target sequence set, each sequence in the 9-bit source sequence set is a 9-bit binary number, each sequence in the encoded 10-bit target sequence set is a 10-bit binary number, and the 10-bit target sequence set comprises a balanced sequence and an unbalanced sequence.

The 9-bit source sequence set comprises a first type of 9-bit source sequence set, a second type of 9-bit source sequence set and a third type of 9-bit source sequence set, wherein the three types of 9-bit source sequence sets are disjoint, and a unified set of the three types of 9-bit source sequence sets has 512 non-repetitive 9-bit source sequences.

The first type of 9-bit source sequence set only comprises 9-bit source sequences with difference values of 1 and −1, and each 9-bit source sequence in the first type of 9-bit source sequence set is encoded into a 10-bit target balanced sequence after inserting 1-bit data "0" or "1" at a same position.

Preferably, when inserting 1-bit data at the same position of each 9-bit source sequence in the first type of 9-bit source sequence set, the same position is a leftmost or rightmost position of the 9-bit source sequence, and the inserted 1-bit data is at a highest or lowest bit in the encoded 10-bit target balanced sequence.

The second type of 9-bit source sequence set alternatively comprises only 9-bit source sequences with a difference value of 3 or only 9-bit source sequences with a difference value of −3.

If the second type of 9-bit source sequence set only comprises 9-bit source sequences with a difference value of 3, 1-bit data "0" is inserted into the 9-bit source sequence, and the formed 10-bit target sequence and an opposite number thereof form a pair of 10-bit target unbalanced sequences with a difference value of ±2, which are codes of the 9-bit source sequence with a difference value of 3.

If the second type of 9-bit source sequence set only comprises 9-bit source sequences with a difference value of −3, 1-bit data is inserted into the 9-bit source sequence, and the formed 10-bit target sequence and an opposite number thereof form a pair of 10-bit target unbalanced sequences with a difference value of ±2, which are codes of the 9-bit source sequence with a difference value of −3.

Preferably, when 1-bit data "0" is inserted into the 9-bit source sequence of the second type of 9-bit source sequence set, the position of inserting data is as follows: after a count number of "1" in the 9-bit source sequence from a lowest bit to a high bit sequentially reaches 3, or after a count number of "1" in the 9-bit source sequence from a highest bit to the low bit sequentially reaches 3.

Preferably, when 1-bit data "1" is inserted into the 9-bit source sequence of the second type of 9-bit source sequence set, the position of inserting data is: after a count number of "0" in the 9-bit source sequence from a lowest bit to a high bit sequentially reaches 3, or after a count number of "0" in the 9-bit source sequence from a highest bit to the low bit sequentially reaches 3.

Each 9-bit source sequence comprised in the third type of 9-bit source sequence set is encoded into a pair of 10-bit target unbalanced sequences that are opposite numbers for each other.

The third type of 9-bit source sequence set comprises a fourth type of 9-bit source sequence set and a fifth type of 9-bit source sequence set, which are disjoint, and the unified set of the fourth type and the fifth type of 9-bit source sequence set is the third type of 9-bit source sequence set.

The fourth type of 9-bit source sequence set alternatively comprises only 9-bit source sequences with a difference value of 5 or only 9-bit source sequences with a difference value of −5.

If the fourth type of 9-bit source sequence set only comprises 9-bit source sequences with a difference value of 5, 1-bit data "0" is inserted into the 9-bit source sequence, and the formed 10-bit target sequence and an opposite number thereof form a pair of 10-bit target unbalanced sequences with a difference value of ±4, which are codes of the 9-bit source sequence with a difference value of 5.

If the fourth type of 9-bit source sequence set only comprises 9-bit source sequences with a difference value of −5, 1-bit data is inserted into the 9-bit source sequence, and the formed 10-bit target sequence and an opposite number thereof form a pair of 10-bit target unbalanced sequences with a difference value of ±4, which are codes of the 9-bit source sequence with a difference value of −5.

Preferably, when 1-bit data "0" is inserted into a 9-bit source sequence in the fourth type of 9-bit source sequence set, the position of inserting data is as follows: after a count number of "1" in the 9-bit source sequence from a lowest bit to a high bit sequentially reaches 3, or after a count number of "1" in the 9-bit source sequence from a highest bit to the low bit sequentially reaches 3.

Preferably, when 1-bit data "1" is inserted into a 9-bit source sequence in the fourth type of 9-bit source sequence set, the position of inserting data is as follows: after a count number of "0" in the 9-bit source sequence from a lowest bit to a high bit sequentially reaches 3, or after a count number of "0" in the 9-bit source sequence from a highest bit to the low bit sequentially reaches 3.

Each 9-bit source sequence comprised in the fifth type of 9-bit source sequence set is encoded into a pair of 10-bit target unbalanced sequences that are opposite numbers for each other.

The 10-bit target sequence set only comprises sequences with difference values of −4, −2, 0, 2 and 4, and the 10-bit target sequence set optionally conforms to one of the following two characteristic, the first characteristic is: the 10-bit target sequence set does not comprise a sequence with the lowest 4 bits being 4 bits of "0000" or "1111" or a sequence with the highest 5 bits being 5 bits of "00000" or "11111"; the second characteristic is: the 10-bit target sequence set does not comprise a sequence with the lowest 5 bits being 5 bits of "00000" or "11111" or a sequence with the highest 4 bits being 4 bits of "0000" or "1111".

The 10-bit target sequence set comprises 784 codewords, comprising 240 10-bit target balanced sequences and 544 10-bit target unbalanced sequences, which can form 272 pairs of 10-bit target unbalanced sequences which are opposite numbers for each other.

The 240 10-bit target balanced sequences and the 272 pairs of 10-bit target unbalanced sequences are the codes of 512 9-bit source sequences in the 9-bit source sequence set.

The 272 pairs of 10-bit target unbalanced sequences which are opposite numbers for each other comprise 189 pairs of 10-bit target unbalanced sequences with a difference value of ±2 and 83 pairs of 10-bit target unbalanced sequences with a difference value of ±4.

The 10-bit target sequence set further comprises 16 10-bit target unbalanced sequences to represent control characters, and the 16 10-bit target unbalanced sequences can form 8 pairs of 10-bit target unbalanced sequences which are opposite numbers for each other, wherein each pair of 10-bit target unbalanced sequences which are opposite numbers for each other is a code of a control character.

A 9B/10B decoding method according to the present invention is used for decoding a 10-bit target sequence set into a 9-bit source sequence set; the decoding method is an inverse transformation of an encoding method, and the encoding method is used for encoding the 9-bit source sequence set into a 10-bit target sequence set, each sequence in the 9-bit source sequence set is a 9-bit binary number, each sequence in the encoded 10-bit target sequence set is a 10-bit binary number, and the 10-bit target sequence set comprises a balanced sequence and an unbalanced sequence.

The 9-bit source sequence set comprises a first type of 9-bit source sequence set, a second type of 9-bit source sequence set and a third type of 9-bit source sequence set, wherein the three types of 9-bit source sequence sets are disjoint, and a unified set of the three types of 9-bit source sequence sets has 512 non-repetitive 9-bit source sequences.

The first type of 9-bit source sequence set only comprises 9-bit source sequences with difference values of 1 and −1, and each 9-bit source sequence in the first type of 9-bit source sequence set is encoded into a 10-bit target balanced sequence after inserting 1-bit data "0" or "1" at a same position.

Preferably, when inserting 1-bit data at a same position of each 9-bit source sequence in the first type of 9-bit source sequence set, the same position is a leftmost or rightmost position of the 9-bit source sequence, and the inserted 1-bit data is at a highest or lowest bit in the encoded 10-bit target balanced sequence.

The second type of 9-bit source sequence set alternatively comprises only 9-bit source sequences with a difference value of 3 or only 9-bit source sequences with a difference value of −3.

If the second type of 9-bit source sequence set only comprises 9-bit source sequences with a difference value of 3, 1-bit data "0" is inserted into the 9-bit source sequence, and the formed 10-bit target sequence and an opposite number thereof form a pair of 10-bit target unbalanced sequences with a difference value of ±2, which are codes of the 9-bit source sequence with a difference value of 3.

If the second type of 9-bit source sequence set only comprises 9-bit source sequences with a difference value of −3, 1-bit data is inserted into the 9-bit source sequence, and the formed 10-bit target sequence and an opposite number thereof form a pair of 10-bit target unbalanced sequences with a difference value of ±2, which are codes of the 9-bit source sequence with a difference value of −3.

Preferably, when 1-bit data "0" is inserted into the 9-bit source sequence of the second type of 9-bit source sequence set, the position of inserting data is as follows: after a count number of "1" in the 9-bit source sequence from a lowest bit to a high bit sequentially reaches 3, or after a count number of "1" in the 9-bit source sequence from a highest bit to the low bit sequentially reaches 3.

Preferably, when 1-bit data "1" is inserted into the 9-bit source sequence of the second type of 9-bit source sequence set, the position of inserting data is: after a count number of "0" in the 9-bit source sequence from a lowest bit to a high bit sequentially reaches 3, or after a count number of "0" in the 9-bit source sequence from a highest bit to the low bit sequentially reaches 3.

The third type of 9-bit source sequence set comprises a third type of 9-bit source sequence subset A and a third type of 9-bit source sequence subset B, which are disjoint, and the unified set of the third type of 9-bit source sequence subset A and the third type of 9-bit source sequence subset B is the third type of 9-bit source sequence set.

Each 9-bit source sequence comprised in the third type 9-bit source sequence subset A is encoded into a 10-bit target balanced sequence.

Each 9-bit source sequence comprised in the third type of 9-bit source sequence subset B is encoded into a pair of 10-bit target unbalanced sequences that are opposite numbers for each other.

Preferably, the third type of 9-bit source sequence subset A comprises two sequences: "00000000" and "11111111".

The third type of 9-bit source sequence subset B comprises a sixth type of 9-bit source sequence set and a seventh type of 9-bit source sequence set, which are disjoint, and the unified set of the sixth type of 9-bit source sequence set and the seventh type of 9-bit source sequence set is the third type of 9-bit source sequence subset B.

The sixth type of 9-bit source sequence set alternatively comprises only 9-bit source sequences with a difference value of 5 or only 9-bit source sequences with a difference value of −5.

If the sixth type of 9-bit source sequence set only comprises 9-bit source sequences with a difference value of 5, 1-bit data "0" is inserted into the 9-bit source sequence, and the formed 10-bit target sequence and an opposite number thereof form a pair of 10-bit target unbalanced sequences with a difference value of ±4, which are codes of the 9-bit source sequence with a difference value of 5.

If the sixth type of 9-bit source sequence set only comprises 9-bit source sequences with a difference value of −5, 1-bit data is inserted into the 9-bit source sequence, and the formed 10-bit target sequence and an opposite number thereof form a pair of 10-bit target unbalanced sequences with a difference value of ±4, which are codes of the 9-bit source sequence with a difference value of −5.

Preferably, when 1-bit data "0" is inserted into the 9-bit source sequence in the sixth type of 9-bit source sequence set, the position of inserting data is as follows: after a count number of "1" in the 9-bit source sequence from a lowest bit to a high bit sequentially reaches 3, or after a count number of "1" in the 9-bit source sequence from a highest bit to the low bit sequentially reaches 3.

Preferably, when 1-bit data "1" is inserted into a 9-bit source sequence in the sixth type of 9-bit source sequence set, the position of the inserted data is: after a count number of "0" in the 9-bit source sequence from a lowest bit to a high bit sequentially reaches 3, or after a count number of "0" in the 9-bit source sequence from a highest bit to the low bit sequentially reaches 3.

Each 9-bit source sequence comprised in the seventh type of 9-bit source sequence set is encoded into a pair of 10-bit target unbalanced sequences that are opposite numbers for each other.

The 10-bit target sequence set only comprises sequences with difference values of −4, −2, 0, 2 and 4, and the 10-bit target sequence set optionally conforms to one of the following two characteristics, the first characteristic is: the 10-bit target sequence set does not comprise a sequence with the lowest 4 bits being 4 bits of "0000" or "1111" or a sequence with the highest 5 bits being 5 bits of "00000" or "11111"; the second characteristic is: the 10-bit target sequence set does not comprise a sequence with the lowest 5 bits being 5 bits of "00000" or "11111" or a sequence with the highest 4 bits being 4 bits of "0000" or "1111".

The 10-bit target sequence set comprises 784 codewords, comprising 240 10-bit target balanced sequences and 544 10-bit target unbalanced sequences, which can form 272 pairs of 10-bit target unbalanced sequences which are opposite numbers for each other.

The 240 10-bit target balanced sequences and the 272 pairs of 10-bit target unbalanced sequences are the codes of 512 9-bit source sequences in the 9-bit source sequence set.

The 272 pairs of 10-bit target unbalanced sequences which are opposite numbers for each other comprise 189 pairs of 10-bit target unbalanced sequences with a difference value of ±2 and 83 pairs of 10-bit target unbalanced sequences with a difference value of ±4.

The 10-bit target sequence set further comprises 16 10-bit target unbalanced sequences to represent control characters, and the 16 10-bit target unbalanced sequences can form 8 pairs of 10-bit target unbalanced sequences which are opposite numbers for each other, wherein each pair of 10-bit target unbalanced sequences which are opposite numbers for each other is a code of a control character.

The present invention has the beneficial effects that:

the 9B/10B encoding and decoding method of the present invention encodes a 9-bit sequence set into a 10-bit sequence set by a classified calculation method, which limits the number of consecutive "0" or "1" and eliminates the DC component of the signal in the data transmission process, so as to facilitate the recovery of the clock and data at the receiving end; compared with a table look-up method, this method simplifies the implementation method and reduces the resource overhead.

DESCRIPTION OF EMBODIMENTS

Figure 1:
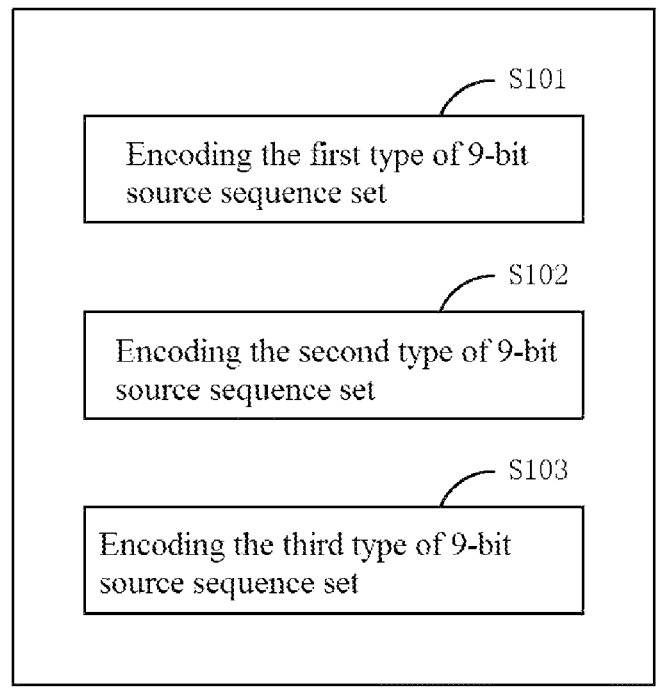
FIG. 1 is a block diagram of a 9B/10B encoding and decoding method of the present invention.

The technical solution in the embodiment of the present invention will be described clearly and completely with the attached drawings. It can be understood that the described embodiment is only a part of the embodiment of the present invention, but not the whole embodiment. Based on the embodiments of the present invention, all other embodiments obtained by those skilled in the art without creative work belong to the scope of protection of the present invention.

An application embodiment of the present invention provides a 9B/10B encoding method, which is used to encode a 9-bit source sequence set into a 10-bit target sequence set, each sequence in the 9-bit source sequence set is a 9-bit binary number, each sequence in the encoded 10-bit target sequence set is a 10-bit binary number, and different 9-bit source sequences are encoded into different 10-bit target sequences.

The 10-bit target sequence set comprises a balanced sequence and an unbalanced sequence, wherein the balanced sequence refers to a sequence with the same number of "0" and "1" or a sequence with a difference value of 0; an unbalanced sequence refers to a sequence with different numbers of "0" and "1", or a sequence with different values of 0. The definition of the difference value proposed by the present invention is that the difference value of a binary sequence is the number of "1" minus the number of "0" in this sequence. For a 10-bit binary sequence, all possible difference values are −10, −8, −6, −4, −2, 0, 2, 4, 6, 8 and 10.

Each sequence in the 9-bit source sequence set is encoded as a balanced sequence in the 10-bit target sequence set, or a pair of unbalanced sequences that are opposite numbers for each other in the 10-bit target sequence set. The definition of the inverse number proposed by the present invention is: after a binary sequence is inverted bit by bit, another binary sequence is obtained, then the two binary sequences are mutually opposite numbers.

In this embodiment, the 10-bit target sequence set only comprises sequences with difference values of −4, −2, 0, 2, and 4, and the 10-bit target sequence set does not comprise sequences with the lowest 4 bits of "0000" or "1111" or the highest 5 bits of "00000" or "11111". In the present invention, the lowest bit of a binary sequence is the rightmost bit of the binary sequence, the lowest 4 bits of the binary sequence are the first 4 bits counted from the rightmost to the left, the highest bit of the binary sequence is the leftmost bit, and the highest 5 bits of the binary sequence are the first 5 bits counted from the leftmost to the right.

Alternatively, the 10-bit target sequence set in this embodiment only comprises sequences with difference values of −4, −2, 0, 2 and 4, and the 10-bit target sequence set does not comprise sequences with the lowest 5 bits of "00000" or "1111" or the highest 4 bits of "0000" or "1111".

In this embodiment, the 10-bit target sequence set comprises 800 non-repetitive 10-bit sequences, comprising 784 codewords, which comprise 240 10-bit target balanced sequences and 544 10-bit target unbalanced sequences, and the 544 10-bit target unbalanced sequences can form 272 pairs of 10-bit target unbalanced sequences. In the present invention, a codeword in a 10-bit target sequence set is defined as a 10-bit target sequence encoded by a 9-bit source sequence.

The 240 10-bit target balanced sequences and the 272 pairs of 10-bit target unbalanced sequences are the codes of 512 9-bit source sequences in the 9-bit source sequence set.

The 272 pairs of 10-bit target unbalanced sequences which are opposite numbers for each other comprise 189 pairs of 10-bit target unbalanced sequences with a difference value of ±2 and 83 pairs of 10-bit target unbalanced sequences with a difference value of ±4.

In addition to 784 codewords, the 10-bit target sequence set further comprises 16 10-bit target unbalanced sequences to represent control characters, and the 16 10-bit target unbalanced sequences can form 8 pairs of 10-bit target unbalanced sequences that are opposite numbers for each other, wherein each pair of 10-bit target unbalanced sequences that are opposite numbers for each other is the code of a control character.

The above numerical values about the total number of sequences in the 10-bit target sequence set, comprising the number of codewords, the number of sequences used to represent control characters, the number of balanced sequences, the number of unbalanced sequences, and the number of sequences with different values in unbalanced sequences, are only preferred embodiments of the present invention, but the protection scope of the present invention is not limited by these numerical values.

In the process of signal transmission, when a pair of 10-bit target unbalanced sequences which are opposite numbers for each other is a 9-bit source sequence or a code of a control character, one of the 10-bit target unbalanced sequences should be selected as the code of the 9-bit source sequence or control character according to the operation difference, so as to eliminate the DC component of the signal in the data transmission process and facilitate the recovery of the clock and data at the receiving end. The definition of operation difference proposed by the present invention is: in the process of signal transmission, the number of "0" is subtracted from the number of "1" in all transmitted binary sequences after counting.

The 9-bit source sequence set comprises a first type of 9-bit source sequence set, a second type of 9-bit source sequence set and a third type of 9-bit source sequence set, which are disjoint, and a unified set of the three types of 9-bit source sequence sets has 512 non-repetitive 9-bit source sequences.

As shown in FIG. 1, the method flow chart of this embodiment comprises:

S101, the first type of 9-bit source sequence set is encoded.

The first type of 9-bit source sequence set only comprises 9-bit source sequences with difference values of 1 and −1, and each 9-bit source sequence in the first type of 9-bit source sequence set is encoded as a 10-bit target balanced sequence after inserting 1-bit data "0" at the same position; the 9-bit source sequences with a difference value of 1 is encoded as a 10-bit target balanced sequence after inserting 1-bit data "0"; the 9-bit source sequences with a difference value of −1 is encoded as a 10-bit target balanced sequence after inserting 1-bit data "1".

In this embodiment, when inserting 1-bit data at the same position of each 9-bit source sequence in the first type of 9-bit source sequence set, the same position is the leftmost position of the 9-bit source sequence, and the inserted 1-bit data is at the highest bit in the encoded 10-bit target balanced sequence;
  alternatively, when inserting 1-bit data at the same position of each 9-bit source sequence in the first type of 9-bit source sequence set in this embodiment, the same position is the rightmost position of the 9-bit source sequence, and the inserted 1-bit data is at the lowest bit in the encoded 10-bit target balanced sequence;
  alternatively, when inserting 1-bit data in the same position of each 9-bit source sequence in the first type of 9-bit source sequence set described in this embodiment, the same position may also be other bits of the 9-bit source sequence except the leftmost and rightmost bits, and the inserted 1-bit data is located in other bits except the highest and lowest bits in the encoded 10-bit target balanced sequence.

S102, the second type of 9-bit source sequence set is encoded.

In this embodiment, the type of 9-bit source sequence set of the second type alternatively only comprises 9-bit source sequences with a difference value of 3 or only comprises 9-bit source sequences with a difference value of −3.

If the second type of 9-bit source sequence set only comprises 9-bit source sequences with a difference value of 3, 1-bit data "0" is inserted into the 9-bit source sequence, and the formed 10-bit target sequence and an opposite number thereof form a pair of 10-bit target unbalanced sequences with a difference value of ±2, which are codes of the 9-bit source sequence with a difference value of 3.

If the second type of 9-bit source sequence set only comprises 9-bit source sequences with a difference value of −3, insert 1-bit data into the 9-bit source sequence, and the formed 10-bit target sequence and an opposite number thereof form a pair of 10-bit target unbalanced sequences with a difference value of ±2, which are codes of the 9-bit source sequence with a difference value of −3.

In this embodiment, when 1-bit data "0" is inserted into the 9-bit source sequence of the second type of 9-bit source sequence set, the position of inserting data is as follows: after the count number of "1" in the 9-bit source sequence sequentially from the lowest bit to the high bit reaches 3;
  alternatively, when 1-bit data "0" is inserted into the 9-bit source sequence of the second type of 9-bit source sequence set, the position of inserting data is: after the count number of "1" in the 9-bit source sequence sequentially from the highest bit to the low bit reaches 3.

When 1-bit data "1" is inserted into the 9-bit source sequence of the second type of 9-bit source sequence set, the position of inserting data is as follows: after the count number of "0" in the 9-bit source sequence sequentially from the lowest bit to the high bit reaches 3;
  Alternatively, when 1-bit data "1" is inserted into the 9-bit source sequence of the second type of 9-bit source sequence set, the position of inserting data is: after the count number of "0" in the 9-bit source sequence sequentially from the highest bit to the low bit reaches 3.

S103, the third type of 9-bit source sequence set is encoded.

Each 9-bit source sequence comprised in the third type of 9-bit source sequence set is encoded into a pair of 10-bit target unbalanced sequences that are opposite numbers for each other.

The third type of 9-bit source sequence set comprises the fourth type of 9-bit source sequence set and the fifth type of 9-bit source sequence set, which are disjoint, and the unified set of the fourth type of 9-bit source sequence set the fifth type of 9-bit source sequence set is the third type of 9-bit source sequence set.

Figure 2:
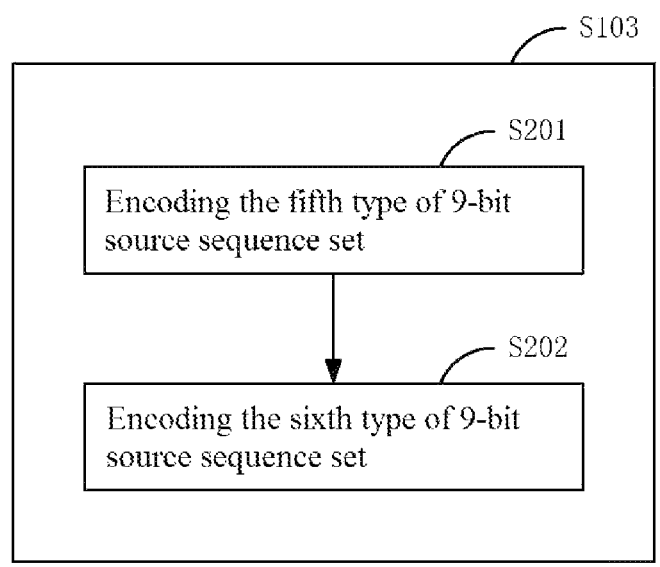
FIG. 2 is a flowchart of a method for encoding the third type of 9-bit source sequence set in a 9B/10B encoding and decoding method of the present invention.

As shown in FIG. 2, the flowchart of the method for encoding the third type of 9-bit source sequence set in this embodiment comprises:

S201, the fourth type of 9-bit source sequence set is encoded.

In this embodiment, the fourth type of 9-bit source sequence set only comprises 9-bit source sequences with a difference value of 5, and 1-bit data "0" is inserted into the 9-bit source sequence, and the formed 10-bit target sequence and an opposite number thereof form a pair of 10-bit target unbalanced sequences with a difference value of ±4, which are codes of the 9-bit source sequence with a difference value of 5;

alternatively, the fourth type of 9-bit source sequence set only comprises 9-bit source sequences with a difference value of −5, and 1-bit data "1" is inserted into the 9-bit source sequence, and the formed 10-bit target sequence and an opposite number thereof form a pair of 10-bit target unbalanced sequences with a difference value of ±4, which are codes of the 9-bit source sequence with a difference value of −5.

In this embodiment, when 1-bit data "0" is inserted into the 9-bit source sequence of the fourth type of 9-bit source sequence set, the position of inserting data is as follows: after the count number of "1" in the 9-bit source sequence sequentially from the lowest bit to the high bit reaches 3;

alternatively, when 1-bit data "0" is inserted into the 9-bit source sequence of the fourth type of 9-bit source sequence set, the position of the inserted data is: after the count number of "1" in the 9-bit source sequence sequentially from the highest bit to the low bit reaches 3.

when 1-bit data "1" is inserted into the 9-bit source sequence of the fourth type of 9-bit source sequence set, the position of inserting data is as follows: after the count number of "0" in the 9-bit source sequence sequentially from the lowest bit to the high bit reaches 3;

Alternatively, when 1-bit data "1" is inserted into the 9-bit source sequence of the fourth type of 9-bit source sequence set, the position of inserting data is: after the count number of "0" in the 9-bit source sequence sequentially from the highest bit to the low bit reaches 3.

S202, after the fourth type of 9-bit source sequence set is encoded, the fifth type of 9-bit source sequence set is encoded.

Each 9-bit source sequence comprised in the fifth type of 9-bit source sequence set is encoded into a pair of 10-bit target unbalanced sequences that are opposite numbers for each other.

Figure 3:
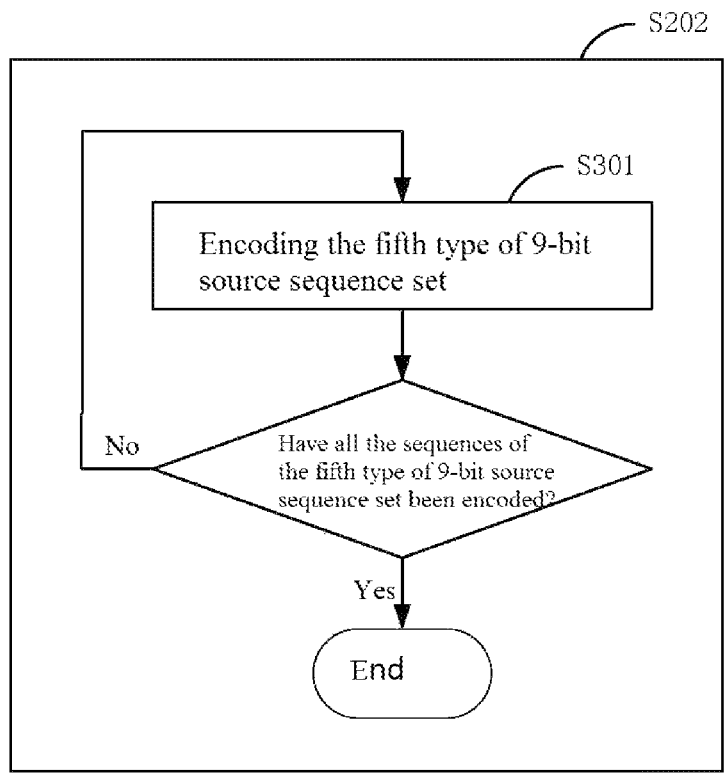
FIG. 3 is a flowchart of a method for encoding the fifth type of 9-bit source sequence set in a 9B/10B encoding and decoding method of the present invention.

As shown in FIG. 3, the flowchart of the method for encoding the fifth type of 9-bit source sequence set in this embodiment comprises:

S301, a subset of the fifth type 9-bit source sequence is encoded.

n unencoded 9-bit source sequences are selected from the fifth type of 9-bit source sequence set as a fifth type of 9-bit source sequence subset, and n 10-bit target sequences not corresponding to the coded 9-bit source sequences as a 10-bit target sequence subset in the 10-bit target sequence set, so that the number of 9-bit source sequences in the fifth-class 9-bit source sequence subset is the same as that in the 10-bit target sequence subset, and the following conditions are met:

the position P9 of k bits in each sequence of the fifth type 9-bit source sequence subset and the position P10 of m bits in each sequence of the 10-bit target sequence subset are selected, wherein the n k bit sequences at P9 of the fifth type 9-bit source sequence subset are the same as the n m bit sequences at P10 of the 10-bit target sequence subset, or the n m bit sequences at P10 of the 10-bit target sequence subset can be obtained after simple transformation; the remaining 9-k bits of all sequences in the fifth type of 9-bit source sequence subset are n identical sequences, and the remaining 10-m bits of all sequences in the 10-bit target sequence subset are n identical sequences except P10.

When the above conditions are met, the fifth type of 9-bit source sequence subset can be conveniently encoded into the 10-bit target sequence subset and the opposite number of each sequence in the 10-bit target sequence subset, so that the fifth type of 9-bit source sequence set can be encoded by using the classification calculation method, while the encoding methods of the first, the second, the fourth types of 9-bit source sequence sets are simpler and occupy less resources. The total number of sequences in these three types of sequences is relatively high in all 512 9-bit source sequences, exceeding 70%, so the present invention can simplify the implementation method of 9B10B coding and reduce the resource overhead.

After encoding the fifth type of 9-bit source sequence subset, the unencoded 9-bit source sequences in the fifth type of 9-bit source sequence set are selected to form a new fifth type of 9-bit source sequence subset, and step S301 is repeatedly executed until all the fifth type of 9-bit source sequence sets are encoded.

This embodiment will be further explained according to the trellis diagram composed of binary sequences. The trellis diagram consists of a series of line segments with the same length. A short line segment from left to right represents 1-bit data, and a short line segment from left to right represents 0-bit data. The leftmost bit in the trellis diagram is the lowest bit of the binary sequence, and the rightmost bit is the highest bit of the binary sequence. The number next to a certain point in the trellis diagram indicates how many different sequences are there from the leftmost point of the trellis diagram to that point.

Figure 4:
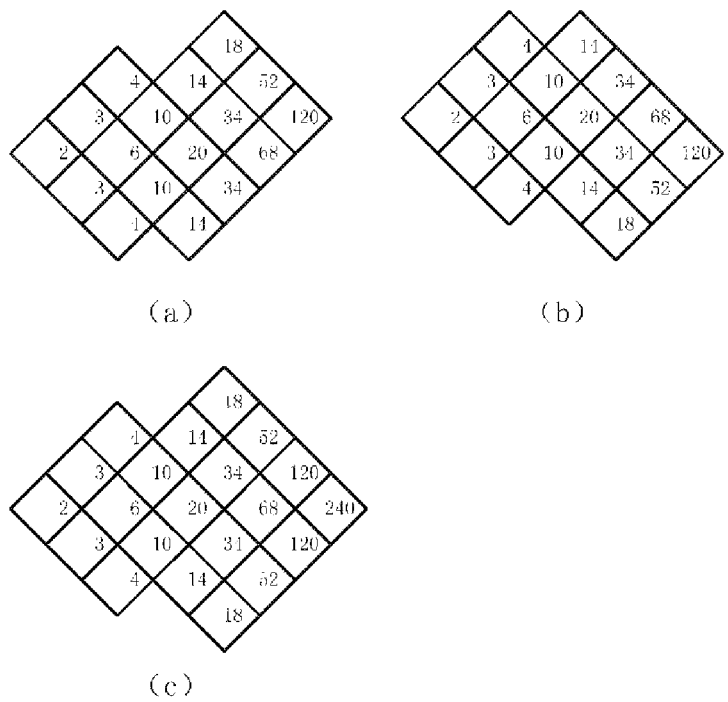
FIG. 4 is a trellis diagram of the first 9-bit source sequence set and its encoded 10-bit target sequence in a 9B/10B encoding and decoding method of the present invention.

As shown in FIG. 4, in this embodiment, the trellis diagram of a 9-bit source sequence with a difference value of 1 in the first type of 9-bit source sequence set is shown in FIG. 4(a), and there are 120 9-bit source sequences in total. The encoding method is as follows: inserting 1-bit data "0" at the leftmost side of the 9-bit source sequence with a difference value of 1.

In this embodiment, the trellis diagram of the 9-bit source sequence with a difference value of −1 in the first type of 9-bit source sequence set is shown in FIG. 4(b), and there are 120 9-bit source sequences in total. The encoding method is as follows: inserting 1-bit data "1" at the leftmost side of the 9-bit source sequence with a difference value of −1.

In this embodiment, there are 240 9-bit source sequences in the first type of 9-bit source sequence set, and the trellis diagram of the 10-bit target sequence encoded by the first type of 9-bit source sequence set is as shown in FIG. 4(c), with a total of 240 10-bit target sequences.

For example, encode a 9-bit source sequence "010111100" with a difference value of 1, and insert a 1-bit data "0" in the leftmost part of the sequence, and it is encoded into a 10-bit target sequence "0010111100"; A 9-bit source sequence "001110010" with a difference value of −1 is encoded, and after inserting a 1-bit data "1" in the leftmost part of the sequence, it is encoded as a 10-bit target sequence "1001110010".

The encoding and decoding table of the first type of 9-bit source sequence set is shown in Table 1.

TABLE 1

Coding and decoding table of the first type of 9-bit source sequence set

| 9B | 10B (Difference value = 0) |
|---|---|
| 000010111 | 1000010111 |
| 000011011 | 1000011011 |
| 000011101 | 1000011101 |

TABLE 1-continued

Coding and decoding table of the first type of 9-bit source sequence set

| 9B | 10B (Difference value = 0) |
|---|---|
| 000011110 | 1000011110 |
| 000100111 | 1000100111 |
| 000101011 | 1000101011 |
| 000101101 | 1000101101 |
| 000101110 | 1000101110 |
| 000110011 | 1000110011 |
| 000110101 | 1000110101 |
| 000110110 | 1000110110 |
| 000110111 | 0000110111 |
| 000111001 | 1000111001 |
| 000111010 | 1000111010 |
| 000111011 | 0000111011 |
| 000111100 | 1000111100 |
| 000111101 | 0000111101 |
| 000111110 | 0000111110 |
| 001000111 | 1001000111 |
| 001001011 | 1001001011 |
| 001001101 | 1001001101 |
| 001001110 | 1001001110 |
| 001010011 | 1001010011 |
| 001010101 | 1001010101 |
| 001010110 | 1001010110 |
| 001010111 | 0001010111 |
| 001011001 | 1001011001 |
| 001011010 | 1001011010 |
| 001011011 | 0001011011 |
| 001011100 | 1001011100 |
| 001011101 | 0001011101 |
| 001011110 | 0001011110 |
| 001100011 | 1001100011 |
| 001100101 | 1001100101 |
| 001100110 | 1001100110 |
| 001100111 | 0001100111 |
| 001101001 | 1001101001 |
| 001101010 | 1001101010 |
| 001101011 | 0001101011 |
| 001101100 | 1001101100 |
| 001101101 | 0001101101 |
| 001101110 | 0001101110 |
| 001110001 | 1001110001 |
| 001110010 | 1001110010 |
| 001110011 | 0001110011 |
| 001110100 | 1001110100 |
| 001110101 | 0001110101 |
| 001110110 | 0001110110 |
| 001111000 | 1001111000 |
| 001111001 | 0001111001 |
| 001111010 | 0001111010 |
| 001111100 | 0001111100 |
| 010000111 | 1010000111 |
| 010001011 | 1010001011 |
| 010001101 | 1010001101 |
| 010001110 | 1010001110 |
| 010010011 | 1010010011 |
| 010010101 | 1010010101 |
| 010010110 | 1010010110 |
| 010010111 | 0010010111 |
| 010011001 | 1010011001 |
| 010011010 | 1010011010 |
| 010011011 | 0010011011 |
| 010011100 | 1010011100 |
| 010011101 | 0010011101 |
| 010011110 | 0010011110 |
| 010100011 | 1010100011 |
| 010100101 | 1010100101 |
| 010100110 | 1010100110 |
| 010100111 | 0010100111 |
| 010101001 | 1010101001 |
| 010101010 | 1010101010 |
| 010101011 | 0010101011 |
| 010101100 | 1010101100 |
| 010101101 | 0010101101 |
| 010101110 | 0010101110 |
| 010110001 | 1010110001 |
| 010110010 | 1010110010 |
| 010110011 | 0010110011 |
| 010110100 | 1010110100 |
| 010110101 | 0010110101 |
| 010110110 | 0010110110 |
| 010111000 | 1010111000 |
| 010111001 | 0010111001 |
| 010111010 | 0010111010 |
| 010111100 | 0010111100 |
| 011000011 | 1011000011 |
| 011000101 | 1011000101 |
| 011000110 | 1011000110 |
| 011000111 | 0011000111 |
| 011001001 | 1011001001 |
| 011001010 | 1011001010 |
| 011001011 | 0011001011 |
| 011001100 | 1011001100 |
| 011001101 | 0011001101 |
| 011001110 | 0011001110 |
| 011010001 | 1011010001 |
| 011010010 | 1011010010 |
| 011010011 | 0011010011 |
| 011010100 | 1011010100 |
| 011010101 | 0011010101 |
| 011010110 | 0011010110 |
| 011011000 | 1011011000 |
| 011011001 | 0011011001 |
| 011011010 | 0011011010 |
| 011011100 | 0011011100 |
| 011100001 | 1011100001 |
| 011100010 | 1011100010 |
| 011100011 | 0011100011 |
| 011100100 | 1011100100 |
| 011100101 | 0011100101 |
| 011100110 | 0011100110 |
| 011101000 | 1011101000 |
| 011101001 | 0011101001 |
| 011101010 | 0011101010 |
| 011101100 | 0011101100 |
| 011110001 | 0011110001 |
| 011110010 | 0011110010 |
| 011110100 | 0011110100 |
| 011111000 | 0011111000 |
| 100000111 | 1100000111 |
| 100001011 | 1100001011 |
| 100001101 | 1100001101 |
| 111010010 | 0111010010 |
| 100010011 | 1100010011 |
| 100010101 | 1100010101 |
| 100010110 | 1100010110 |
| 100010111 | 0100010111 |
| 100011001 | 1100011001 |
| 100011010 | 1100011010 |
| 100011011 | 0100011011 |
| 100011100 | 1100011100 |
| 100011101 | 0100011101 |
| 100011110 | 0100011110 |
| 100100011 | 1100100011 |
| 100100101 | 1100100101 |
| 100100110 | 1100100110 |
| 100100111 | 0100100111 |
| 100101001 | 1100101001 |
| 100101010 | 1100101010 |
| 100101011 | 0100101011 |
| 100101100 | 1100101100 |
| 100101101 | 0100101101 |
| 100101110 | 0100101110 |
| 100110001 | 1100110001 |
| 100110010 | 1100110010 |
| 100110011 | 0100110011 |
| 100110100 | 1100110100 |
| 100110101 | 0100110101 |

TABLE 1-continued

Coding and decoding table of the first type of 9-bit source sequence set

| 9B | 10B (Difference value = 0) |
|---|---|
| 100110110 | 0100110110 |
| 100111000 | 1100111000 |
| 100111001 | 0100111001 |
| 100111010 | 0100111010 |
| 100111100 | 0100111100 |
| 101000011 | 1101000011 |
| 101000101 | 1101000101 |
| 101000110 | 1101000110 |
| 101000111 | 0101000111 |
| 101001001 | 1101001001 |
| 101001010 | 1101001010 |
| 101001011 | 0101001011 |
| 101001100 | 1101001100 |
| 101001101 | 0101001101 |
| 101001110 | 0101001110 |
| 101010001 | 1101010001 |
| 101010010 | 1101010010 |
| 101010011 | 0101010011 |
| 101010100 | 1101010100 |
| 101010101 | 0101010101 |
| 101010110 | 0101010110 |
| 101011000 | 1101011000 |
| 101011001 | 0101011001 |
| 101011010 | 0101011010 |
| 101011100 | 0101011100 |
| 101100001 | 1101100001 |
| 101100010 | 1101100010 |
| 101100011 | 0101100011 |
| 101100100 | 1101100100 |
| 100001110 | 1100001110 |
| 101100110 | 0101100110 |
| 101101000 | 1101101000 |
| 101101001 | 0101101001 |
| 101101010 | 0101101010 |
| 101101100 | 0101101100 |
| 101110001 | 0101110001 |
| 101110010 | 0101110010 |
| 101110100 | 0101110100 |
| 101111000 | 0101111000 |
| 110000011 | 1110000011 |
| 110000101 | 1110000101 |
| 110000110 | 1110000110 |
| 110000111 | 0110000111 |
| 110001001 | 1110001001 |
| 110001010 | 1110001010 |
| 110001011 | 0110001011 |
| 110001100 | 1110001100 |
| 110001101 | 0110001101 |
| 110001110 | 0110001110 |
| 110010001 | 1110010001 |
| 110010010 | 1110010010 |
| 110010011 | 0110010011 |
| 110010100 | 1110010100 |
| 110010101 | 0110010101 |
| 110010110 | 0110010110 |
| 110011000 | 1110011000 |
| 110011001 | 0110011001 |
| 110011010 | 0110011010 |
| 110011100 | 0110011100 |
| 110100001 | 1110100001 |
| 110100010 | 1110100010 |
| 110100011 | 0110100011 |
| 110100100 | 1110100100 |
| 110100101 | 0110100101 |
| 110100110 | 0110100110 |
| 110101000 | 1110101000 |
| 110101001 | 0110101001 |
| 110101010 | 0110101010 |
| 110101100 | 0110101100 |
| 110110001 | 0110110001 |
| 110110010 | 0110110010 |
| 110110100 | 0110110100 |
| 110111000 | 0110111000 |
| 111000001 | 1111000001 |
| 111000010 | 1111000010 |
| 111000011 | 0111000011 |
| 111000100 | 1111000100 |
| 111000101 | 0111000101 |
| 111000110 | 0111000110 |
| 111001000 | 1111001000 |
| 111001001 | 0111001001 |
| 111001010 | 0111001010 |
| 111001100 | 0111001100 |
| 111010001 | 0111010001 |
| 101100101 | 0101100101 |
| 111010100 | 0111010100 |
| 111011000 | 0111011000 |
| 111100001 | 0111100001 |
| 111100010 | 0111100010 |
| 111100100 | 0111100100 |
| 111101000 | 0111101000 |

Figure 5:
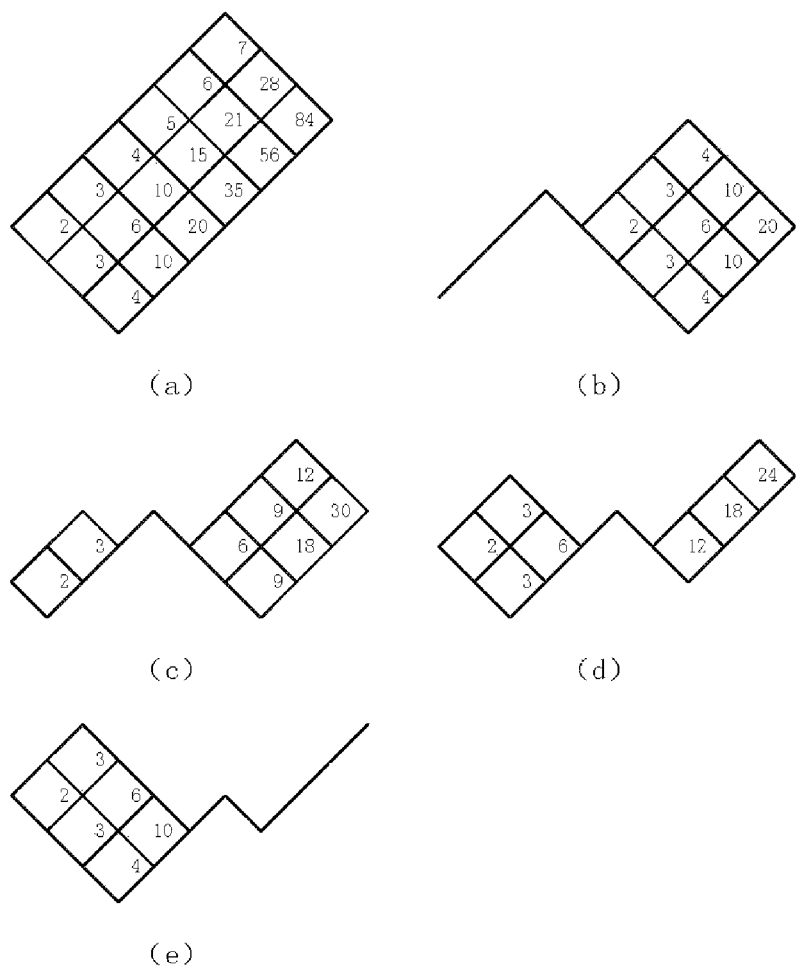
FIG. 5 is a trellis diagram of the second type of 9-bit source sequence set and its encoded 10-bit target sequence in a 9B/10B encoding and decoding method of the present invention.

As shown in FIG. 5, in this embodiment, the second type of 9-bit source sequence set only comprises 9-bit source sequences with a difference value of 3, and its trellis diagram is as shown in FIG. 5(a), with a total of 84 9-bit source sequences. The encoding method is as follows: inserting 1-bit data "0" in the position after the count number of "1" sequentially from the lowest bit to the high bit reaches 3 in the 9-bit source sequence.

In this embodiment, the 10-bit target sequence encoded by the second type of 9-bit source sequence set comprises the sequences represented by the lattices shown in FIG. 5(b), FIG. 5(c), FIG. 5(d) and FIG. 5(e), with a total of 84 10-bit target sequences.

For example, a 9-bit source sequence "111011001" with a difference value of 3 is encoded, and a 1-bit data "0" is inserted in the position after the count number of "1" sequentially from the lowest bit to the high bit reaches 3 in the sequence, that is, between the fifth and sixth bits of this sequence from the lowest bit to the high bit sequentially, and then it is encoded as a 10-bit target sequence "1110011001" and its opposite number "0001100110".

The encoding and decoding table of the second type of 9-bit source sequence set is shown in Table 2.

TABLE 2

Coding and decoding table of the second type of 9-bit source sequence set

| 9B | 10B (Difference value = 2) | 10B (Difference value = −2) |
|---|---|---|
| 000111111 | 0001110111 | 1110001000 |
| 001011111 | 0010110111 | 1101001000 |
| 001101111 | 0011010111 | 1100101000 |
| 001110111 | 0011100111 | 1100011000 |
| 001111011 | 0011101011 | 1100010100 |
| 001111101 | 0011101101 | 1100010010 |
| 001111110 | 0011101110 | 1100010001 |
| 010011111 | 0100110111 | 1011001000 |
| 010101111 | 0101010111 | 1010101000 |
| 010110111 | 0101100111 | 1010011000 |
| 010111011 | 0101101011 | 1010010100 |
| 010111101 | 0101101101 | 1010010010 |
| 010111110 | 0101101110 | 1010010001 |
| 011001111 | 0110010111 | 1001101000 |

TABLE 2-continued

Coding and decoding table of the
second type of 9-bit source sequence set

| 9B | 10B (Difference value = 2) | 10B (Difference value = −2) |
|---|---|---|
| 011010111 | 0110100111 | 1001011000 |
| 011011011 | 0110101011 | 1001010100 |
| 011011101 | 0110101101 | 1001010010 |
| 011011110 | 0110101110 | 1001010001 |
| 011100111 | 0111000111 | 1000111000 |
| 011101011 | 0111001011 | 1000110100 |
| 011101101 | 0111001101 | 1000110010 |
| 011101110 | 0111001110 | 1000110001 |
| 011110011 | 0111010011 | 1000101100 |
| 011110101 | 0111010101 | 1000101010 |
| 011110110 | 0111010110 | 1000101001 |
| 011111001 | 0111011001 | 1000100110 |
| 011111010 | 0111011010 | 1000100101 |
| 011111100 | 0111011100 | 1000100011 |
| 100011111 | 1000110111 | 0111001000 |
| 100101111 | 1001010111 | 0110101000 |
| 100110111 | 1001100111 | 0110011000 |
| 100111011 | 1001101011 | 0110010100 |
| 100111101 | 1001101101 | 0110010010 |
| 100111110 | 1001101110 | 0110010001 |
| 101001111 | 1010010111 | 0101101000 |
| 101010111 | 1010100111 | 0101011000 |
| 101011011 | 1010101011 | 0101010100 |
| 101011101 | 1010101101 | 0101010010 |
| 101011110 | 1010101110 | 0101010001 |
| 101100111 | 1011000111 | 0100111000 |
| 101101011 | 1011001011 | 0100110100 |
| 101101101 | 1011001101 | 0100110010 |
| 101101110 | 1011001110 | 0100110001 |
| 101110011 | 1011010011 | 0100101100 |
| 101110101 | 1011010101 | 0100101010 |
| 101110110 | 1011010110 | 0100101001 |
| 101111001 | 1011011001 | 0100100110 |
| 101111010 | 1011011010 | 0100100101 |
| 101111100 | 1011011100 | 0100100011 |
| 110001111 | 1100010111 | 0011101000 |
| 110010111 | 1100100111 | 0011011000 |
| 110011011 | 1100101011 | 0011010100 |
| 110011101 | 1100101101 | 0011010010 |
| 110011110 | 1100101110 | 0011010001 |
| 110100111 | 1101000111 | 0010111000 |
| 110101011 | 1101001011 | 0010110100 |
| 110101101 | 1101001101 | 0010110010 |
| 110101110 | 1101001110 | 0010110001 |
| 110110011 | 1101010011 | 0010101100 |
| 110110101 | 1101010101 | 0010101010 |
| 110110110 | 1101010110 | 0010101001 |
| 110111001 | 1101011001 | 0010100110 |
| 110111010 | 1101011010 | 0010100101 |
| 110111100 | 1101011100 | 0010100011 |
| 111000111 | 1110000111 | 0001111000 |
| 111001011 | 1110001011 | 0001110100 |
| 111001101 | 1110001101 | 0001110010 |
| 111001110 | 1110001110 | 0001110001 |
| 111010011 | 1110010011 | 0001101100 |
| 111010101 | 1110010101 | 0001101010 |
| 111010110 | 1110010110 | 0001101001 |
| 111011001 | 1110011001 | 0001100110 |
| 111011010 | 1110011010 | 0001100101 |
| 111011100 | 1110011100 | 0001100011 |
| 111100011 | 1110100011 | 0001011100 |
| 111100101 | 1110100101 | 0001011010 |
| 111100110 | 1110100110 | 0001011001 |
| 111101001 | 1110101001 | 0001010110 |
| 111101010 | 1110101010 | 0001010101 |
| 111101100 | 1110101100 | 0001010011 |
| 111110001 | 1110110001 | 0001001110 |
| 111110010 | 1110110010 | 0001001101 |
| 111110100 | 1110110100 | 0001001011 |
| 111111000 | 1110111000 | 0001000111 |

Figure 6:
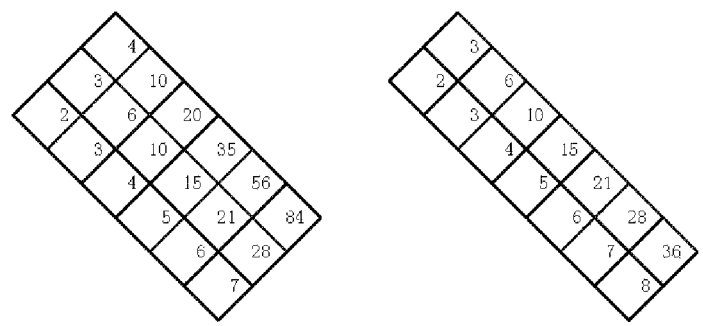
FIG. 6 is a trellis diagram of the third type of 9-bit source sequence set in a 9B/10B encoding and decoding method of the present invention.
Figure 6:
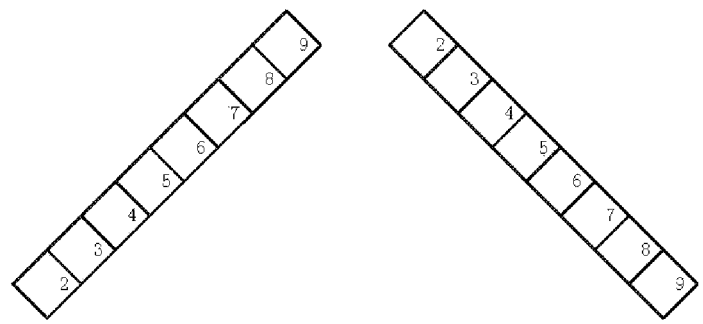
Figure 6:
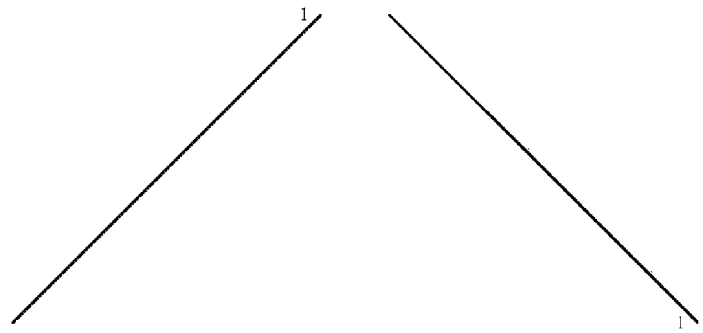
Figure 6:
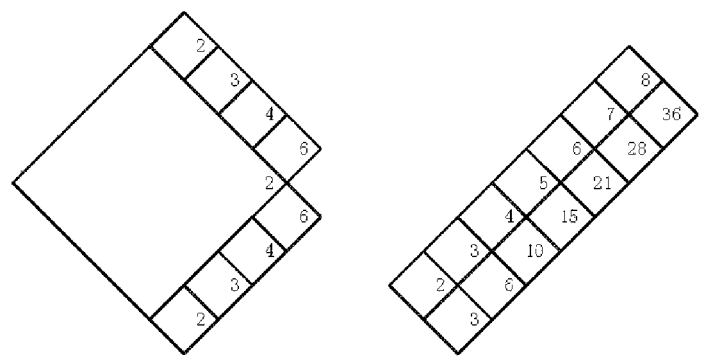

As shown in FIG. 6, in this embodiment, the third type of 9-bit source sequence set comprises 188 9-bit source sequences shown in the lattices of FIGS. 6(a), 6(b), 6(c), 6(d), 6(e), 6(f), 6(g) and 6(h).

The third type of 9-bit source sequence set comprises the fourth type of 9-bit source sequence set and the fifth type of 9-bit source sequence set. In this embodiment, the trellis diagram of the fourth type of 9-bit source sequence set is shown in FIG. 6(h), and there are 36 9-bit source sequences. The fifth type of 9-bit source sequence set includes 152 9-bit source sequences represented by the trellis diagram shown in FIG. 6(a), FIG. 6(b), FIG. 6(c), FIG. 6(d), FIG. 6(e), FIG. 6(f) and FIG. 6(g).

Figure 7:
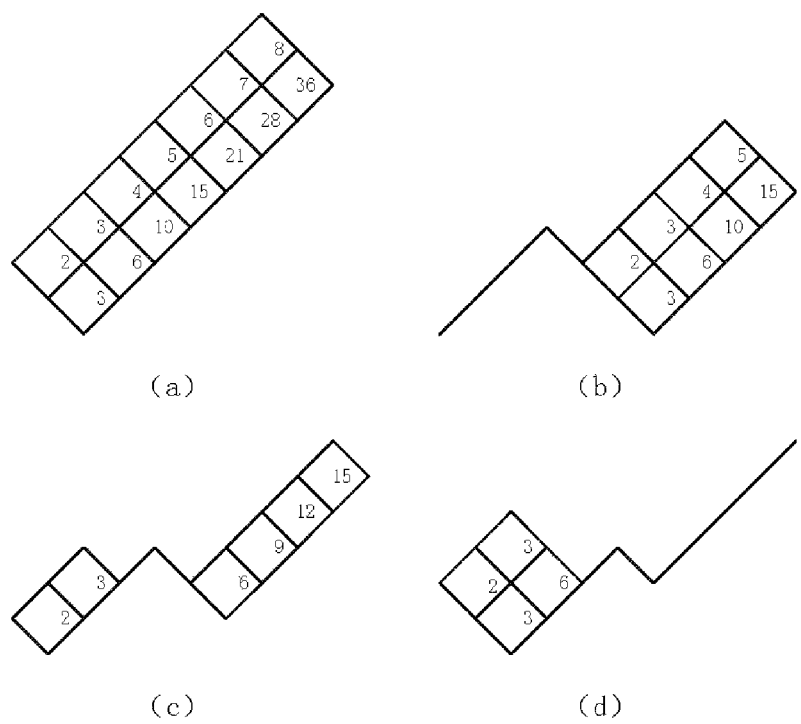
FIG. 7 is a trellis diagram of the fourth 9-bit source sequence set and its encoded 10-bit target sequence in a 9B/10B encoding and decoding method of the present invention.

As shown in FIG. 7, in this embodiment, the fourth type of 9-bit source sequence set only comprises 9-bit source sequences with a difference value of 5, and its trellis diagram is as shown in FIG. 7(a), with a total of 36 9-bit source sequences. The encoding method is as follows: inserting 1-bit data "0" in the position after the count number of "1" in the 9-bit source sequence sequentially from the lowest bit to the high bit reaches 3.

In this embodiment, the 10-bit target sequence encoded by the fourth type of 9-bit source sequence set comprises the sequences represented by the trellis diagrams shown in FIG. 7(b), FIG. 7(c) and FIG. 7(d), totaling 36 10-bit target sequences.

For example, a 9-bit source sequence "110111101" with a difference value of 5 is encoded, and a 1-bit data "0" is inserted in the position after the count number of "1" sequentially from the lowest bit to the high bit reaches 3 in the sequence, that is, between the fourth and fifth bits of this sequence from the lowest bit to the high bit sequentially, and then it is encoded as a 10-bit target sequence "1110011001" and its opposite number "0010010010".

The encoding and decoding table of the fourth type of 9-bit source sequence set is shown in Table 3.

TABLE 3

Coding and decoding table of the
fourth type of 9-bit source sequence set

| 9B | 10B (Difference value = 4) | 10B (Difference value = −4) |
|---|---|---|
| 001111111 | 0011110111 | 1100001000 |
| 010111111 | 0101110111 | 1010001000 |
| 011011111 | 0110110111 | 1001001000 |
| 011101111 | 0111010111 | 1000101000 |
| 011110111 | 0111100111 | 1000011000 |
| 011111011 | 0111101011 | 1000010100 |
| 011111101 | 0111101101 | 1000010010 |
| 011111110 | 0111101110 | 1000010001 |
| 100111111 | 1001110111 | 0110001000 |
| 101011111 | 1010110111 | 0101001000 |
| 101101111 | 1011010111 | 0100101000 |
| 101110111 | 1011100111 | 0100011000 |
| 101111011 | 1011101011 | 0100010100 |
| 101111101 | 1011101101 | 0100010010 |
| 101111110 | 1011101110 | 0100010001 |
| 110011111 | 1100110111 | 0011001000 |
| 110101111 | 1101010111 | 0010101000 |
| 110110111 | 1101100111 | 0010011000 |
| 110111011 | 1101101011 | 0010010100 |
| 110111101 | 1101101101 | 0010010010 |
| 110111110 | 1101101110 | 0010010001 |
| 111001111 | 1110010111 | 0001101000 |
| 111010111 | 1110100111 | 0001011000 |
| 111011011 | 1110101011 | 0001010100 |
| 111011101 | 1110101101 | 0001010010 |
| 111011110 | 1110101110 | 0001010001 |
| 111100111 | 1111000111 | 0000111000 |
| 111101011 | 1111001011 | 0000110100 |
| 111101101 | 1111001101 | 0000110010 |

TABLE 3-continued

Coding and decoding table of the
fourth type of 9-bit source sequence set

| 9B | 10B (Difference value = 4) | 10B (Difference value = -4) |
| --- | --- | --- |
| 111101110 | 1111001110 | 0000110001 |
| 111110011 | 1111010011 | 0000101100 |
| 111110101 | 1111010101 | 0000101010 |
| 111110110 | 1111010110 | 0000101001 |
| 111111001 | 1111011001 | 0000100110 |
| 111111010 | 1111011010 | 0000100101 |
| 111111100 | 1111011100 | 0000100011 |

Figure 8:
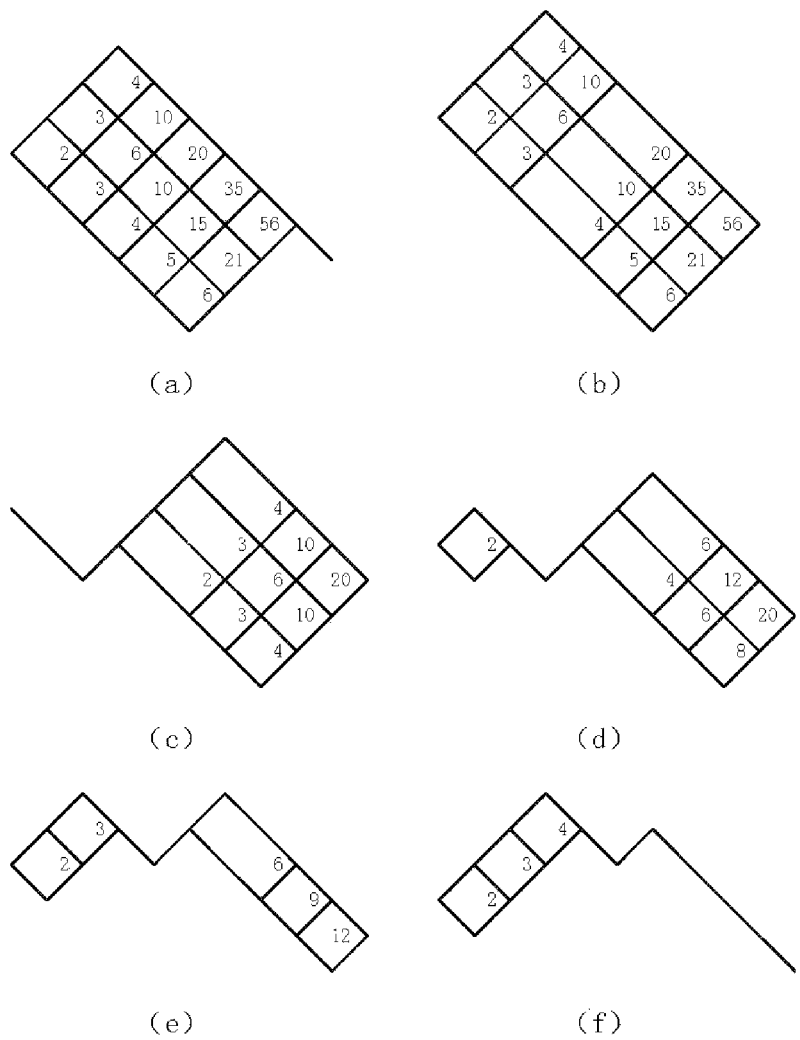
FIG. 8 is a trellis diagram of the fifth 9-bit source sequence subset A and its coded 10-bit target sequence in a 9B/10B encoding and decoding method of the present invention.

As shown in FIG. 8, in this embodiment, the sequence shown in the trellis diagram in FIG. 8(a) is selected as a subset A of the fifth type 9-bit source sequence, with a total of 56 9-bit source sequences. The encoding method is as follows: step 1, the number of "0" in the sequence shown in the trellis diagram in FIG. 8(a) is sequentially counted from the lowest bit to the high bit, and 1-bit data "0" is inserted into the position after counting up to 3; step 2, 1-bit data "1" is inserted into the sequence represented by the trellis diagram shown in FIG. 8(b) after counting up to 2 from the lowest bit to the high bit in the sequence.

In this embodiment, the 10-bit target sequence encoded by the fifth type of 9-bit source sequence subset A comprises the sequences represented by the grids shown in FIG. 8(c), FIG. 8(d), FIG. 8(e) and FIG. 8(f), and there are 56 10-bit target sequences in total.

For example, the 9-bit source sequence "000101010" is encoded. Step 1, 1-bit data "0" is inserted in the position after the number of "0" in the sequence is sequentially counted from the lowest bit to the high bit is counted up to 3, that is, between the fifth and sixth bits of the sequence sequentially from the lowest bit to the high bit, and the highest bit is deleted to obtain the sequence "001001010"; secondly, 1-bit data "1" is inserted in the position after the number of "0" in the sequence "001001010" is sequentially counted up to 2 from the lowest bit to the highest bit, that is, between the third bit and the fourth bit of the sequence from the lowest bit to the highest bit, it is encoded into a 10-bit target sequence "0010011010" and its opposite number "1101100100".

The encoding and decoding table of the fifth type of 9-bit source sequence subset A is shown in Table 4.

TABLE 4

Coding and decoding table of the
fifth type of 9-bit source sequence subset A

| 9B | 10B (Difference value = 2) | 10B (Difference value = -2) |
| --- | --- | --- |
| 000000111 | 1111011000 | 0000100111 |
| 000001011 | 1111010100 | 0000101011 |
| 000001101 | 1111010010 | 0000101101 |
| 000001110 | 1111010001 | 0000101110 |
| 000010011 | 1111001100 | 0000110011 |
| 000010101 | 1111001010 | 0000110101 |
| 000010110 | 1111001001 | 0000110110 |
| 000011001 | 1111000110 | 0000111001 |
| 000011010 | 1111000101 | 0000111010 |
| 000011100 | 1111000011 | 0000111100 |
| 000100011 | 1101101100 | 0010010011 |
| 000100101 | 1101101010 | 0010010101 |
| 000100110 | 1101101001 | 0010010110 |

TABLE 4-continued

Coding and decoding table of the
fifth type of 9-bit source sequence subset A

| 9B | 10B (Difference value = 2) | 10B (Difference value = -2) |
| --- | --- | --- |
| 000101001 | 1101100110 | 0010011001 |
| 000101010 | 1101100101 | 0010011010 |
| 000101100 | 1101100011 | 0010011100 |
| 000110001 | 1100110110 | 0011001001 |
| 000110010 | 1100110101 | 0011001010 |
| 000110100 | 1100110011 | 0011001100 |
| 000111000 | 1100011011 | 0011100100 |
| 001000011 | 1011101100 | 0100010011 |
| 001000101 | 1011101010 | 0100010101 |
| 001000110 | 1011101001 | 0100010110 |
| 001001001 | 1011100110 | 0100011001 |
| 001001010 | 1011100101 | 0100011010 |
| 001001100 | 1011100011 | 0100011100 |
| 001010001 | 1010110110 | 0101001001 |
| 001010010 | 1010110101 | 0101001010 |
| 001010100 | 1010110011 | 0101001100 |
| 001011000 | 1010011011 | 0101100100 |
| 001100001 | 1001110110 | 0110001001 |
| 001100010 | 1001110101 | 0110001010 |
| 001100100 | 1001110011 | 0110001100 |
| 001101000 | 1001011011 | 0110100100 |
| 001110000 | 1000111011 | 0111000100 |
| 010000011 | 0111101100 | 1000010011 |
| 010000101 | 0111101010 | 1000010101 |
| 010000110 | 0111101001 | 1000010110 |
| 010001001 | 0111100110 | 1000011001 |
| 010001010 | 0111100101 | 1000011010 |
| 010001100 | 0111100011 | 1000011100 |
| 010010001 | 0110110110 | 1001001001 |
| 010010010 | 0110110101 | 1001001010 |
| 010010100 | 0110110011 | 1001001100 |
| 010011000 | 0110011011 | 1001100100 |
| 010100001 | 0101110110 | 1010001001 |
| 010100010 | 0101110101 | 1010001010 |
| 010100100 | 0101110011 | 1010001100 |
| 010101000 | 0101011011 | 1010100100 |
| 010110000 | 0100111011 | 1011000100 |
| 011000001 | 0011110110 | 1100001001 |
| 011000010 | 0011110101 | 1100001010 |
| 011000100 | 0011110011 | 1100001100 |
| 011001000 | 0011011011 | 1100100100 |
| 011010000 | 0010111011 | 1101000100 |
| 011100000 | 0001111011 | 1110000100 |

Figure 9:
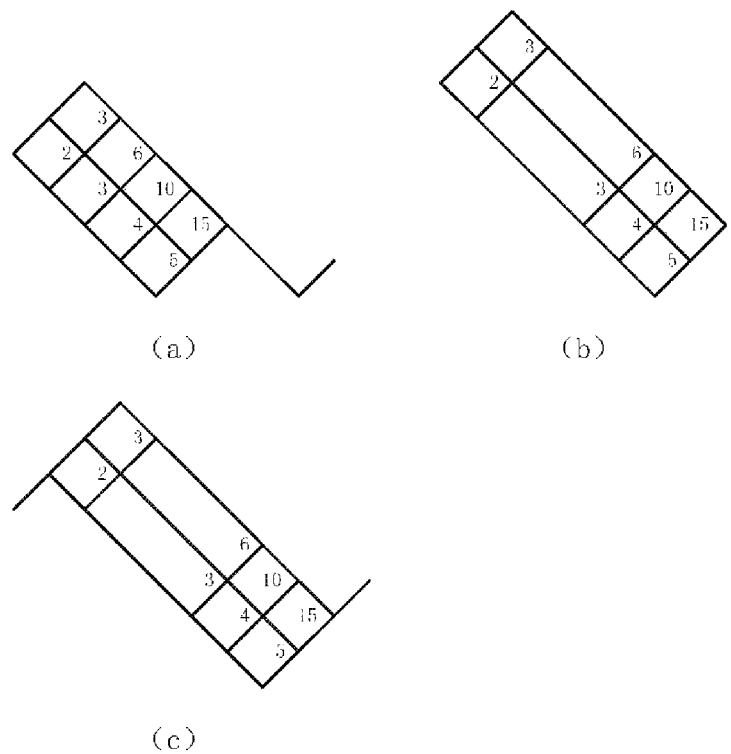
FIG. 9 is a trellis diagram of the fifth 9-bit source sequence subset B and its encoded 10-bit target sequence in a 9B/10B encoding and decoding method of the present invention.

As shown in FIG. 9, in this embodiment, the uncoded 9-bit source sequences are selected from the fifth type of 9-bit source sequence set to form the fifth type 9-bit source sequence subset B, and the trellis diagram of which is shown in FIG. 9(a), with a total of 15 9-bit source sequences. The encoding method is as follows: Step 1, 2-bit data "00" is inserted into the position after the number of "0" in the sequence shown in the trellis diagram in FIG. 9(a) is counted up to 2 from the lowest bit to the higher bit sequentially, and the highest 3 bits are deleted, so that the sequence shown in the trellis diagram in FIG. 9(b) is obtained; Step 2, 1-bit data "1" is inserted on the leftmost side and 1-bit data "1" is also inserted on the rightmost side of the sequence represented by the trellis diagram shown in FIG. 9(b).

In this embodiment, the 10-bit target sequence encoded by the fifth type of 9-bit source sequence subset B comprises the sequence represented by the trellis diagram shown in FIG. 9(c), and there are 15 10-bit target sequences in total.

For example, the 9-bit source sequence "100000110" is encoded. Step 1, 2-bit data "00" is inserted in the position after the number of "0" in the sequence is sequentially counted from the lowest bit to the high bit is counted up to 3, that is, between the fourth and fifth bits of the sequence sequentially from the lowest bit to the high bit, and the highest 3 bits are deleted to obtain the sequence "00000110"; secondly, 1-bit data "1" is inserted in the leftmost side and 1-bit data "1" is also inserted in the rightmost side of the sequence "0000110", it is encoded into a 10-bit target sequence "1000001101" and its opposite number "0111110010".

The encoding and decoding table of the fifth type of 9-bit source sequence subset B is shown in Table 5.

TABLE 5

Coding and decoding table of the fifth type of 9-bit source sequence subset B

| 9B | 10B (Difference value = 2) | 10B (Difference value = −2) |
|---|---|---|
| 100000011 | 0111111000 | 1000000111 |
| 100000101 | 0111110100 | 1000001011 |
| 100000110 | 0111110010 | 1000001101 |
| 100001001 | 0110111100 | 1001000011 |
| 100001010 | 0110111010 | 1001000101 |
| 100001100 | 0110011110 | 1001100001 |
| 100010001 | 0101111100 | 1010000011 |
| 100010010 | 0101111010 | 1010000101 |
| 100010100 | 0101011110 | 1010100001 |
| 100011000 | 0100111110 | 1011000001 |
| 100100001 | 0011111100 | 1100000011 |
| 100100010 | 0011111010 | 1100000101 |
| 100100100 | 0011011110 | 1100100001 |
| 100101000 | 0010111110 | 1101000001 |
| 100110000 | 0001111110 | 1110000001 |

Figure 10:
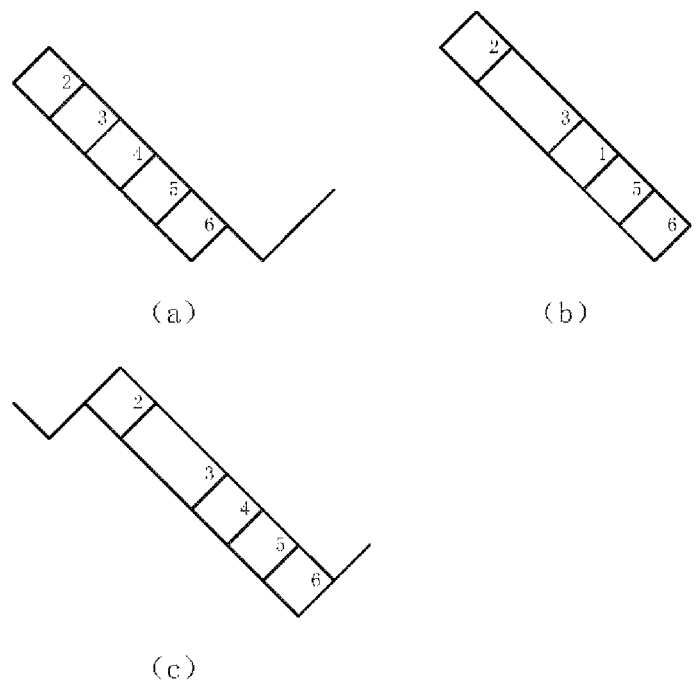
FIG. 10 is a trellis diagram of the fifth 9-bit source sequence subset C and its coded 10-bit target sequence in a 9B/10B encoding and decoding method of the present invention.

As shown in FIG. 10, in this embodiment, the uncoded 9-bit source sequences are selected from the fifth type of 9-bit source sequence set to form a fifth type 9-bit source sequence subset C, and the trellis diagram is shown in FIG. 10(a), which consists of six 9-bit source sequences. The encoding method is as follows: Step 1, 1-bit data "0" is inserted in the position after the number of "0" in the sequence shown in the trellis diagram in FIG. 10(a) sequentially from the lowest bit to the highest bit, and the highest 3 bits are deleted to obtain the sequence represented by the trellis diagram shown in FIG. 10(b); Step 2, 1-bit data "1" is inserted on the leftmost side and 2-bit data "10" is inserted on the rightmost side of the sequence represented by the trellis diagram shown in FIG. 10(b).

In this embodiment, the 10-bit target sequence encoded by the fifth type of 9-bit source sequence subset C comprises the sequence represented by the trellis diagram shown in FIG. 10(c), and there are six 10-bit target sequences in total.

For example, the 9-bit source sequence "110000010" is encoded. Step 1, 1-bit data "0" is inserted in the position after the number of "0" in the sequence is sequentially counted up to 2 from the lowest bit to the high bit, that is, between the third bit and the fourth bit of the sequence, and the highest 3 bits are deleted to obtain the sequence "0000010"; Step 2: 1-bit data is inserted into the leftmost part of the sequence "0000010" and 2-bit data into the rightmost part, and then it is encoded into a 10-bit target sequence "1000001010" and its opposite number "011110101".

The encoding and decoding table of the fifth type of 9-bit source sequence subset C is shown in Table 6.

TABLE 6

Coding and decoding table of the fifth type of 9-bit source sequence subset C

| 9B | 10B (Difference value = 4) | 10B (Difference value = −4) |
|---|---|---|
| 110000001 | 0111111001 | 1000000110 |
| 110000010 | 0111110101 | 1000001010 |
| 110000100 | 0111011101 | 1000100010 |
| 110001000 | 0110111101 | 1001000010 |
| 110010000 | 0101111101 | 1010000010 |
| 110100000 | 0011111101 | 1100000010 |

Figure 11:
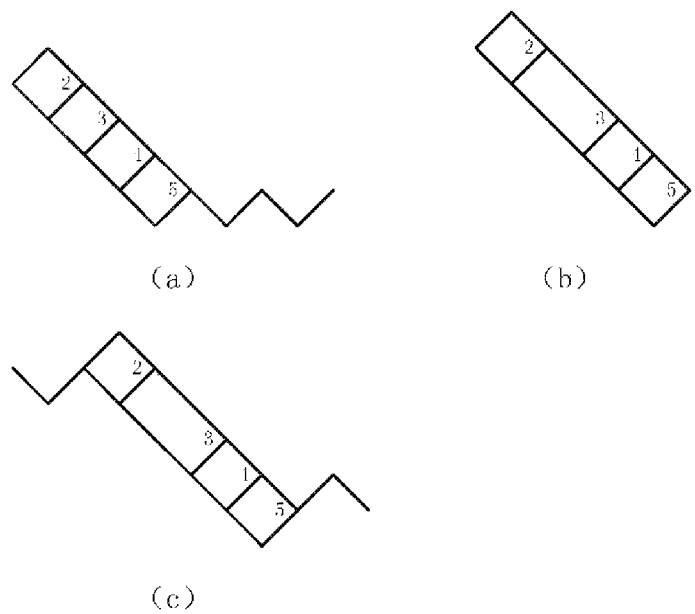
FIG. 11 is a trellis diagram of the fifth 9-bit source sequence subset D and its coded 10-bit target sequence in a 9B/10B encoding and decoding method of the present invention.

As shown in FIG. 11, in this embodiment, the uncoded 9-bit source sequences are selected from the fifth type of 9-bit source sequence set to form a fifth type 9-bit source sequence subset D, and the trellis diagram of which is shown in FIG. 11(a), with a total of five 9-bit source sequences. The encoding method is as follows: Step 1, the number of "0" in the sequence shown in the trellis diagram in FIG. 11(a) is sequentially counted from the lowest bit to the highest bit when it is 2.

Step 2, insert 2-bit data "01" on the leftmost side and 2-bit data "10" on the rightmost side of the sequence represented by the trellis diagram shown in FIG. 11(b).

In this embodiment, the 10-bit target sequence encoded by the fifth type of 9-bit source sequence subset D comprises the sequence represented by the trellis diagram shown in FIG. 11(c), and there are five 10-bit target sequences in total.

For example, the 9-bit source sequence "101000010" is encoded. Step 1, the number of "0" in the sequence is counted from the lowest bit to the high bit sequentially, that is, between the third bit and the fourth bit of the sequence counted from the lowest bit to the high bit sequentially, one bit of data "0" is inserted, and the highest four bits are deleted to obtain the sequence "000010"; Step 2: Insert 2-bit data "01" in the leftmost part of the sequence "000010" and 2-bit data "10" in the rightmost part, and it is encoded into a 10-bit target sequence "0100001010" and its opposite number "101110101".

The encoding and decoding table of the fifth type of 9-bit source sequence subset D is shown in Table 7.

TABLE 7

Coding and decoding table of the fifth type of 9-bit source sequence subset D

| 9B | 10B (Difference value = 4) | 10B (Difference value = −4) |
|---|---|---|
| 101000001 | 1011111001 | 0100000110 |
| 101000010 | 1011110101 | 0100001010 |
| 101000100 | 1011011101 | 0100100010 |
| 101001000 | 1010111101 | 0101000010 |
| 101010000 | 1001111101 | 0110000010 |

Figure 12:
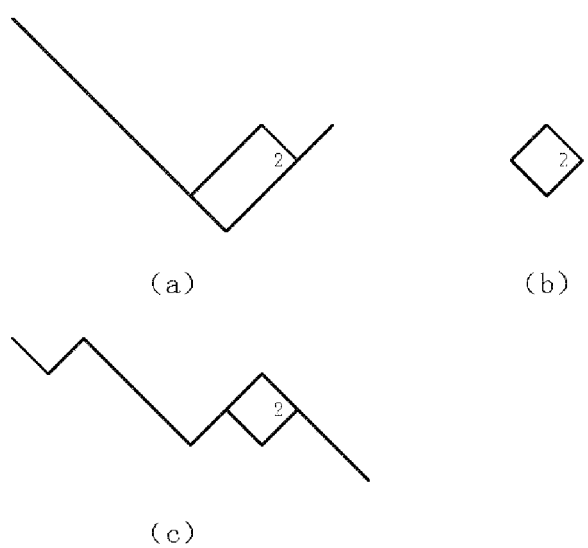
FIG. 12 is a trellis diagram of the fifth 9-bit source sequence subset E and its encoded 10-bit target sequence in a 9B/10B encoding and decoding method of the present invention.

As shown in FIG. 12, in this embodiment, an unencoded 9-bit source sequence set is selected to form a fifth 9-bit source sequence subset E, and its trellis diagram is shown in FIG. 12(a), which consists of two 9-bit source sequences. The encoding method is as follows: Step 1, the remaining bits except the second and fourth bits in the sequence shown in the trellis diagram in FIG. 12(a) sequentially counted from the highest bit to the lowest bit are deleted; Step 2, 2-bit data "00" is inserted on the leftmost side and 6-bit data "100010" is inserted on the rightmost side of the sequence represented by the trellis diagram shown in FIG. 12(b).

In this embodiment, the 10-bit target sequence encoded by the fifth type of 9-bit source sequence subset E comprises the sequence represented by the trellis diagram shown in FIG. 12(c), and there are two 10-bit target sequences in total.

For example, the 9-bit source sequence "101100000" is encoded. Step 1, the remaining bits except the second and fourth bits counted from the highest bit to the lower bit in the sequence are deleted to obtain the sequence "01"; Step 2, 2-bit data "00" is inserted in the leftmost part of the sequence "01" and 6-bit data "100010" in the rightmost side, and the sequence is encoded into a 10-bit target sequence "0001100010" and its opposite number "111001101".

The encoding and decoding table of the fifth type of 9-bit source sequence subset E is shown in Table 8.

TABLE 8

Coding and decoding table of the fifth type of 9-bit source sequence subset E

| 9B | 10B (Difference value = 4) | 10B (Difference value = −4) |
|---|---|---|
| 101100000 | 1110011101 | 0001100010 |
| 111000000 | 1101011101 | 0010100010 |

Figure 13:
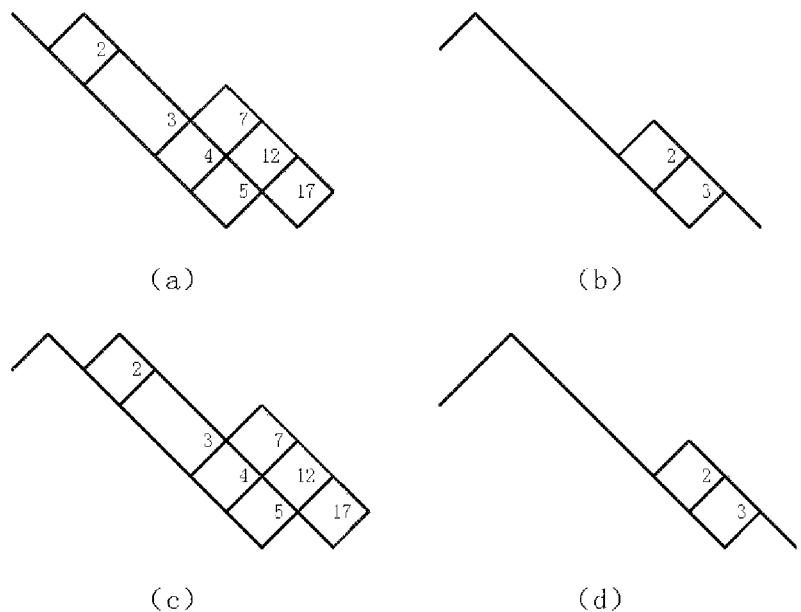
FIG. 13 is a trellis diagram of the fifth 9-bit source sequence subset F and its coded 10-bit target sequence in a 9B/10B encoding and decoding method of the present invention.

As shown in FIG. 13, in this embodiment, in the fifth type of 9-bit source sequence set, uncoded 9-bit source sequences are selected to form a fifth type of 9-bit source sequence subset F, and the trellis diagrams are shown in FIG. 13(a) and FIG. 13(b), with a total of 20 9-bit source sequences. The encoding method is as follows: inserting 1-bit data at the rightmost side of the 9-bit source sequence.

In this embodiment, the 10-bit target sequence encoded by the fifth type of 9-bit source sequence subset F comprises the sequences shown in the trellis diagram in FIG. 13(c) and FIG. 13(d), and there are 20 10-bit target sequences in total.

For example, a 9-bit source sequence "001010000" is encoded, and after inserting a 1-bit data into the rightmost part of the sequence, it is encoded into a 10-bit target sequence "0010100001" and its opposite number "110101110".

The encoding and decoding table of the fifth type of 9-bit source sequence subset F is shown in Table 9.

TABLE 9

Coding and decoding table of the fifth type of 9-bit source sequence subset F

| 9B | 10B (Difference value = 4) | 10B (Difference value = −4) |
|---|---|---|
| 000100001 | 1110111100 | 0001000011 |
| 000100010 | 1110111010 | 0001000101 |
| 000100100 | 1110110110 | 0001001001 |
| 000110000 | 1110011110 | 0001100001 |
| 001000001 | 1101111100 | 0010000011 |
| 001000010 | 1101111010 | 0010000101 |
| 001000100 | 1101110110 | 0010001001 |
| 001010000 | 1101011110 | 0010100001 |
| 001100000 | 1100111110 | 0011000001 |
| 010000001 | 1011111100 | 0100000011 |
| 010000010 | 1011111010 | 0100000101 |
| 010000100 | 1011110110 | 0100001001 |
| 010010000 | 1011011110 | 0100100001 |
| 010100000 | 1010111110 | 0101000001 |
| 011000000 | 1001111110 | 0110000001 |

TABLE 9-continued

Coding and decoding table of the fifth type of 9-bit source sequence subset F

| 9B | 10B (Difference value = 4) | 10B (Difference value = −4) |
|---|---|---|
| 100000010 | 0111111010 | 1000000101 |
| 100000100 | 0111110110 | 1000001001 |
| 100010000 | 0111011110 | 1000100001 |
| 100100000 | 0110111110 | 1001000001 |
| 101000000 | 0101111110 | 1010000001 |

Figure 14:
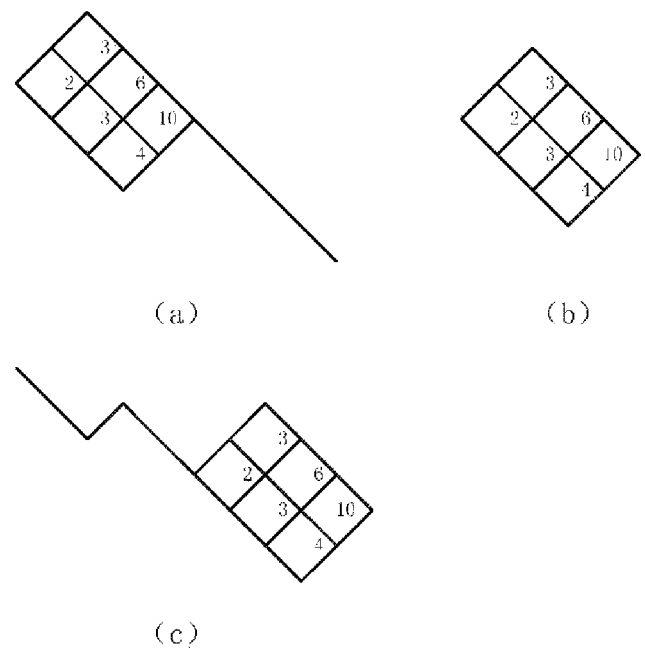
FIG. 14 is a trellis diagram of the fifth 9-bit source sequence subset G and its coded 10-bit target sequence in a 9B/10B encoding and decoding method of the present invention.

As shown in FIG. 14, in this embodiment, the uncoded 9-bit source sequences are selected from the fifth type of 9-bit source sequence set to form a fifth type 9-bit source sequence subset G, the trellis diagram of which is shown in FIG. 14(a), with a total of 10 9-bit source sequences. The encoding method is as follows: Step 1, deleting the highest 4 bits of the sequence shown in FIG. 14(a) to obtain the trellis diagram representation shown in FIG. 14(b); Step 2, inserting 5-bit data "00100" at the rightmost side of the sequence represented by the trellis diagram shown in FIG. 14(b).

In this embodiment, the 10-bit target sequence encoded by the fifth type of 9-bit source sequence subset G comprises the sequence represented by the trellis diagram shown in FIG. 14(c), with a total of 10 10-bit target sequences.

For example, the 9-bit source sequence "00001100" is encoded. Step 1, the highest 4 bits of the sequence are deleted to obtain the sequence "01100"; Step 2, after inserting 5-bit data "00100" into the rightmost part of the sequence "01100", it is encoded as a 10-bit target sequence "0110000100" and its opposite number "100111011".

The encoding and decoding table of the fifth type of 9-bit source sequence subset G is shown in Table 10.

TABLE 10

Coding and decoding table of the fifth type of 9-bit source sequence subset G

| 9B | 10B (Difference value = 4) | 10B (Difference value = −4) |
|---|---|---|
| 000000011 | 1110011011 | 0001100100 |
| 000000101 | 1101011011 | 0010100100 |
| 000000110 | 1100111011 | 0011000100 |
| 000001001 | 1011011011 | 0100100100 |
| 000001010 | 1010111011 | 0101000100 |
| 000001100 | 1001111011 | 0110000100 |
| 000010001 | 0111011011 | 1000100100 |
| 000010010 | 0110111011 | 1001000100 |
| 000010100 | 0101111011 | 1010000100 |
| 000011000 | 0011111011 | 1100000100 |

Figure 15:
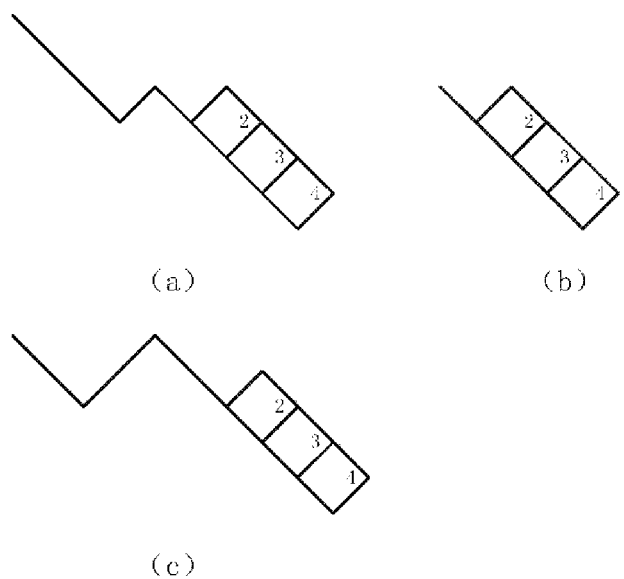
FIG. 15 is a trellis diagram of the fifth 9-bit source sequence subset H and its coded 10-bit target sequence in a 9B/10B encoding and decoding method of the present invention.

As shown in FIG. 15, in this embodiment, the uncoded 9-bit source sequences are selected from the fifth type of 9-bit source sequence set to form a fifth type 9-bit source sequence subset H, the trellis diagram of which is shown in FIG. 15(a), with a total of four 9-bit source sequences. The encoding method is as follows: Step 1, deleting the lowest four bits of the sequence shown in FIG. 15(a) to obtain the one shown in FIG. 15(b); Step 2, inserting 5-bit data "01100" at the rightmost side of the sequence represented by the trellis diagram shown in FIG. 15(b).

In this embodiment, the 10-bit target sequence encoded by the fifth type of 9-bit source sequence subset H comprises the sequence represented by the trellis diagram shown in FIG. 15(c), and there are four 10-bit target sequences in total.

For example, the 9-bit source sequence "010001000" is encoded. Step 1, the least 4 bits of the sequence are deleted to obtain the sequence "01000"; Step 2, after inserting 5-bit data "01100" into the rightmost part of the sequence "01000", it is encoded as a 10-bit target sequence "0100001100" and its opposite number "101110011".

The encoding and decoding table of the fifth type of 9-bit source sequence subset H is shown in Table 11.

TABLE 11

Coding and decoding table of the fifth type of 9-bit source sequence subset H

| 9B | 10B (Difference value = 4) | 10B (Difference value = −4) |
|---|---|---|
| 000101000 | 1110110011 | 0001001100 |
| 001001000 | 1101110011 | 0010001100 |
| 010001000 | 1011110011 | 0100001100 |
| 100001000 | 0111110011 | 1000001100 |

Figure 16:
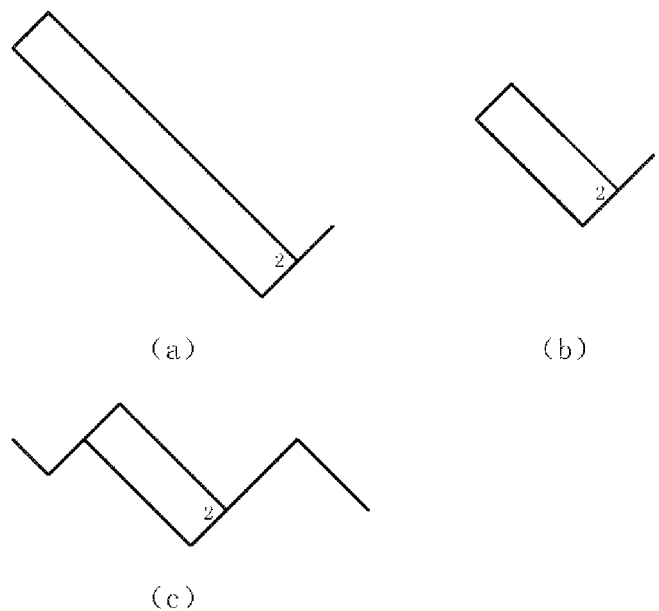
FIG. 16 is a trellis diagram of the fifth 9-bit source sequence subset I and its encoded 10-bit target sequence in a 9B/10B encoding and decoding method of the present invention.

As shown in FIG. 16, in this embodiment, the uncoded 9-bit source sequences are selected from the fifth type of 9-bit source sequence set to form the fifth type 9-bit source sequence subset I, and its trellis diagram is shown in FIG. 16(a), which consists of two 9-bit source sequences. The encoding method is as follows: Step 1, deleting the second bit to the fifth bit sequentially counted from the lowest bit to the high bit in the sequence shown in FIG. 16(a) to obtain FIG. 16; Step 2, inserting 3-bit data "001" on the leftmost side and 2-bit data "10" on the rightmost side of the sequence represented by the trellis diagram shown in FIG. 16(b).

In this embodiment, the 10-bit target sequence encoded by the fifth type of 9-bit source sequence subset I comprises the sequence represented by the trellis diagram shown in FIG. 16(c), and there are two 10-bit target sequences in total.

For example, the 9-bit source sequence "110000000" is encoded. Step 1, deleting the second to fifth bits counted from the lowest bit to the high bit in the sequence are deleted to obtain the sequence "11000"; Step 2, inserting 3-bit data "001" into the leftmost part of the sequence "11000" and 2-bit data "10" into the rightmost part, and then encoding it into a 10-bit target sequence "001100010" and its opposite number "110001101".

The encoding and decoding table of the fifth type of 9-bit source sequence subset I is shown in Table 12.

TABLE 12

Coding and decoding table of the fifth type of 9-bit source sequence subset I

| 9B | 10B (Difference value = 2) | 10B (Difference value = −2) |
|---|---|---|
| 100000001 | 1100111001 | 0011000110 |
| 110000000 | 1100011101 | 0011100010 |

Figure 17:
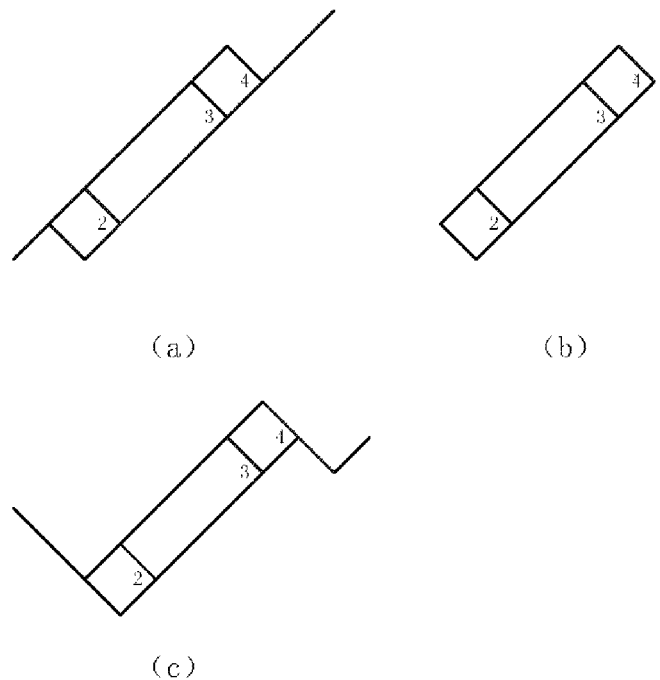
FIG. 17 is a trellis diagram of the fifth 9-bit source sequence subset J and its coded 10-bit target sequence in a 9B/10B encoding and decoding method of the present invention.

As shown in FIG. 17, in this embodiment, the uncoded 9-bit source sequences are selected from the fifth type of 9-bit source sequence set to form a fifth type 9-bit source sequence subset J, the trellis diagram of which is shown in FIG. 17(a), with a total of four 9-bit source sequences. The encoding method is as follows: Step 1, deleting the highest 2 bits and the lowest bits of the sequence shown in FIG. 17(a) to obtain the trellis shown in FIG. 17(b); Step 2, inserting 2-bit data "10" on the leftmost side and 2-bit data "00" on the rightmost side of the sequence represented by the trellis diagram shown in FIG. 17(b).

In this embodiment, the 10-bit target sequence encoded by the fifth type of 9-bit source sequence subset J comprises the sequence represented by the trellis diagram shown in FIG. 17(c), and there are four 10-bit target sequences in total.

For example, the 9-bit source sequence "111111011" is encoded. Step 1, the highest 2 bits and the lowest bit of the sequence are deleted to obtain the sequence "111101"; Step 2, 2-bit data "10" is inserted in the leftmost part of the sequence "111101" and 2-bit data "00" is inserted in the rightmost part, and then it is encoded into a 10-bit target sequence "101110100" and its opposite number "encoding0100001011".

The encoding and decoding table of the fifth type of 9-bit source sequence subset J is shown in Table 13.

TABLE 13

Coding and decoding table of the fifth type of 9-bit source sequence subset J

| 9B | 10B (Difference value = 2) | 10B (Difference value = −2) |
|---|---|---|
| 110111111 | 1001111100 | 0110000011 |
| 111011111 | 1010111100 | 0101000011 |
| 111111011 | 1011110100 | 0100001011 |
| 111111101 | 1011111000 | 0100000111 |

Figure 18:
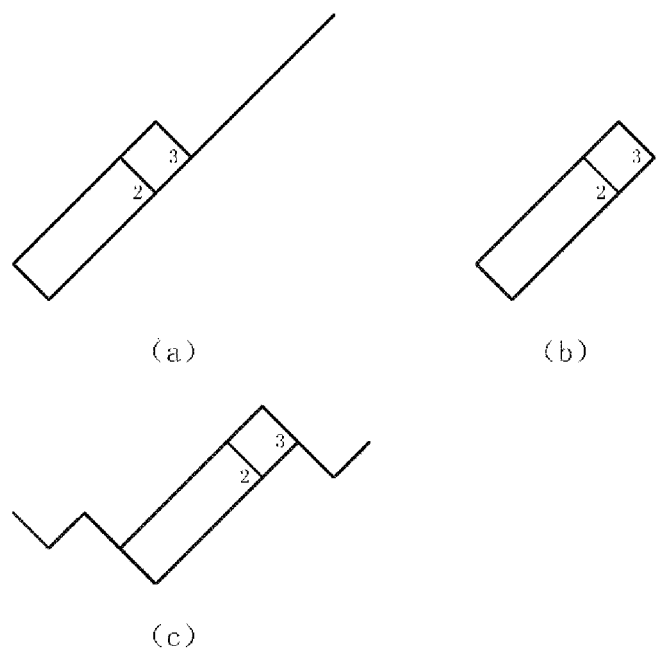
FIG. 18 is a trellis diagram of the fifth 9-bit source sequence subset K and its encoded 10-bit target sequence in a 9B/10B encoding and decoding method of the present invention.

As shown in FIG. 18, in this embodiment, the uncoded 9-bit source sequences are selected from the fifth type of 9-bit source sequence set to form a fifth type 9-bit source sequence subset K, the trellis diagram of which is shown in FIG. 18(a), with a total of three 9-bit source sequences. The encoding method is as follows: Step 1, deleting the highest four bits of the sequence shown in FIG. 18(a) to obtain the one shown in FIG. 18(b); Step 2, inserting 2-bit data "10" on the leftmost side and 3-bit data "010" on the rightmost side of the sequence represented by the trellis diagram shown in FIG. 18(b).

In this embodiment, the 10-bit target sequence encoded by the fifth type of 9-bit source sequence subset k comprises the sequence represented by the trellis diagram shown in FIG. 18(c), and there are three 10-bit target sequences in total.

For example, the 9-bit source sequence "111110111" is encoded. Step 1, the highest 4 bits of the sequence are deleted to obtain the sequence "10111"; Step 2, 2-bit data "10" is inserted in the leftmost part of the sequence "10111" and 3-bit data "010" is inserted in the rightmost part, and it is encoded into a 10-bit target sequence "101011010" and its opposite number "0101000101".

The encoding and decoding table of the fifth type of 9-bit source sequence subset K is shown in Table 14.

TABLE 14

Coding and decoding table of the
fifth type of 9-bit source sequence subset K

| 9B | 10B (Difference value = 2) | 10B (Difference value = −2) |
|---|---|---|
| 111101111 | 1001111010 | 0110000101 |
| 111110111 | 1010111010 | 0101000101 |
| 111111110 | 1011110010 | 0100001101 |

Figure 19:
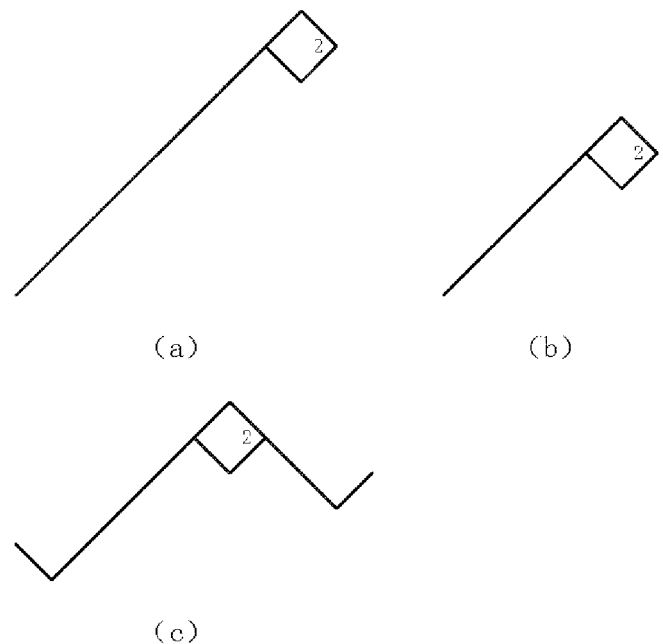
FIG. 19 is a trellis diagram of the fifth 9-bit source sequence subset L and its encoded 10-bit target sequence in a 9B/10B encoding and decoding method of the present invention.

As shown in FIG. 19, in this embodiment, the uncoded 9-bit source sequences are selected from the fifth type of 9-bit source sequence set to form a fifth type 9-bit source sequence subset L, the trellis diagram of which is shown in FIG. 19(a), with a total of two 9-bit source sequences. The encoding method is as follows: Step 1, deleting the least three bits of the sequence shown in FIG. 19(a) to obtain the one shown in FIG. 19(b); Step 2, inserting 3-bit data "100" on the leftmost side and 1-bit data "0" on the rightmost side of the sequence represented by the trellis diagram shown in FIG. 19(b).

In this embodiment, the 10-bit target sequence encoded by the fifth type of 9-bit source sequence subset L comprises the sequence represented by the trellis diagram shown in FIG. 19(c), and there are two 10-bit target sequences in total.

For example, the 9-bit source sequence "101111111" is encoded. Step 1, the least 3 bits of the sequence are deleted to obtain the sequence "101111"; Step 2, 3-bit data "100" is inserted in the leftmost part of the sequence "101111" and 1-bit data "0" is inserted in the rightmost part, and it is encoded into a 10-bit target sequence "1001011110" and its opposite number "011010001".

The encoding and decoding table of the fifth type of 9-bit source sequence subset L is shown in Table 15.

TABLE 15

Coding and decoding table of the
fifth type of 9-bit source sequence subset L

| 9B | 10B (Difference value = 2) | 10B (Difference value = −2) |
|---|---|---|
| 011111111 | 1000111110 | 0111000001 |
| 101111111 | 1001011110 | 0110100001 |

Figure 20:
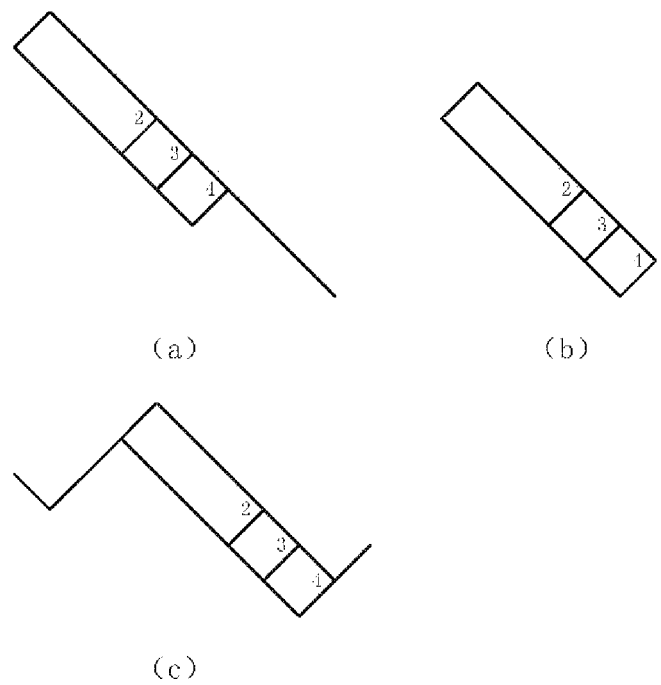
FIG. 20 is a trellis diagram of the fifth 9-bit source sequence subset M and its coded 10-bit target sequence in a 9B/10B encoding and decoding method of the present invention.

As shown in FIG. 20, in this embodiment, in the fifth type of 9-bit source sequence set, uncoded 9-bit source sequences are selected to form a fifth type 9-bit source sequence subset M, and its trellis diagram is as shown in FIG. 20(a), with a total of four 9-bit source sequences. The encoding method is as follows: Step 1, deleting the highest three bits of the sequence shown in FIG. 20(a) to obtain the one shown in FIG. 20(b); Step 2, inserting 1-bit data "1" on the leftmost side and 3-bit data "110" on the rightmost side of the sequence represented by the trellis diagram shown in FIG. 20(b).

In this embodiment, the 10-bit target sequence encoded by the fifth type of 9-bit source sequence subset M comprises the sequence represented by the trellis diagram shown in FIG. 20(c), and there are four 10-bit target sequences in total.

For example, the 9-bit source sequence "000010000" is encoded. Step 1, the highest 3 bits of the sequence are deleted to obtain the sequence "010000"; Step 2, 1-bit data "1" is inserted in the leftmost part of the sequence "010000" and 3-bit data "110" is inserted in the rightmost part, and it is encoded into a 10-bit target sequence "1010000110" and its opposite number "010111001".

The encoding and decoding table of the fifth type of 9-bit source sequence subset M is shown in Table 16.

TABLE 16

Coding and decoding table of the
fifth type of 9-bit source sequence subset M

| 9B | 10B (Difference value = 2) | 10B (Difference value = −2) |
|---|---|---|
| 000000001 | 0111110001 | 1000001110 |
| 000001000 | 0110111001 | 1001000110 |
| 000010000 | 0101111001 | 1010000110 |
| 000100000 | 0011111001 | 1100000110 |

Figure 21:
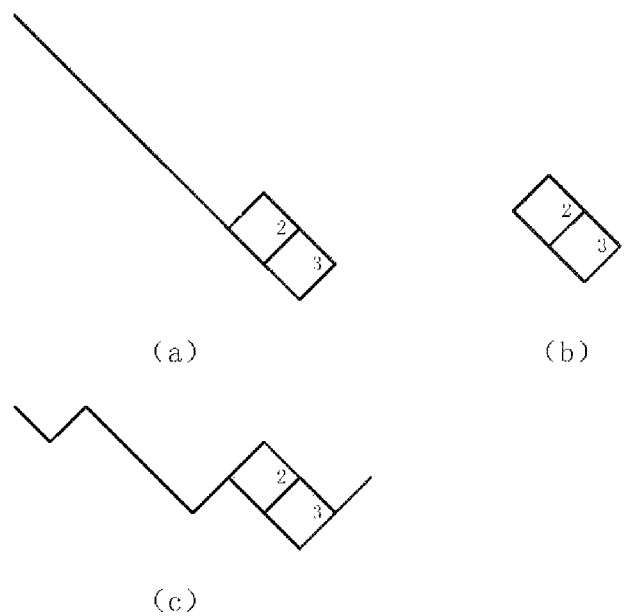
FIG. 21 is a trellis diagram of the fifth 9-bit source sequence subset N and its encoded 10-bit target sequence in a 9B/10B encoding and decoding method of the present invention.

As shown in FIG. 21, in this embodiment, the unencoded 9-bit source sequences are selected from the fifth type of 9-bit source sequence set to form a fifth type 9-bit source sequence subset n, and the trellis diagram is shown in FIG. 21(a), which consists of three 9-bit source sequences. The encoding method is as follows: Step 1, deleting the lowest 6 bits of the sequence shown in FIG. 21(a) to obtain the one shown in FIG. 21(b); Step 2, inserting 1-bit data "1" on the leftmost side and 6-bit data "100010" on the rightmost side of the sequence represented by the trellis diagram shown in FIG. 21(b).

In this embodiment, the 10-bit target sequence encoded by the fifth type of 9-bit source sequence subset n comprises the sequence represented by the trellis diagram shown in FIG. 21(c), and there are three 10-bit target sequences in total.

For example, the 9-bit source sequence "001000000" is encoded. Step 1, the lowest 6 bits of the sequence are deleted to obtain the sequence "001"; Step 2, 1 bit data "1" is inserted in the leftmost part of the sequence "001" and 6 bit data "100010" is inserted in the rightmost part, and it is encoded into a 10-bit target sequence "1001100010" and its opposite number "011001101".

The encoding and decoding table of the fifth type of 9-bit source sequence subset n is shown in Table 17.

TABLE 17

Coding and decoding table of the
fifth type of 9-bit source sequence subset n

| 9B | 10B (Difference value =2) | 10B (Difference value = −2) |
|---|---|---|
| 001000000 | 0110011101 | 1001100010 |
| 010000000 | 0101011101 | 1010100010 |
| 100000000 | 0011011101 | 1100100010 |

Figure 22:
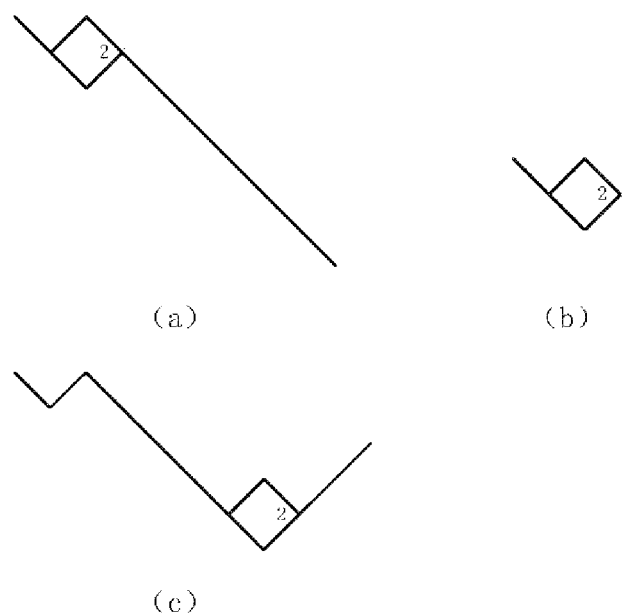
FIG. 22 is a trellis diagram of the fifth 9-bit source sequence subset O and its coded 10-bit target sequence in a 9B/10B encoding and decoding method of the present invention.

As shown in FIG. 22, in this embodiment, the uncoded 9-bit source sequences are selected from the fifth type of 9-bit source sequence set to form a fifth type 9-bit source sequence subset O, the trellis diagram of which is shown in FIG. 22(a), with a total of two 9-bit source sequences. The encoding method is as follows: Step 1, delete the highest six bits of the sequence shown in FIG. 22(a) to obtain the one shown in FIG. 22(b). Second, insert 2-bit data "11" on the leftmost side and 5-bit data "00010" on the rightmost side of the sequence represented by the trellis diagram shown in FIG. 22(b).

In this embodiment, the 10-bit target sequence encoded by the fifth type of 9-bit source sequence subset O comprises the sequence represented by the trellis diagram shown in FIG. 22(c), and there are two 10-bit target sequences in total.

For example, the 9-bit source sequence "000000100" is encoded. Step 1, the highest 6 bits of the sequence are deleted to obtain the sequence "100"; Step 2, 2-bit data "11" is inserted in the leftmost part of the sequence "100" and 5-bit data "00010" is inserted in the rightmost part, and it is encoded into a 10-bit target sequence "11100000010" and its opposite number "00011101".

The encoding and decoding table of the fifth type of 9-bit source sequence subset O is shown in Table 18.

TABLE 18

Coding and decoding table of the
fifth type of 9-bit source sequence subset O

| 9B | 10B (Difference value = 2) | 10B (Difference value = −2) |
|---|---|---|
| 000000010 | 0010111101 | 1101000010 |
| 000000100 | 0001111101 | 1110000010 |

Figure 23:
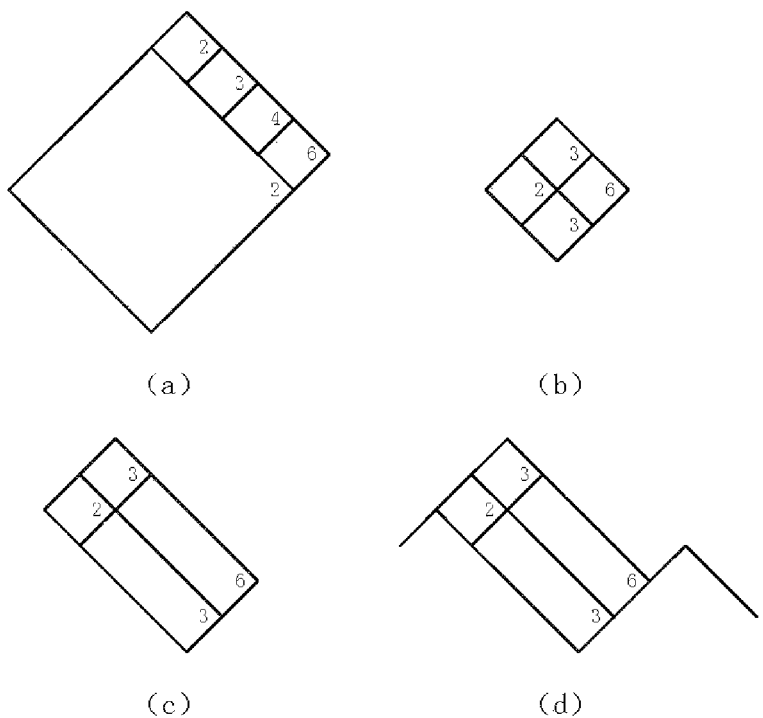
FIG. 23 is a trellis diagram of the fifth 9-bit source sequence subset P and its encoded 10-bit target sequence in a 9B/10B encoding and decoding method of the present invention.

As shown in FIG. 23, in this embodiment, the unencoded 9-bit source sequences are selected to form a subset P of the fifth-class 9-bit source sequences, and the trellis diagram is shown in FIG. 23(a), with a total of six 9-bit source sequences. The encoding method is as follows: Step 1, according to the lowest and highest 5 bits in the 9-bit source sequences shown in the trellis diagram shown in FIG. 23(a), one of the six 4-bit balanced sequences represented by the trellis diagram shown in FIG. 23(b) is selected as the result of the first step encoding of the 9-bit source sequence. Step 2, t2-bit data "00" is inserted into the position after the number of "0" in the sequence shown in the trellis diagram in FIG. 23(b) is sequentially counted up to 2 from the lowest bit to the high bit to obtain the sequence shown in the trellis diagram in FIG. 23(c); Step 3, 3-bit data "001" is inserted on the leftmost side and 1-bit data "1" is inserted on the rightmost side of the sequence represented by the trellis diagram shown in FIG. 23(c).

In this embodiment, the 10-bit target sequence encoded by the fifth type of 9-bit source sequence subset P comprises the sequence represented by the trellis diagram shown in FIG. 23(d), and there are six 10-bit target sequences in total.

For example, the 9-bit source sequence "100001111" is encoded. Step 1, since the lowest bit of the sequence is "1" and the first bit counted from the highest bit to the lower bit is "1", the sequence "1010" is selected as the result of the first encoding step; Step 2, 2-bit data "00" is inserted on the position after the number of "0" in the sequence "1010" is sequentially counted up to 2 from the lowest bit to the highest bit, that is, between the third bit and the fourth bit of the sequence from the lowest bit to the highest bit, to obtain the sequence "100010"; Step 3, 3-bit data "001" is inserted into the leftmost part of the sequence "100010" and 1-bit data is inserted into the rightmost part, and then it is encoded into a 10-bit target sequence "0011000101" and its opposite number "110011010".

The encoding and decoding table of the fifth type of 9-bit source sequence subset P is shown in Table 19.

TABLE 19

Coding and decoding table of the
fifth type of 9-bit source sequence subset P

| 9B | 10B (Difference value = 2) | 10B (Difference value = −2) |
|---|---|---|
| 000011111 | 1101111000 | 0010000111 |
| 000101111 | 1101110100 | 0010001011 |
| 001001111 | 1100111100 | 0011000011 |
| 010001111 | 1101110010 | 0010001101 |
| 100001111 | 1100111010 | 0011000101 |
| 111110000 | 1100011110 | 0011100001 |

Figure 24:
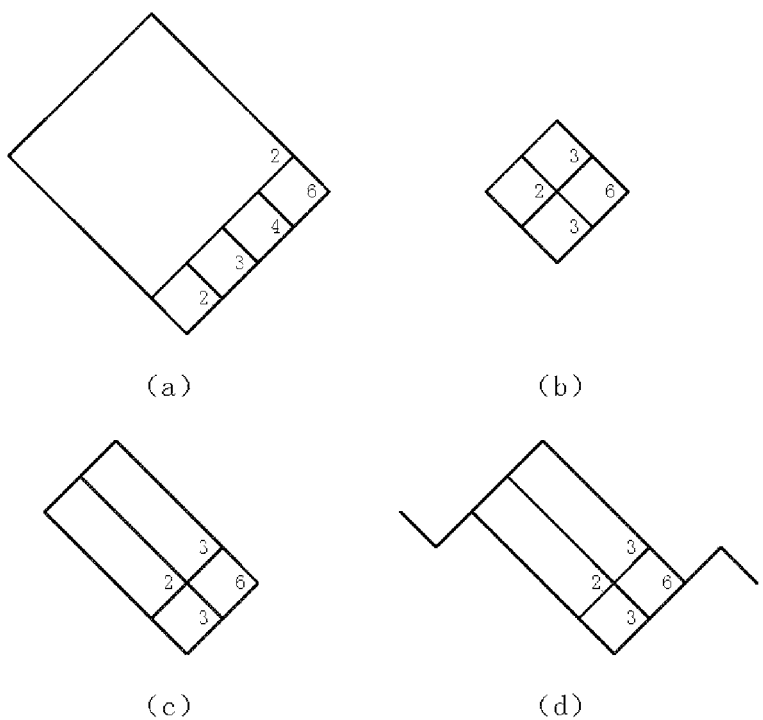
FIG. 24 is a trellis diagram of the fifth 9-bit source sequence subset Q and its encoded 10-bit target sequence in a 9B/10B encoding and decoding method of the present invention.

As shown in FIG. 24, in this embodiment, uncoded 9-bit source sequences are selected to form a subset Q of the fifth-class 9-bit source sequences, the trellis diagram of which is shown in FIG. 24(a), with a total of six 9-bit source sequences. The encoding method is as follows: Step 1, according to the lowest and highest 5 bits in the 9-bit source sequences shown in the trellis diagram shown in FIG. 24(a), one of the six 4-bit balanced sequences represented by the trellis diagram shown in FIG. 24(b) is selected as the result of the first step encoding of the 9-bit source sequence. Step 2, 2-bit data "00" is inserted after the number of "0" in the sequence shown in the trellis diagram in FIG. 24(b) is sequentially counted up to 1 from the lowest bit to the high bit to obtain the sequence shown in the trellis diagram in FIG. 24(c); Step 3, 2-bit data "01" is inserted on the leftmost side and 2-bit data "10" is inserted on the rightmost side of the sequence represented by the trellis diagram shown in FIG. 24(c).

In this embodiment, the 10-bit target sequence encoded by the fifth type of 9-bit source sequence subset q comprises the sequence represented by the trellis diagram shown in FIG. 24(d), and there are six 10-bit target sequences in total.

For example, the 9-bit source sequence "110110000" is encoded. Step 1, since the lowest bit of the sequence is "0" and the third bit counted from the highest bit to the lower bit is "0", the sequence "1001" is selected as the result of the first encoding step; Step 2, 2-bit data "00" is inserted in the position after the number of "0" in the sequence "1001" is sequentially counted up to 1 from the lowest bit to the highest bit, that is, between the second bit and the third bit of the sequence from the lowest bit to the highest bit, to obtain the sequence "100001"; Step 3, 2-bit data "01" is inserted in the leftmost part of the sequence "100001" and 2-bit data "10" is inserted in the rightmost part, and it is encoded into a 10-bit target sequence "0110000110" and its opposite number "100111001".

The encoding and decoding table of the fifth type of 9-bit source sequence subset Q is shown in Table 20.

TABLE 20

Coding and decoding table of the
fifth type of 9-bit source sequence subset Q

| 9B | 10B (Difference value = 2) | 10B (Difference value = −2) |
|---|---|---|
| 000001111 | 1011110001 | 0100001110 |
| 011110000 | 1010111001 | 0101000110 |
| 101110000 | 1010011101 | 0101100010 |
| 110110000 | 1001111001 | 0110000110 |
| 111010000 | 1001011101 | 0110100010 |
| 111100000 | 1000111101 | 0111000010 |

Figure 25:
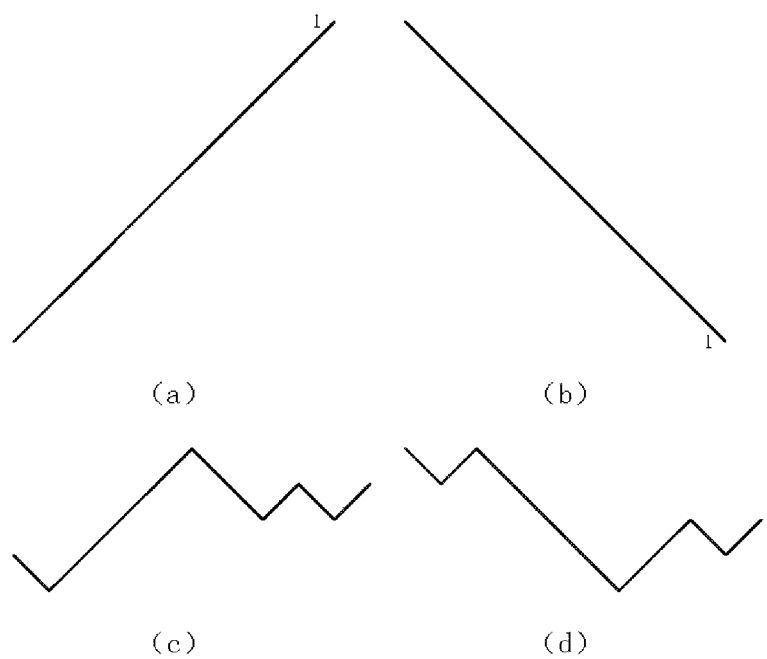
FIG. 25 is a trellis diagram of the fifth 9-bit source sequence subset R and its coded 10-bit target sequence in a 9B/10B encoding and decoding method of the present invention.

As shown in FIG. 25, in this embodiment, in the fifth type of 9-bit source sequence set, uncoded 9-bit source sequences are selected to form a fifth type of 9-bit source sequence subset R, and the trellis diagrams are as shown in FIGS. 25(a) and 25(b), and there are two 9-bit source sequences in total.

In this embodiment, the 10-bit target sequence encoded by the fifth type of 9-bit source sequence subset R comprises the sequences represented by the trellis diagrams shown in FIG. 25(c) and FIG. 25(d), and there are two 10-bit target sequences in total.

The encoding and decoding table of the fifth type of 9-bit source sequence subset R is shown in Table 21.

TABLE 21

Coding and decoding table of the fifth type of 9-bit source sequence subset R

| 9B | 10B (Difference value = 2) | 10B (Difference value = −2) |
|---|---|---|
| 000000000 | 0100111101 | 1011000010 |
| 111111111 | 1010011110 | 0101100001 |

Alternatively, the coding of the fifth type of 9-bit source sequence subset R may also be a 10-bit unbalanced sequence in the 10-bit target sequence set and not represented by the trellis diagrams shown in FIG. 5 and FIGS. 7 to 25.

In addition, in this embodiment, the unused 10-bit unbalanced sequence in the 10-bit target sequence set can be used as the encoding of control characters, and the encoding and decoding table of control characters is shown in Table 22.

TABLE 22

Coding and decoding table of control characters

| Control character | 10B (The difference value is positive) | 10B (The difference value is negative) |
|---|---|---|
| Control character 1 | 0011111110 | 1100000001 |
| Control character 2 | 0111111100 | 1000000011 |
| Control character 3 | 1101111001 | 0010000110 |
| Control character 4 | 1101110101 | 0010001010 |
| Control character 5 | 1101110001 | 0010001110 |
| Control character 6 | 1100111101 | 0011000010 |
| Control character 7 | 1110111001 | 0001000110 |
| Control character 8 | 1110110101 | 0001001010 |

In this embodiment, the total 9B10B codec table is shown in Table 23.

TABLE 23

9B10B total codec table of an application embodiment of the present invention 9-bit source sequence set coding

| 9B | | 10B (The difference value is positive or 0) | | | 10B (The difference value is negative) | | |
|---|---|---|---|---|---|---|---|
| Decimal system | Binary system | Decimal system | Binary system | Difference value | Decimal system | Binary system | Difference value |
| 0 | 000000000 | 317 | 0100111101 | 2 | 706 | 1011000010 | −2 |
| 1 | 000000001 | 497 | 0111110001 | 2 | 526 | 1000001110 | −2 |
| 2 | 000000010 | 189 | 0010111101 | 2 | 834 | 1101000010 | −2 |
| 3 | 000000011 | 923 | 1110011011 | 4 | 100 | 0001100100 | −4 |
| 4 | 000000100 | 125 | 0001111101 | 2 | 898 | 1110000010 | −2 |
| 5 | 000000101 | 859 | 1101011011 | 4 | 164 | 0010100100 | −4 |
| 6 | 000000110 | 827 | 1100111011 | 4 | 196 | 0011000100 | −4 |
| 7 | 000000111 | 984 | 1111011000 | 2 | 39 | 0000100111 | −2 |
| 8 | 000001000 | 441 | 0110111001 | 2 | 582 | 1001000110 | −2 |
| 9 | 000001001 | 731 | 1011011011 | 4 | 292 | 0100100100 | −4 |
| 10 | 000001010 | 699 | 1010111011 | 4 | 324 | 0101000100 | −4 |
| 11 | 000001011 | 980 | 1111010100 | 2 | 43 | 0000101011 | −2 |
| 12 | 000001100 | 635 | 1001111011 | 4 | 388 | 0110000100 | −4 |
| 13 | 000001101 | 978 | 1111010010 | 2 | 45 | 0000101101 | −2 |
| 14 | 000001110 | 977 | 1111010001 | 2 | 46 | 0000101110 | −2 |
| 15 | 000001111 | 753 | 1011110001 | 2 | 270 | 0100001110 | −2 |
| 16 | 000010000 | 377 | 0101111001 | 2 | 646 | 1010000110 | −2 |
| 17 | 000010001 | 475 | 0111011011 | 4 | 548 | 1000100100 | −4 |
| 18 | 000010010 | 443 | 0110111011 | 4 | 580 | 1001000100 | −4 |
| 19 | 000010011 | 972 | 1111001100 | 2 | 51 | 0000110011 | −2 |
| 20 | 000010100 | 379 | 0101111011 | 4 | 644 | 1010000100 | −4 |
| 21 | 000010101 | 970 | 1111001010 | 2 | 53 | 0000110101 | −2 |
| 22 | 000010110 | 969 | 1111001001 | 2 | 54 | 0000110110 | −2 |
| 23 | 000010111 | 535 | 1000010111 | 0 | | | |
| 24 | 000011000 | 251 | 0011111011 | 4 | 772 | 1100000100 | −4 |
| 25 | 000011001 | 966 | 1111000110 | 2 | 57 | 0000111001 | −2 |
| 26 | 000011010 | 965 | 1111000101 | 2 | 58 | 0000111010 | −2 |
| 27 | 000011011 | 539 | 1000011011 | 0 | | | |
| 28 | 000011100 | 963 | 1111000011 | 2 | 60 | 0000111100 | −2 |
| 29 | 000011101 | 541 | 1000011101 | 0 | | | |
| 30 | 000011110 | 542 | 1000011110 | 0 | | | |
| 31 | 000011111 | 888 | 1101111000 | 2 | 135 | 0010000111 | −2 |

TABLE 23-continued

9B10B total codec table of an application embodiment of the present invention

| | | | | | | | |
|---|---|---|---|---|---|---|---|
| 32 | 000100000 | 249 | 0011111001 | 2 | 774 | 1100000110 | −2 |
| 33 | 000100001 | 956 | 1110111100 | 4 | 67 | 0001000011 | −4 |
| 34 | 000100010 | 954 | 1110111010 | 4 | 69 | 0001000101 | −4 |
| 35 | 000100011 | 876 | 1101101100 | 2 | 147 | 0010010011 | −2 |
| 36 | 000100100 | 950 | 1110110110 | 4 | 73 | 0001001001 | −4 |
| 37 | 000100101 | 874 | 1101101010 | 2 | 149 | 0010010101 | −2 |
| 38 | 000100110 | 873 | 1101101001 | 2 | 150 | 0010010110 | −2 |
| 39 | 000100111 | 551 | 1000100111 | 0 | | | |
| 40 | 000101000 | 947 | 1110110011 | 4 | 76 | 0001001100 | −4 |
| 41 | 000101001 | 870 | 1101100110 | 2 | 153 | 0010011001 | −2 |
| 42 | 000101010 | 869 | 1101100101 | 2 | 154 | 0010011010 | −2 |
| 43 | 000101011 | 555 | 1000101011 | 0 | | | |
| 44 | 000101100 | 867 | 1101100011 | 2 | 156 | 0010011100 | −2 |
| 45 | 000101101 | 557 | 1000101101 | 0 | | | |
| 46 | 000101110 | 558 | 1000101110 | 0 | | | |
| 47 | 000101111 | 884 | 1101110100 | 2 | 139 | 0010001011 | −2 |
| 48 | 000110000 | 926 | 1110011110 | 4 | 97 | 0001100001 | −4 |
| 49 | 000110001 | 822 | 1100110110 | 2 | 201 | 0011001001 | −2 |
| 50 | 000110010 | 821 | 1100110101 | 2 | 202 | 0011001010 | −2 |
| 51 | 000110011 | 563 | 1000110011 | 0 | | | |
| 52 | 000110100 | 819 | 1100110011 | 2 | 204 | 0011001100 | −2 |
| 53 | 000110101 | 565 | 1000110101 | 0 | | | |
| 54 | 000110110 | 566 | 1000110110 | 0 | | | |
| 55 | 000110111 | 55 | 0000110111 | 0 | | | |
| 56 | 000111000 | 795 | 1100011011 | 2 | 228 | 0011100100 | −2 |
| 57 | 000111001 | 569 | 1000111001 | 0 | | | |
| 58 | 000111010 | 570 | 1000111010 | 0 | | | |
| 59 | 000111011 | 59 | 0000111011 | 0 | | | |
| 60 | 000111100 | 572 | 1000111100 | 0 | | | |
| 61 | 000111101 | 61 | 0000111101 | 0 | | | |
| 62 | 000111110 | 62 | 0000111110 | 0 | | | |
| 63 | 000111111 | 119 | 0001110111 | 2 | 904 | 1110001000 | −2 |
| 64 | 001000000 | 413 | 0110011101 | 2 | 610 | 1001100010 | −2 |
| 65 | 001000001 | 892 | 1101111100 | 4 | 131 | 0010000011 | −4 |
| 66 | 001000010 | 890 | 1101111010 | 4 | 133 | 0010000101 | −4 |
| 67 | 001000011 | 748 | 1011101100 | 2 | 275 | 0100010011 | −2 |
| 68 | 001000100 | 886 | 1101110110 | 4 | 137 | 0010001001 | −4 |
| 69 | 001000101 | 746 | 1011101010 | 2 | 277 | 0100010101 | −2 |
| 70 | 001000110 | 745 | 1011101001 | 2 | 278 | 0100010110 | −2 |
| 71 | 001000111 | 583 | 1001000111 | 0 | | | |
| 72 | 001001000 | 883 | 1101110011 | 4 | 140 | 0010001100 | −4 |
| 73 | 001001001 | 742 | 1011100110 | 2 | 281 | 0100011001 | −2 |
| 74 | 001001010 | 741 | 1011100101 | 2 | 282 | 0100011010 | −2 |
| 75 | 001001011 | 587 | 1001001011 | 0 | | | |
| 76 | 001001100 | 739 | 1011100011 | 2 | 284 | 0100011100 | −2 |
| 77 | 001001101 | 589 | 1001001101 | 0 | | | |
| 78 | 001001110 | 590 | 1001001110 | 0 | | | |
| 79 | 001001111 | 828 | 1100111100 | 2 | 195 | 0011000011 | −2 |
| 80 | 001010000 | 862 | 1101011110 | 4 | 161 | 0010100001 | −4 |
| 81 | 001010001 | 694 | 1010110110 | 2 | 329 | 0101001001 | −2 |
| 82 | 001010010 | 693 | 1010110101 | 2 | 330 | 0101001010 | −2 |
| 83 | 001010011 | 595 | 1001010011 | 0 | | | |
| 84 | 001010100 | 691 | 1010110011 | 2 | 332 | 0101001100 | −2 |
| 85 | 001010101 | 597 | 1001010101 | 0 | | | |
| 86 | 001010110 | 598 | 1001010110 | 0 | | | |
| 87 | 001010111 | 87 | 0001010111 | 0 | | | |
| 88 | 001011000 | 667 | 1010011011 | 2 | 356 | 0101100100 | −2 |
| 89 | 001011001 | 601 | 1001011001 | 0 | | | |
| 90 | 001011010 | 602 | 1001011010 | 0 | | | |
| 91 | 001011011 | 91 | 0001011011 | 0 | | | |
| 92 | 001011100 | 604 | 1001011100 | 0 | | | |
| 93 | 001011101 | 93 | 0001011101 | 0 | | | |
| 94 | 001011110 | 94 | 0001011110 | 0 | | | |
| 95 | 001011111 | 183 | 0010110111 | 2 | 840 | 1101001000 | −2 |
| 96 | 001100000 | 830 | 1100111110 | 4 | 193 | 0011000001 | −4 |
| 97 | 001100001 | 630 | 1001110110 | 2 | 393 | 0110001001 | −2 |
| 98 | 001100010 | 629 | 1001110101 | 2 | 394 | 0110001010 | −2 |
| 99 | 001100011 | 611 | 1001100011 | 0 | | | |
| 100 | 001100100 | 627 | 1001110011 | 2 | 396 | 0110001100 | −2 |
| 101 | 001100101 | 613 | 1001100101 | 0 | | | |
| 102 | 001100110 | 614 | 1001100110 | 0 | | | |
| 103 | 001100111 | 103 | 0001100111 | 0 | | | |
| 104 | 001101000 | 603 | 1001011011 | 2 | 420 | 0110100100 | −2 |
| 105 | 001101001 | 617 | 1001101001 | 0 | | | |
| 106 | 001101010 | 618 | 1001101010 | 0 | | | |
| 107 | 001101011 | 107 | 0001101011 | 0 | | | |
| 108 | 001101100 | 620 | 1001101100 | 0 | | | |
| 109 | 001101101 | 109 | 0001101101 | 0 | | | |

TABLE 23-continued

9B10B total codec table of an application embodiment of the present invention

| | | | | | | | | |
|---|---|---|---|---|---|---|---|---|
| 110 | 001101110 | 110 | 0001101110 | 0 | | | | |
| 111 | 001101111 | 215 | 0011010111 | 2 | 808 | 1100101000 | −2 |
| 112 | 001110000 | 571 | 1000111011 | 2 | 452 | 0111000100 | −2 |
| 113 | 001110001 | 625 | 1001110001 | 0 | | | | |
| 114 | 001110010 | 626 | 1001110010 | 0 | | | | |
| 115 | 001110011 | 115 | 0001110011 | 0 | | | | |
| 116 | 001110100 | 628 | 1001110100 | 0 | | | | |
| 117 | 001110101 | 117 | 0001110101 | 0 | | | | |
| 118 | 001110110 | 118 | 0001110110 | 0 | | | | |
| 119 | 001110111 | 231 | 0011100111 | 2 | 792 | 1100011000 | −2 |
| 120 | 001111000 | 632 | 1001111000 | 0 | | | | |
| 121 | 001111001 | 121 | 0001111001 | 0 | | | | |
| 122 | 001111010 | 122 | 0001111010 | 0 | | | | |
| 123 | 001111011 | 235 | 0011101011 | 2 | 788 | 1100010100 | −2 |
| 124 | 001111100 | 124 | 0001111100 | 0 | | | | |
| 125 | 001111101 | 237 | 0011101101 | 2 | 786 | 1100010010 | −2 |
| 126 | 001111110 | 238 | 0011101110 | 2 | 785 | 1100010001 | −2 |
| 127 | 001111111 | 247 | 0011110111 | 4 | 776 | 1100001000 | −4 |
| 128 | 010000000 | 349 | 0101011101 | 2 | 674 | 1010100010 | −2 |
| 129 | 010000001 | 764 | 1011111100 | 4 | 259 | 0100000011 | −4 |
| 130 | 010000010 | 762 | 1011111010 | 4 | 261 | 0100000101 | −4 |
| 131 | 010000011 | 492 | 0111101100 | 2 | 531 | 1000010011 | −2 |
| 132 | 010000100 | 758 | 1011110110 | 4 | 265 | 0100001001 | −4 |
| 133 | 010000101 | 490 | 0111101010 | 2 | 533 | 1000010101 | −2 |
| 134 | 010000110 | 489 | 0111101001 | 2 | 534 | 1000010110 | −2 |
| 135 | 010000111 | 647 | 1010000111 | 0 | | | | |
| 136 | 010001000 | 755 | 1011110011 | 4 | 268 | 0100001100 | −4 |
| 137 | 010001001 | 486 | 0111100110 | 2 | 537 | 1000011001 | −2 |
| 138 | 010001010 | 485 | 0111100101 | 2 | 538 | 1000011010 | −2 |
| 139 | 010001011 | 651 | 1010001011 | 0 | | | | |
| 140 | 010001100 | 483 | 0111100011 | 2 | 540 | 1000011100 | −2 |
| 141 | 010001101 | 653 | 1010001101 | 0 | | | | |
| 142 | 010001110 | 654 | 1010001110 | 0 | | | | |
| 143 | 010001111 | 882 | 1101110010 | 2 | 141 | 0010001101 | −2 |
| 144 | 010010000 | 734 | 1011011110 | 4 | 289 | 0100100001 | −4 |
| 145 | 010010001 | 438 | 0110110110 | 2 | 585 | 1001001001 | −2 |
| 146 | 010010010 | 437 | 0110110101 | 2 | 586 | 1001001010 | −2 |
| 147 | 010010011 | 659 | 1010010011 | 0 | | | | |
| 148 | 010010100 | 435 | 0110110011 | 2 | 588 | 1001001100 | −2 |
| 149 | 010010101 | 661 | 1010010101 | 0 | | | | |
| 150 | 010010110 | 662 | 1010010110 | 0 | | | | |
| 151 | 010010111 | 151 | 0010010111 | 0 | | | | |
| 152 | 010011000 | 411 | 0110011011 | 2 | 612 | 1001100100 | −2 |
| 153 | 010011001 | 665 | 1010011001 | 0 | | | | |
| 154 | 010011010 | 666 | 1010011010 | 0 | | | | |
| 155 | 010011011 | 155 | 0010011011 | 0 | | | | |
| 156 | 010011100 | 668 | 1010011100 | 0 | | | | |
| 157 | 010011101 | 157 | 0010011101 | 0 | | | | |
| 158 | 010011110 | 158 | 0010011110 | 0 | | | | |
| 159 | 010011111 | 311 | 0100110111 | 2 | 712 | 1011001000 | −2 |
| 160 | 010100000 | 702 | 1010111110 | 4 | 321 | 0101000001 | −4 |
| 161 | 010100001 | 374 | 0101110110 | 2 | 649 | 1010001001 | −2 |
| 162 | 010100010 | 373 | 0101110101 | 2 | 650 | 1010001010 | −2 |
| 163 | 010100011 | 675 | 1010100011 | 0 | | | | |
| 164 | 010100100 | 371 | 0101110011 | 2 | 652 | 1010001100 | −2 |
| 165 | 010100101 | 677 | 1010100101 | 0 | | | | |
| 166 | 010100110 | 678 | 1010100110 | 0 | | | | |
| 167 | 010100111 | 167 | 0010100111 | 0 | | | | |
| 168 | 010101000 | 347 | 0101011011 | 2 | 676 | 1010100100 | −2 |
| 169 | 010101001 | 681 | 1010101001 | 0 | | | | |
| 170 | 010101010 | 682 | 1010101010 | 0 | | | | |
| 171 | 010101011 | 171 | 0010101011 | 0 | | | | |
| 172 | 010101100 | 684 | 1010101100 | 0 | | | | |
| 173 | 010101101 | 173 | 0010101101 | 0 | | | | |
| 174 | 010101110 | 174 | 0010101110 | 0 | | | | |
| 175 | 010101111 | 343 | 0101010111 | 2 | 680 | 1010101000 | −2 |
| 176 | 010110000 | 315 | 0100111011 | 2 | 708 | 1011000100 | −2 |
| 177 | 010110001 | 689 | 1010110001 | 0 | | | | |
| 178 | 010110010 | 690 | 1010110010 | 0 | | | | |
| 179 | 010110011 | 179 | 0010110011 | 0 | | | | |
| 180 | 010110100 | 692 | 1010110100 | 0 | | | | |
| 181 | 010110101 | 181 | 0010110101 | 0 | | | | |
| 182 | 010110110 | 182 | 0010110110 | 0 | | | | |
| 183 | 010110111 | 359 | 0101100111 | 2 | 664 | 1010011000 | −2 |
| 184 | 010111000 | 696 | 1010111000 | 0 | | | | |
| 185 | 010111001 | 185 | 0010111001 | 0 | | | | |
| 186 | 010111010 | 186 | 0010111010 | 0 | | | | |
| 187 | 010111011 | 363 | 0101101011 | 2 | 660 | 1010010100 | −2 |

TABLE 23-continued

9B10B total codec table of an application embodiment of the present invention

| | | | | | | | |
|---|---|---|---|---|---|---|---|
| 188 | 010111100 | 188 | 0010111100 | 0 | | | |
| 189 | 010111101 | 365 | 0101101101 | 2 | 658 | 1010010010 | −2 |
| 190 | 010111110 | 366 | 0101101110 | 2 | 657 | 1010010001 | −2 |
| 191 | 010111111 | 375 | 0101110111 | 4 | 648 | 1010001000 | −4 |
| 192 | 011000000 | 638 | 1001111110 | 4 | 385 | 0110000001 | −4 |
| 193 | 011000001 | 246 | 0011110110 | 2 | 777 | 1100001001 | −2 |
| 194 | 011000010 | 245 | 0011110101 | 2 | 778 | 1100001010 | −2 |
| 195 | 011000011 | 707 | 1011000011 | 0 | | | |
| 196 | 011000100 | 243 | 0011110011 | 2 | 780 | 1100001100 | −2 |
| 197 | 011000101 | 709 | 1011000101 | 0 | | | |
| 198 | 011000110 | 710 | 1011000110 | 0 | | | |
| 199 | 011000111 | 199 | 0011000111 | 0 | | | |
| 200 | 011001000 | 219 | 0011011011 | 2 | 804 | 1100100100 | −2 |
| 201 | 011001001 | 713 | 1011001001 | 0 | | | |
| 202 | 011001010 | 714 | 1011001010 | 0 | | | |
| 203 | 011001011 | 203 | 0011001011 | 0 | | | |
| 204 | 011001100 | 716 | 1011001100 | 0 | | | |
| 205 | 011001101 | 205 | 0011001101 | 0 | | | |
| 206 | 011001110 | 206 | 0011001110 | 0 | | | |
| 207 | 011001111 | 407 | 0110010111 | 2 | 616 | 1001101000 | −2 |
| 208 | 011010000 | 187 | 0010111011 | 2 | 836 | 1101000100 | −2 |
| 209 | 011010001 | 721 | 1011010001 | 0 | | | |
| 210 | 011010010 | 722 | 1011010010 | 0 | | | |
| 211 | 011010011 | 211 | 0011010011 | 0 | | | |
| 212 | 011010100 | 724 | 1011010100 | 0 | | | |
| 213 | 011010101 | 213 | 0011010101 | 0 | | | |
| 214 | 011010110 | 214 | 0011010110 | 0 | | | |
| 215 | 011010111 | 423 | 0110100111 | 2 | 600 | 1001011000 | −2 |
| 216 | 011011000 | 728 | 1011011000 | 0 | | | |
| 217 | 011011001 | 217 | 0011011001 | 0 | | | |
| 218 | 011011010 | 218 | 0011011010 | 0 | | | |
| 219 | 011011011 | 427 | 0110101011 | 2 | 596 | 1001010100 | −2 |
| 220 | 011011100 | 220 | 0011011100 | 0 | | | |
| 221 | 011011101 | 429 | 0110101101 | 2 | 594 | 1001010010 | −2 |
| 222 | 011011110 | 430 | 0110101110 | 2 | 593 | 1001010001 | −2 |
| 223 | 011011111 | 439 | 0110110111 | 4 | 584 | 1001001000 | −4 |
| 224 | 011100000 | 123 | 0001111011 | 2 | 900 | 1110000100 | −2 |
| 225 | 011100001 | 737 | 1011100001 | 0 | | | |
| 226 | 011100010 | 738 | 1011100010 | 0 | | | |
| 227 | 011100011 | 227 | 0011100011 | 0 | | | |
| 228 | 011100100 | 740 | 1011100100 | 0 | | | |
| 229 | 011100101 | 229 | 0011100101 | 0 | | | |
| 230 | 011100110 | 230 | 0011100110 | 0 | | | |
| 231 | 011100111 | 455 | 0111000111 | 2 | 568 | 1000111000 | −2 |
| 232 | 011101000 | 744 | 1011101000 | 0 | | | |
| 233 | 011101001 | 233 | 0011101001 | 0 | | | |
| 234 | 011101010 | 234 | 0011101010 | 0 | | | |
| 235 | 011101011 | 459 | 0111001011 | 2 | 564 | 1000110100 | −2 |
| 236 | 011101100 | 236 | 0011101100 | 0 | | | |
| 237 | 011101101 | 461 | 0111001101 | 2 | 562 | 1000110010 | −2 |
| 238 | 011101110 | 462 | 0111001110 | 2 | 561 | 1000110001 | −2 |
| 239 | 011101111 | 471 | 0111010111 | 4 | 552 | 1000101000 | −4 |
| 240 | 011110000 | 697 | 1010111001 | 2 | 326 | 0101000110 | −2 |
| 241 | 011110001 | 241 | 0011110001 | 0 | | | |
| 242 | 011110010 | 242 | 0011110010 | 0 | | | |
| 243 | 011110011 | 467 | 0111010011 | 2 | 556 | 1000101100 | −2 |
| 244 | 011110100 | 244 | 0011110100 | 0 | | | |
| 245 | 011110101 | 469 | 0111010101 | 2 | 554 | 1000101010 | −2 |
| 246 | 011110110 | 470 | 0111010110 | 2 | 553 | 1000101001 | −2 |
| 247 | 011110111 | 487 | 0111100111 | 4 | 536 | 1000011000 | −4 |
| 248 | 011111000 | 248 | 0011111000 | 0 | | | |
| 249 | 011111001 | 473 | 0111011001 | 2 | 550 | 1000100110 | −2 |
| 250 | 011111010 | 474 | 0111011010 | 2 | 549 | 1000100101 | −2 |
| 251 | 011111011 | 491 | 0111101011 | 4 | 532 | 1000010100 | −4 |
| 252 | 011111100 | 476 | 0111011100 | 2 | 547 | 1000100011 | −2 |
| 253 | 011111101 | 493 | 0111101101 | 4 | 530 | 1000010010 | −4 |
| 254 | 011111110 | 494 | 0111101110 | 4 | 529 | 1000010001 | −4 |
| 255 | 011111111 | 574 | 1000111110 | 2 | 449 | 0111000001 | −2 |
| 256 | 100000000 | 221 | 0011011101 | 2 | 802 | 1100100010 | −2 |
| 257 | 100000001 | 825 | 1100111001 | 2 | 198 | 0011000110 | −2 |
| 258 | 100000010 | 506 | 0111111010 | 4 | 517 | 1000000101 | −4 |
| 259 | 100000011 | 504 | 0111111000 | 2 | 519 | 1000000111 | −2 |
| 260 | 100000100 | 502 | 0111110110 | 4 | 521 | 1000001001 | −4 |
| 261 | 100000101 | 500 | 0111110100 | 2 | 523 | 1000001011 | −2 |
| 262 | 100000110 | 498 | 0111110010 | 2 | 525 | 1000001101 | −2 |
| 263 | 100000111 | 775 | 1100000111 | 0 | | | |
| 264 | 100001000 | 499 | 0111110011 | 4 | 524 | 1000001100 | −4 |
| 265 | 100001001 | 444 | 0110111100 | 2 | 579 | 1001000011 | −2 |

TABLE 23-continued

| 9B10B total codec table of an application embodiment of the present invention |
|---|

| | | | | | | | |
|---|---|---|---|---|---|---|---|
| 266 | 100001010 | 442 | 0110111010 | 2 | 581 | 1001000101 | −2 |
| 267 | 100001011 | 779 | 1100001011 | 0 | | | |
| 268 | 100001100 | 414 | 0110011110 | 2 | 609 | 1001100001 | −2 |
| 269 | 100001101 | 781 | 1100001101 | 0 | | | |
| 270 | 100001110 | 782 | 1100001110 | 0 | | | |
| 271 | 100001111 | 826 | 1100111010 | 2 | 197 | 0011000101 | −2 |
| 272 | 100010000 | 478 | 0111011110 | 4 | 545 | 1000100001 | −4 |
| 273 | 100010001 | 380 | 0101111100 | 2 | 643 | 1010000011 | −2 |
| 274 | 100010010 | 378 | 0101111010 | 2 | 645 | 1010000101 | −2 |
| 275 | 100010011 | 787 | 1100010011 | 0 | | | |
| 276 | 100010100 | 350 | 0101011110 | 2 | 673 | 1010100001 | −2 |
| 277 | 100010101 | 789 | 1100010101 | 0 | | | |
| 278 | 100010110 | 790 | 1100010110 | 0 | | | |
| 279 | 100010111 | 279 | 0100010111 | 0 | | | |
| 280 | 100011000 | 318 | 0100111110 | 2 | 705 | 1011000001 | −2 |
| 281 | 100011001 | 793 | 1100011001 | 0 | | | |
| 282 | 100011010 | 794 | 1100011010 | 0 | | | |
| 283 | 100011011 | 283 | 0100011011 | 0 | | | |
| 284 | 100011100 | 796 | 1100011100 | 0 | | | |
| 285 | 100011101 | 285 | 0100011101 | 0 | | | |
| 286 | 100011110 | 286 | 0100011110 | 0 | | | |
| 287 | 100011111 | 567 | 1000110111 | 2 | 456 | 0111001000 | −2 |
| 288 | 100100000 | 446 | 0110111110 | 4 | 577 | 1001000001 | −4 |
| 289 | 100100001 | 252 | 0011111100 | 2 | 771 | 1100000011 | −2 |
| 290 | 100100010 | 250 | 0011111010 | 2 | 773 | 1100000101 | −2 |
| 291 | 100100011 | 803 | 1100100011 | 0 | | | |
| 292 | 100100100 | 222 | 0011011110 | 2 | 801 | 1100100001 | −2 |
| 293 | 100100101 | 805 | 1100100101 | 0 | | | |
| 294 | 100100110 | 806 | 1100100110 | 0 | | | |
| 295 | 100100111 | 295 | 0100100111 | 0 | | | |
| 296 | 100101000 | 190 | 0010111110 | 2 | 833 | 1101000001 | −2 |
| 297 | 100101001 | 809 | 1100101001 | 0 | | | |
| 298 | 100101010 | 810 | 1100101010 | 0 | | | |
| 299 | 100101011 | 299 | 0100101011 | 0 | | | |
| 300 | 100101100 | 812 | 1100101100 | 0 | | | |
| 301 | 100101101 | 301 | 0100101101 | 0 | | | |
| 302 | 100101110 | 302 | 0100101110 | 0 | | | |
| 303 | 100101111 | 599 | 1001010111 | 2 | 424 | 0110101000 | −2 |
| 304 | 100110000 | 126 | 0001111110 | 2 | 897 | 1110000001 | −2 |
| 305 | 100110001 | 817 | 1100110001 | 0 | | | |
| 306 | 100110010 | 818 | 1100110010 | 0 | | | |
| 307 | 100110011 | 307 | 0100110011 | 0 | | | |
| 308 | 100110100 | 820 | 1100110100 | 0 | | | |
| 309 | 100110101 | 309 | 0100110101 | 0 | | | |
| 310 | 100110110 | 310 | 0100110110 | 0 | | | |
| 311 | 100110111 | 615 | 1001100111 | 2 | 408 | 0110011000 | −2 |
| 312 | 100111000 | 824 | 1100111000 | 0 | | | |
| 313 | 100111001 | 313 | 0100111001 | 0 | | | |
| 314 | 100111010 | 314 | 0100111010 | 0 | | | |
| 315 | 100111011 | 619 | 1001101011 | 2 | 404 | 0110010100 | −2 |
| 316 | 100111100 | 316 | 0100111100 | 0 | | | |
| 317 | 100111101 | 621 | 1001101101 | 2 | 402 | 0110010010 | −2 |
| 318 | 100111110 | 622 | 1001101110 | 2 | 401 | 0110010001 | −2 |
| 319 | 100111111 | 631 | 1001110111 | 4 | 392 | 0110001000 | −4 |
| 320 | 101000000 | 382 | 0101111110 | 4 | 641 | 1010000001 | −4 |
| 321 | 101000001 | 761 | 1011111001 | 4 | 262 | 0100000110 | −4 |
| 322 | 101000010 | 757 | 1011110101 | 4 | 266 | 0100001010 | −4 |
| 323 | 101000011 | 835 | 1101000011 | 0 | | | |
| 324 | 101000100 | 733 | 1011011101 | 4 | 290 | 0100100010 | −4 |
| 325 | 101000101 | 837 | 1101000101 | 0 | | | |
| 326 | 101000110 | 838 | 1101000110 | 0 | | | |
| 327 | 101000111 | 327 | 0101000111 | 0 | | | |
| 328 | 101001000 | 701 | 1010111101 | 4 | 322 | 0101000010 | −4 |
| 329 | 101001001 | 841 | 1101001001 | 0 | | | |
| 330 | 101001010 | 842 | 1101001010 | 0 | | | |
| 331 | 101001011 | 331 | 0101001011 | 0 | | | |
| 332 | 101001100 | 844 | 1101001100 | 0 | | | |
| 333 | 101001101 | 333 | 0101001101 | 0 | | | |
| 334 | 101001110 | 334 | 0101001110 | 0 | | | |
| 335 | 101001111 | 663 | 1010010111 | 2 | 360 | 0101101000 | −2 |
| 336 | 101010000 | 637 | 1001111101 | 4 | 386 | 0110000010 | −4 |
| 337 | 101010001 | 849 | 1101010001 | 0 | | | |
| 338 | 101010010 | 850 | 1101010010 | 0 | | | |
| 339 | 101010011 | 339 | 0101010011 | 0 | | | |
| 340 | 101010100 | 852 | 1101010100 | 0 | | | |
| 341 | 101010101 | 341 | 0101010101 | 0 | | | |
| 342 | 101010110 | 342 | 0101010110 | 0 | | | |
| 343 | 101010111 | 679 | 1010100111 | 2 | 344 | 0101011000 | −2 |

TABLE 23-continued

9B10B total codec table of an application embodiment of the present invention

| | | | | | | | |
|---|---|---|---|---|---|---|---|
| 344 | 101011000 | 856 | 1101011000 | 0 | | | |
| 345 | 101011001 | 345 | 0101011001 | 0 | | | |
| 346 | 101011010 | 346 | 0101011010 | 0 | | | |
| 347 | 101011011 | 683 | 1010101011 | 2 | 340 | 0101010100 | −2 |
| 348 | 101011100 | 348 | 0101011100 | 0 | | | |
| 349 | 101011101 | 685 | 1010101101 | 2 | 338 | 0101010010 | −2 |
| 350 | 101011110 | 686 | 1010101110 | 2 | 337 | 0101010001 | −2 |
| 351 | 101011111 | 695 | 1010110111 | 4 | 328 | 0101001000 | −4 |
| 352 | 101100000 | 925 | 1110011101 | 4 | 98 | 0001100010 | −4 |
| 353 | 101100001 | 865 | 1101100001 | 0 | | | |
| 354 | 101100010 | 866 | 1101100010 | 0 | | | |
| 355 | 101100011 | 355 | 0101100011 | 0 | | | |
| 356 | 101100100 | 868 | 1101100100 | 0 | | | |
| 357 | 101100101 | 357 | 0101100101 | 0 | | | |
| 358 | 101100110 | 358 | 0101100110 | 0 | | | |
| 359 | 101100111 | 711 | 1011000111 | 2 | 312 | 0100111000 | −2 |
| 360 | 101101000 | 872 | 1101101000 | 0 | | | |
| 361 | 101101001 | 361 | 0101101001 | 0 | | | |
| 362 | 101101010 | 362 | 0101101010 | 0 | | | |
| 363 | 101101011 | 715 | 1011001011 | 2 | 308 | 0100110100 | −2 |
| 364 | 101101100 | 364 | 0101101100 | 0 | | | |
| 365 | 101101101 | 717 | 1011001101 | 2 | 306 | 0100110010 | −2 |
| 366 | 101101110 | 718 | 1011001110 | 2 | 305 | 0100110001 | −2 |
| 367 | 101101111 | 727 | 1011010111 | 4 | 296 | 0100101000 | −4 |
| 368 | 101110000 | 669 | 1010011101 | 2 | 354 | 0101100010 | −2 |
| 369 | 101110001 | 369 | 0101110001 | 0 | | | |
| 370 | 101110010 | 370 | 0101110010 | 0 | | | |
| 371 | 101110011 | 723 | 1011010011 | 2 | 300 | 0100101100 | −2 |
| 372 | 101110100 | 372 | 0101110100 | 0 | | | |
| 373 | 101110101 | 725 | 1011010101 | 2 | 298 | 0100101010 | −2 |
| 374 | 101110110 | 726 | 1011010110 | 2 | 297 | 0100101001 | −2 |
| 375 | 101110111 | 743 | 1011100111 | 4 | 280 | 0100011000 | −4 |
| 376 | 101111000 | 376 | 0101111000 | 0 | | | |
| 377 | 101111001 | 729 | 1011011001 | 2 | 294 | 0100100110 | −2 |
| 378 | 101111010 | 730 | 1011011010 | 2 | 293 | 0100100101 | −2 |
| 379 | 101111011 | 747 | 1011101011 | 4 | 276 | 0100010100 | −4 |
| 380 | 101111100 | 732 | 1011011100 | 2 | 291 | 0100100011 | −2 |
| 381 | 101111101 | 749 | 1011101101 | 4 | 274 | 0100010010 | −4 |
| 382 | 101111110 | 750 | 1011101110 | 4 | 273 | 0100010001 | −4 |
| 383 | 101111111 | 606 | 1001011110 | 2 | 417 | 0110100001 | −2 |
| 384 | 110000000 | 797 | 1100011101 | 2 | 226 | 0011100010 | −2 |
| 385 | 110000001 | 505 | 0111111001 | 4 | 518 | 1000000110 | −4 |
| 386 | 110000010 | 501 | 0111110101 | 4 | 522 | 1000001010 | −4 |
| 387 | 110000011 | 899 | 1110000011 | 0 | | | |
| 388 | 110000100 | 477 | 0111011101 | 4 | 546 | 1000100010 | −4 |
| 389 | 110000101 | 901 | 1110000101 | 0 | | | |
| 390 | 110000110 | 902 | 1110000110 | 0 | | | |
| 391 | 110000111 | 391 | 0110000111 | 0 | | | |
| 392 | 110001000 | 445 | 0110111101 | 4 | 578 | 1001000010 | −4 |
| 393 | 110001001 | 905 | 1110001001 | 0 | | | |
| 394 | 110001010 | 906 | 1110001010 | 0 | | | |
| 395 | 110001011 | 395 | 0110001011 | 0 | | | |
| 396 | 110001100 | 908 | 1110001100 | 0 | | | |
| 397 | 110001101 | 397 | 0110001101 | 0 | | | |
| 398 | 110001110 | 398 | 0110001110 | 0 | | | |
| 399 | 110001111 | 791 | 1100010111 | 2 | 232 | 0011101000 | −2 |
| 400 | 110010000 | 381 | 0101111101 | 4 | 642 | 1010000010 | −4 |
| 401 | 110010001 | 913 | 1110010001 | 0 | | | |
| 402 | 110010010 | 914 | 1110010010 | 0 | | | |
| 403 | 110010011 | 403 | 0110010011 | 0 | | | |
| 404 | 110010100 | 916 | 1110010100 | 0 | | | |
| 405 | 110010101 | 405 | 0110010101 | 0 | | | |
| 406 | 110010110 | 406 | 0110010110 | 0 | | | |
| 407 | 110010111 | 807 | 1100100111 | 2 | 216 | 0011011000 | −2 |
| 408 | 110011000 | 920 | 1110011000 | 0 | | | |
| 409 | 110011001 | 409 | 0110011001 | 0 | | | |
| 410 | 110011010 | 410 | 0110011010 | 0 | | | |
| 411 | 110011011 | 811 | 1100101011 | 2 | 212 | 0011010100 | −2 |
| 412 | 110011100 | 412 | 0110011100 | 0 | | | |
| 413 | 110011101 | 813 | 1100101101 | 2 | 210 | 0011010010 | −2 |
| 414 | 110011110 | 814 | 1100101110 | 2 | 209 | 0011010001 | −2 |
| 415 | 110011111 | 823 | 1100110111 | 4 | 200 | 0011001000 | −4 |
| 416 | 110100000 | 253 | 0011111101 | 4 | 770 | 1100000010 | −4 |
| 417 | 110100001 | 929 | 1110100001 | 0 | | | |
| 418 | 110100010 | 930 | 1110100010 | 0 | | | |
| 419 | 110100011 | 419 | 0110100011 | 0 | | | |
| 420 | 110100100 | 932 | 1110100100 | 0 | | | |
| 421 | 110100101 | 421 | 0110100101 | 0 | | | |

TABLE 23-continued

9B10B total codec table of an application embodiment of the present invention

| | | | | | | | |
|---|---|---|---|---|---|---|---|
| 422 | 110100110 | 422 | 0110100110 | 0 | | | |
| 423 | 110100111 | 839 | 1101000111 | 2 | 184 | 0010111000 | −2 |
| 424 | 110101000 | 936 | 1110101000 | 0 | | | |
| 425 | 110101001 | 425 | 0110101001 | 0 | | | |
| 426 | 110101010 | 426 | 0110101010 | 0 | | | |
| 427 | 110101011 | 843 | 1101001011 | 2 | 180 | 0010110100 | −2 |
| 428 | 110101100 | 428 | 0110101100 | 0 | | | |
| 429 | 110101101 | 845 | 1101001101 | 2 | 178 | 0010110010 | −2 |
| 430 | 110101110 | 846 | 1101001110 | 2 | 177 | 0010110001 | −2 |
| 431 | 110101111 | 855 | 1101010111 | 4 | 168 | 0010101000 | −4 |
| 432 | 110110000 | 633 | 1001111001 | 2 | 390 | 0110000110 | −2 |
| 433 | 110110001 | 433 | 0110110001 | 0 | | | |
| 434 | 110110010 | 434 | 0110110010 | 0 | | | |
| 435 | 110110011 | 851 | 1101010011 | 2 | 172 | 0010101100 | −2 |
| 436 | 110110100 | 436 | 0110110100 | 0 | | | |
| 437 | 110110101 | 853 | 1101010101 | 2 | 170 | 0010101010 | −2 |
| 438 | 110110110 | 854 | 1101010110 | 2 | 169 | 0010101001 | −2 |
| 439 | 110110111 | 871 | 1101100111 | 4 | 152 | 0010011000 | −4 |
| 440 | 110111000 | 440 | 0110111000 | 0 | | | |
| 441 | 110111001 | 857 | 1101011001 | 2 | 166 | 0010100110 | −2 |
| 442 | 110111010 | 858 | 1101011010 | 2 | 165 | 0010100101 | −2 |
| 443 | 110111011 | 875 | 1101101011 | 4 | 148 | 0010010100 | −4 |
| 444 | 110111100 | 860 | 1101011100 | 2 | 163 | 0010100011 | −2 |
| 445 | 110111101 | 877 | 1101101101 | 4 | 146 | 0010010010 | −4 |
| 446 | 110111110 | 878 | 1101101110 | 4 | 145 | 0010010001 | −4 |
| 447 | 110111111 | 636 | 1001111100 | 2 | 387 | 0110000011 | −2 |
| 448 | 111000000 | 861 | 1101011101 | 4 | 162 | 0010100010 | −4 |
| 449 | 111000001 | 961 | 1111000001 | 0 | | | |
| 450 | 111000010 | 962 | 1111000010 | 0 | | | |
| 451 | 111000011 | 451 | 0111000011 | 0 | | | |
| 452 | 111000100 | 964 | 1111000100 | 0 | | | |
| 453 | 111000101 | 453 | 0111000101 | 0 | | | |
| 454 | 111000110 | 454 | 0111000110 | 0 | | | |
| 455 | 111000111 | 903 | 1110000111 | 2 | 120 | 0001111000 | −2 |
| 456 | 111001000 | 968 | 1111001000 | 0 | | | |
| 457 | 111001001 | 457 | 0111001001 | 0 | | | |
| 458 | 111001010 | 458 | 0111001010 | 0 | | | |
| 459 | 111001011 | 907 | 1110001011 | 2 | 116 | 0001110100 | −2 |
| 460 | 111001100 | 460 | 0111001100 | 0 | | | |
| 461 | 111001101 | 909 | 1110001101 | 2 | 114 | 0001110010 | −2 |
| 462 | 111001110 | 910 | 1110001110 | 2 | 113 | 0001110001 | −2 |
| 463 | 111001111 | 919 | 1110010111 | 4 | 104 | 0001101000 | −4 |
| 464 | 111010000 | 605 | 1001011101 | 2 | 418 | 0110100010 | −2 |
| 465 | 111010001 | 465 | 0111010001 | 0 | | | |
| 466 | 111010010 | 466 | 0111010010 | 0 | | | |
| 467 | 111010011 | 915 | 1110010011 | 2 | 108 | 0001101100 | −2 |
| 468 | 111010100 | 468 | 0111010100 | 0 | | | |
| 469 | 111010101 | 917 | 1110010101 | 2 | 106 | 0001101010 | −2 |
| 470 | 111010110 | 918 | 1110010110 | 2 | 105 | 0001101001 | −2 |
| 471 | 111010111 | 935 | 1110100111 | 4 | 88 | 0001011000 | −4 |
| 472 | 111011000 | 472 | 0111011000 | 0 | | | |
| 473 | 111011001 | 921 | 1110011001 | 2 | 102 | 0001100110 | −2 |
| 474 | 111011010 | 922 | 1110011010 | 2 | 101 | 0001100101 | −2 |
| 475 | 111011011 | 939 | 1110101011 | 4 | 84 | 0001010100 | −4 |
| 476 | 111011100 | 924 | 1110011100 | 2 | 99 | 0001100011 | −2 |
| 477 | 111011101 | 941 | 1110101101 | 4 | 82 | 0001010010 | −4 |
| 478 | 111011110 | 942 | 1110101110 | 4 | 81 | 0001010001 | −4 |
| 479 | 111011111 | 700 | 1010111100 | 2 | 323 | 0101000011 | −2 |
| 480 | 111100000 | 573 | 1000111101 | 2 | 450 | 0111000010 | −2 |
| 481 | 111100001 | 481 | 0111100001 | 0 | | | |
| 482 | 111100010 | 482 | 0111100010 | 0 | | | |
| 483 | 111100011 | 931 | 1110100011 | 2 | 92 | 0001011100 | −2 |
| 484 | 111100100 | 484 | 0111100100 | 0 | | | |
| 485 | 111100101 | 933 | 1110100101 | 2 | 90 | 0001011010 | −2 |
| 486 | 111100110 | 934 | 1110100110 | 2 | 89 | 0001011001 | −2 |
| 487 | 111100111 | 967 | 1111000111 | 4 | 56 | 0000111000 | −4 |
| 488 | 111101000 | 488 | 0111101000 | 0 | | | |
| 489 | 111101001 | 937 | 1110101001 | 2 | 86 | 0001010110 | −2 |
| 490 | 111101010 | 938 | 1110101010 | 2 | 85 | 0001010101 | −2 |
| 491 | 111101011 | 971 | 1111001011 | 4 | 52 | 0000110100 | −4 |
| 492 | 111101100 | 940 | 1110101100 | 2 | 83 | 0001010011 | −2 |
| 493 | 111101101 | 973 | 1111001101 | 4 | 50 | 0000110010 | −4 |
| 494 | 111101110 | 974 | 1111001110 | 4 | 49 | 0000110001 | −4 |
| 495 | 111101111 | 634 | 1001111010 | 2 | 389 | 0110000101 | −2 |
| 496 | 111110000 | 798 | 1100011110 | 2 | 225 | 0011100001 | −2 |
| 497 | 111110001 | 945 | 1110110001 | 2 | 78 | 0001001110 | −2 |
| 498 | 111110010 | 946 | 1110110010 | 2 | 77 | 0001001101 | −2 |
| 499 | 111110011 | 979 | 1111010011 | 4 | 44 | 0000101100 | −4 |

TABLE 23-continued

9B10B total codec table of an application embodiment of the present invention

| 500 | 111110100 | 948 | 1110110100 | 2 | 75  | 0001001011 | -2 |
| 501 | 111110101 | 981 | 1111010101 | 4 | 42  | 0000101010 | -4 |
| 502 | 111110110 | 982 | 1111010110 | 4 | 41  | 0000101001 | -4 |
| 503 | 111110111 | 698 | 1010111010 | 2 | 325 | 0101000101 | -2 |
| 504 | 111111000 | 952 | 1110111000 | 2 | 71  | 0001000111 | -2 |
| 505 | 111111001 | 985 | 1111011001 | 4 | 38  | 0000100110 | -4 |
| 506 | 111111010 | 986 | 1111011010 | 4 | 37  | 0000100101 | -4 |
| 507 | 111111011 | 756 | 1011110100 | 2 | 267 | 0100001011 | -2 |
| 508 | 111111100 | 988 | 1111011100 | 4 | 35  | 0000100011 | -4 |
| 509 | 111111101 | 760 | 1011111000 | 2 | 263 | 0100000111 | -2 |
| 510 | 111111110 | 754 | 1011110010 | 2 | 269 | 0100001101 | -2 |
| 511 | 111111111 | 670 | 1010011110 | 2 | 353 | 0101100001 | -2 |

Control character coding

| Control character | 10B (The difference value is positive) | | | 10B (The difference value is negative) | | |
| --- | --- | --- | --- | --- | --- | --- |
| | decimal system | binary system | Difference value | decimal system | binary system | Difference value |
| Control character 1 | 254 | 0011111110 | 4 | 769 | 1100000001 | -4 |
| Control character 2 | 508 | 0111111100 | 4 | 515 | 1000000011 | -4 |
| Control character 3 | 889 | 1101111001 | 4 | 134 | 0010000110 | -4 |
| Control character 4 | 885 | 1101110101 | 4 | 138 | 0010001010 | -4 |
| Control character 5 | 881 | 1101110001 | 2 | 142 | 0010001110 | -2 |
| Control character 6 | 829 | 1100111101 | 4 | 194 | 0011000010 | -4 |
| Control character 7 | 953 | 1110111001 | 4 | 70  | 0001000110 | -4 |
| Control character 8 | 949 | 1110110101 | 4 | 74  | 0001001010 | -4 |

In another application embodiment of the present invention, the total codec table of 9B10B is shown in Table 24.

Compared with the embodiment shown in Table 23, in the embodiment shown in Table 24, the 9-bit source sequence set further comprises the first type of 9-bit source sequence set, the second type of 9-bit source sequence set and the third type of 9-bit source sequence set. The three types of 9-bit source sequence sets are disjoint, and a unified set of the three types of 9-bit source sequence sets has 512 non-repetitive 9-bit source sequences.

The first type of 9-bit source sequence set only comprises 9-bit source sequences with difference values of 1 and −1, and each 9-bit source sequence in the first type of 9-bit source sequence set is encoded into a 10-bit target balanced sequence after inserting 1-bit data "0" or "1" at the same position.

The second type of 9-bit source sequence set alternatively only comprises 9-bit source sequences with a difference value of 3 or 9-bit source sequences with a difference value of −3.

If the second type of 9-bit source sequence set only comprises 9-bit source sequences with a difference value of 3, 1-bit data "0" is inserted into the 9-bit source sequence, and the formed 10-bit target sequence and an opposite number thereof form a pair of 10-bit target unbalanced sequences with a difference value of ±2, which are codes of the 9-bit source sequence with a difference value of 3.

If the second type of 9-bit source sequence set only comprises 9-bit source sequences with a difference value of −3, insert 1-bit data into the 9-bit source sequence, and the formed 10-bit target sequence and an opposite number thereof form a pair of 10-bit target unbalanced sequences with a difference value of ±2, which are codes of the 9-bit source sequence with a difference value of −3.

The third type of 9-bit source sequence set comprises a third type of 9-bit source sequence subset A and a third type of 9-bit source sequence subset B, which are disjoint, and the unified set of the third type of 9-bit source sequence subset A and the third type of 9-bit source sequence subset B is the third type of 9-bit source sequence set.

Each 9-bit source sequence comprised in the third 9-bit source sequence subset A is encoded into a 10-bit target balanced sequence.

Each 9-bit source sequence comprised in the third type of 9-bit source sequence subset B is encoded into a pair of 10-bit target unbalanced sequences that are opposite numbers for each other.

Different from the embodiment shown in Table 23, in the embodiment shown in Table 24, the first type of 9-bit source sequence set does not comprise 9-bit source sequences "01111000" and "100000111", the third type of 9-bit source sequence subset A comprises 9-bit source sequences "00000000" and "1111111"; the third type of 9-bit source sequence subset B includes the sixth type of 9-bit source sequence set and the seventh type of 9-bit source sequence set, which are disjoint, and the set of the sixth type of 9-bit source sequence set and the seventh type of 9-bit source sequence set is the third type of 9-bit source sequence subset B.

Different from the fifth type of 9-bit source sequence set in the embodiment shown in Table 23, the seventh type of 9-bit source sequence set in the embodiment shown in Table 24 comprises 9-bit source sequences "011111000" and "100000111", but does not comprise 9-bit source sequences "000000000" and "1111111".

The second type of 9-bit source sequence set in the embodiment shown in Table 24 is the same as the 9-bit source sequence set in the embodiment shown in Table 23.

The sixth type of 9-bit source sequence set in the embodiment shown in Table 24 is the same as the fourth type of 9-bit source sequence set in the embodiment shown in Table 23.

In the embodiment shown in Table 24, 9-bit source sequences "00000000" and "11111111" are encoded into 10-bit target balance sequences "001111000" and "1100000111" respectively; the 9-bit source sequences "011111000" and "10000111" corresponding to the two 10-bit target balanced sequences in Table 23 are respectively encoded as the 10-bit target unbalanced sequence "010011101" and its opposite number, and "101001110" and its inverse in the embodiment shown in Table 24.

In the data transmission system, the output of the system in the reset state or low power consumption mode is often fixed data "0" or "1". For the 9B10B coding module, the input data at this time is 9-bit source sequence "00000000" or "11111111". If it is coded into a pair of 10-bit target unbalanced sequences, the 9B10B coding module will select the 10-bit target unbalanced sequences according to the operation difference. The two 10-bit target unbalanced sequences are alternately output, which will increase the system power consumption and is not conducive to resolving the 9-bit source sequence "000000000" or "11111111" from the output coded data. The 9-bit source sequence "000000000" or "11111111" is encoded into the above-mentioned 10-bit target balanced sequence, and the output of the 9B10B encoding module is a fixed 10-bit data. If it is transmitted in the form of serial data, it will be alternately five zeros and five ones, which can be regarded as a low-speed clock signal, because the signal inversion frequency is reduced, which is beneficial to reducing the reset state or.

The third type of 9-bit source sequence subset A may further comprise 9-bit source sequences other than "00000000" and "11111111" or other 9-bit source sequences but not "000000000" and "1111111" as required.

TABLE 24

Total encoding and decoding table of 9B10B according to another application embodiment of the present invention

| | | 9-bit source sequence set coding | | | | | |
|---|---|---|---|---|---|---|---|
| | | 10B (The difference value is positive or 0) | | | 10B (The difference value is negative) | | |
| Decimal system | Binary system | Decimal system | Binary system | Difference value | Decimal system | Binary system | Difference value |
| 0 | 000000000 | 248 | 0011111000 | 0 | | | |
| 1 | 000000001 | 497 | 0111110001 | 2 | 526 | 1000001110 | −2 |
| 2 | 000000010 | 189 | 0010111101 | 2 | 834 | 1101000010 | −2 |
| 3 | 000000011 | 923 | 1110011011 | 4 | 100 | 0001100100 | −4 |
| 4 | 000000100 | 125 | 0001111101 | 2 | 898 | 1110000010 | −2 |
| 5 | 000000101 | 859 | 1101011011 | 4 | 164 | 0010100100 | −4 |
| 6 | 000000110 | 827 | 1100111011 | 4 | 196 | 0011000100 | −4 |
| 7 | 000000111 | 984 | 1111011000 | 2 | 39 | 0000100111 | −2 |
| 8 | 000001000 | 441 | 0110111001 | 2 | 582 | 1001000110 | −2 |
| 9 | 000001001 | 731 | 1011011011 | 4 | 292 | 0100100100 | −4 |
| 10 | 000001010 | 699 | 1010111011 | 4 | 324 | 0101000100 | −4 |
| 11 | 000001011 | 980 | 1111010100 | 2 | 43 | 0000101011 | −2 |
| 12 | 000001100 | 635 | 1001111011 | 4 | 388 | 0110000100 | −4 |
| 13 | 000001101 | 978 | 1111010010 | 2 | 45 | 0000101101 | −2 |
| 14 | 000001110 | 977 | 1111010001 | 2 | 46 | 0000101110 | −2 |
| 15 | 000001111 | 753 | 1011110001 | 2 | 270 | 0100001110 | −2 |
| 16 | 000010000 | 377 | 0101111001 | 2 | 646 | 1010000110 | −2 |
| 17 | 000010001 | 475 | 0111011011 | 4 | 548 | 1000100100 | −4 |
| 18 | 000010010 | 443 | 0110111011 | 4 | 580 | 1001000100 | −4 |
| 19 | 000010011 | 972 | 1111001100 | 2 | 51 | 0000110011 | −2 |
| 20 | 000010100 | 379 | 0101111011 | 4 | 644 | 1010000100 | −4 |
| 21 | 000010101 | 970 | 1111001010 | 2 | 53 | 0000110101 | −2 |
| 22 | 000010110 | 969 | 1111001001 | 2 | 54 | 0000110110 | −2 |
| 23 | 000010111 | 535 | 1000010111 | 0 | | | |
| 24 | 000011000 | 251 | 0011111011 | 4 | 772 | 1100000100 | −4 |
| 25 | 000011001 | 966 | 1111000110 | 2 | 57 | 0000111001 | −2 |
| 26 | 000011010 | 965 | 1111000101 | 2 | 58 | 0000111010 | −2 |
| 27 | 000011011 | 539 | 1000011011 | 0 | | | |
| 28 | 000011100 | 963 | 1111000011 | 2 | 60 | 0000111100 | −2 |
| 29 | 000011101 | 541 | 1000011101 | 0 | | | |
| 30 | 000011110 | 542 | 1000011110 | 0 | | | |
| 31 | 000011111 | 888 | 1101111000 | 2 | 135 | 0010000111 | −2 |
| 32 | 000100000 | 249 | 0011111001 | 2 | 774 | 1100000110 | −2 |
| 33 | 000100001 | 956 | 1110111100 | 4 | 67 | 0001000011 | −4 |
| 34 | 000100010 | 954 | 1110111010 | 4 | 69 | 0001000101 | −4 |
| 35 | 000100011 | 876 | 1101101100 | 2 | 147 | 0010010011 | −2 |
| 36 | 000100100 | 950 | 1110110110 | 4 | 73 | 0001001001 | −4 |
| 37 | 000100101 | 874 | 1101101010 | 2 | 149 | 0010010101 | −2 |
| 38 | 000100110 | 873 | 1101101001 | 2 | 150 | 0010010110 | −2 |
| 39 | 000100111 | 551 | 1000100111 | 0 | | | |
| 40 | 000101000 | 947 | 1110110011 | 4 | 76 | 0001001100 | −4 |
| 41 | 000101001 | 870 | 1101100110 | 2 | 153 | 0010011001 | −2 |
| 42 | 000101010 | 869 | 1101100101 | 2 | 154 | 0010011010 | −2 |
| 43 | 000101011 | 555 | 1000101011 | 0 | | | |
| 44 | 000101100 | 867 | 1101100011 | 2 | 156 | 0010011100 | −2 |
| 45 | 000101101 | 557 | 1000101101 | 0 | | | |
| 46 | 000101110 | 558 | 1000101110 | 0 | | | |

TABLE 24-continued

Total encoding and decoding table of 9B10B according to
another application embodiment of the present invention

| | | | | | | | |
|---|---|---|---|---|---|---|---|
| 47 | 000101111 | 884 | 1101110100 | 2 | 139 | 0010001011 | −2 |
| 48 | 000110000 | 926 | 1110011110 | 4 | 97 | 0001100001 | −4 |
| 49 | 000110001 | 822 | 1100110110 | 2 | 201 | 0011001001 | −2 |
| 50 | 000110010 | 821 | 1100110101 | 2 | 202 | 0011001010 | −2 |
| 51 | 000110011 | 563 | 1000110011 | 0 | | | |
| 52 | 000110100 | 819 | 1100110011 | 2 | 204 | 0011001100 | −2 |
| 53 | 000110101 | 565 | 1000110101 | 0 | | | |
| 54 | 000110110 | 566 | 1000110110 | 0 | | | |
| 55 | 000110111 | 55 | 0000110111 | 0 | | | |
| 56 | 000111000 | 795 | 1100011011 | 2 | 228 | 0011100100 | −2 |
| 57 | 000111001 | 569 | 1000111001 | 0 | | | |
| 58 | 000111010 | 570 | 1000111010 | 0 | | | |
| 59 | 000111011 | 59 | 0000111011 | 0 | | | |
| 60 | 000111100 | 572 | 1000111100 | 0 | | | |
| 61 | 000111101 | 61 | 0000111101 | 0 | | | |
| 62 | 000111110 | 62 | 0000111110 | 0 | | | |
| 63 | 000111111 | 119 | 0001110111 | 2 | 904 | 1110001000 | −2 |
| 64 | 001000000 | 413 | 0110011101 | 2 | 610 | 1001100010 | −2 |
| 65 | 001000001 | 892 | 1101111100 | 4 | 131 | 0010000011 | −4 |
| 66 | 001000010 | 890 | 1101111010 | 4 | 133 | 0010000101 | −4 |
| 67 | 001000011 | 748 | 1011101100 | 2 | 275 | 0100010011 | −2 |
| 68 | 001000100 | 886 | 1101110110 | 4 | 137 | 0010001001 | −4 |
| 69 | 001000101 | 746 | 1011101010 | 2 | 277 | 0100010101 | −2 |
| 70 | 001000110 | 745 | 1011101001 | 2 | 278 | 0100010110 | −2 |
| 71 | 001000111 | 583 | 1001000111 | 0 | | | |
| 72 | 001001000 | 883 | 1101110011 | 4 | 140 | 0010001100 | −4 |
| 73 | 001001001 | 742 | 1011100110 | 2 | 281 | 0100011001 | −2 |
| 74 | 001001010 | 741 | 1011100101 | 2 | 282 | 0100011010 | −2 |
| 75 | 001001011 | 587 | 1001001011 | 0 | | | |
| 76 | 001001100 | 739 | 1011100011 | 2 | 284 | 0100011100 | −2 |
| 77 | 001001101 | 589 | 1001001101 | 0 | | | |
| 78 | 001001110 | 590 | 1001001110 | 0 | | | |
| 79 | 001001111 | 828 | 1100111100 | 2 | 195 | 0011000011 | −2 |
| 80 | 001010000 | 862 | 1101011110 | 4 | 161 | 0010100001 | −4 |
| 81 | 001010001 | 694 | 1010110110 | 2 | 329 | 0101001001 | −2 |
| 82 | 001010010 | 693 | 1010110101 | 2 | 330 | 0101001010 | −2 |
| 83 | 001010011 | 595 | 1001010011 | 0 | | | |
| 84 | 001010100 | 691 | 1010110011 | 2 | 332 | 0101001100 | −2 |
| 85 | 001010101 | 597 | 1001010101 | 0 | | | |
| 86 | 001010110 | 598 | 1001010110 | 0 | | | |
| 87 | 001010111 | 87 | 0001010111 | 0 | | | |
| 88 | 001011000 | 667 | 1010011011 | 2 | 356 | 0101100100 | −2 |
| 89 | 001011001 | 601 | 1001011001 | 0 | | | |
| 90 | 001011010 | 602 | 1001011010 | 0 | | | |
| 91 | 001011011 | 91 | 0001011011 | 0 | | | |
| 92 | 001011100 | 604 | 1001011100 | 0 | | | |
| 93 | 001011101 | 93 | 0001011101 | 0 | | | |
| 94 | 001011110 | 94 | 0001011110 | 0 | | | |
| 95 | 001011111 | 183 | 0010110111 | 2 | 840 | 1101001000 | −2 |
| 96 | 001100000 | 830 | 1100111110 | 4 | 193 | 0011000001 | −4 |
| 97 | 001100001 | 630 | 1001110110 | 2 | 393 | 0110001001 | −2 |
| 98 | 001100010 | 629 | 1001110101 | 2 | 394 | 0110001010 | −2 |
| 99 | 001100011 | 611 | 1001100011 | 0 | | | |
| 100 | 001100100 | 627 | 1001110011 | 2 | 396 | 0110001100 | −2 |
| 101 | 001100101 | 613 | 1001100101 | 0 | | | |
| 102 | 001100110 | 614 | 1001100110 | 0 | | | |
| 103 | 001100111 | 103 | 0001100111 | 0 | | | |
| 104 | 001101000 | 603 | 1001011011 | 2 | 420 | 0110100100 | −2 |
| 105 | 001101001 | 617 | 1001101001 | 0 | | | |
| 106 | 001101010 | 618 | 1001101010 | 0 | | | |
| 107 | 001101011 | 107 | 0001101011 | 0 | | | |
| 108 | 001101100 | 620 | 1001101100 | 0 | | | |
| 109 | 001101101 | 109 | 0001101101 | 0 | | | |
| 110 | 001101110 | 110 | 0001101110 | 0 | | | |
| 111 | 001101111 | 215 | 0011010111 | 2 | 808 | 1100101000 | −2 |
| 112 | 001110000 | 571 | 1000111011 | 2 | 452 | 0111000100 | −2 |
| 113 | 001110001 | 625 | 1001110001 | 0 | | | |
| 114 | 001110010 | 626 | 1001110010 | 0 | | | |
| 115 | 001110011 | 115 | 0001110011 | 0 | | | |
| 116 | 001110100 | 628 | 1001110100 | 0 | | | |
| 117 | 001110101 | 117 | 0001110101 | 0 | | | |
| 118 | 001110110 | 118 | 0001110110 | 0 | | | |
| 119 | 001110111 | 231 | 0011100111 | 2 | 792 | 1100011000 | −2 |
| 120 | 001111000 | 632 | 1001111000 | 0 | | | |
| 121 | 001111001 | 121 | 0001111001 | 0 | | | |
| 122 | 001111010 | 122 | 0001111010 | 0 | | | |
| 123 | 001111011 | 235 | 0011101011 | 2 | 788 | 1100010100 | −2 |

TABLE 24-continued

Total encoding and decoding table of 9B10B according to
another application embodiment of the present invention

| | | | | | | | |
|---|---|---|---|---|---|---|---|
| 124 | 001111100 | 124 | 0001111100 | 0 | | | |
| 125 | 001111101 | 237 | 0011101101 | 2 | 786 | 1100010010 | −2 |
| 126 | 001111110 | 238 | 0011101110 | 2 | 785 | 1100010001 | −2 |
| 127 | 001111111 | 247 | 0011110111 | 4 | 776 | 1100001000 | −4 |
| 128 | 010000000 | 349 | 0101011101 | 2 | 674 | 1010100010 | −2 |
| 129 | 010000001 | 764 | 1011111100 | 4 | 259 | 0100000011 | −4 |
| 130 | 010000010 | 762 | 1011111010 | 4 | 261 | 0100000101 | −4 |
| 131 | 010000011 | 492 | 0111101100 | 2 | 531 | 1000010011 | −2 |
| 132 | 010000100 | 758 | 1011110110 | 4 | 265 | 0100001001 | −4 |
| 133 | 010000101 | 490 | 0111101010 | 2 | 533 | 1000010101 | −2 |
| 134 | 010000110 | 489 | 0111101001 | 2 | 534 | 1000010110 | −2 |
| 135 | 010000111 | 647 | 1010000111 | 0 | | | |
| 136 | 010001000 | 755 | 1011110011 | 4 | 268 | 0100001100 | −4 |
| 137 | 010001001 | 486 | 0111100110 | 2 | 537 | 1000011001 | −2 |
| 138 | 010001010 | 485 | 0111100101 | 2 | 538 | 1000011010 | −2 |
| 139 | 010001011 | 651 | 1010001011 | 0 | | | |
| 140 | 010001100 | 483 | 0111100011 | 2 | 540 | 1000011100 | −2 |
| 141 | 010001101 | 653 | 1010001101 | 0 | | | |
| 142 | 010001110 | 654 | 1010001110 | 0 | | | |
| 143 | 010001111 | 882 | 1101110010 | 2 | 141 | 0010001101 | −2 |
| 144 | 010010000 | 734 | 1011011110 | 4 | 289 | 0100100001 | −4 |
| 145 | 010010001 | 438 | 0110110110 | 2 | 585 | 1001001001 | −2 |
| 146 | 010010010 | 437 | 0110110101 | 2 | 586 | 1001001010 | −2 |
| 147 | 010010011 | 659 | 1010010011 | 0 | | | |
| 148 | 010010100 | 435 | 0110110011 | 2 | 588 | 1001001100 | −2 |
| 149 | 010010101 | 661 | 1010010101 | 0 | | | |
| 150 | 010010110 | 662 | 1010010110 | 0 | | | |
| 151 | 010010111 | 151 | 0010010111 | 0 | | | |
| 152 | 010011000 | 411 | 0110011011 | 2 | 612 | 1001100100 | −2 |
| 153 | 010011001 | 665 | 1010011001 | 0 | | | |
| 154 | 010011010 | 666 | 1010011010 | 0 | | | |
| 155 | 010011011 | 155 | 0010011011 | 0 | | | |
| 156 | 010011100 | 668 | 1010011100 | 0 | | | |
| 157 | 010011101 | 157 | 0010011101 | 0 | | | |
| 158 | 010011110 | 158 | 0010011110 | 0 | | | |
| 159 | 010011111 | 311 | 0100110111 | 2 | 712 | 1011001000 | −2 |
| 160 | 010100000 | 702 | 1010111110 | 4 | 321 | 0101000001 | −4 |
| 161 | 010100001 | 374 | 0101110110 | 2 | 649 | 1010001001 | −2 |
| 162 | 010100010 | 373 | 0101110101 | 2 | 650 | 1010001010 | −2 |
| 163 | 010100011 | 675 | 1010100011 | 0 | | | |
| 164 | 010100100 | 371 | 0101110011 | 2 | 652 | 1010001100 | −2 |
| 165 | 010100101 | 677 | 1010100101 | 0 | | | |
| 166 | 010100110 | 678 | 1010100110 | 0 | | | |
| 167 | 010100111 | 167 | 0010100111 | 0 | | | |
| 168 | 010101000 | 347 | 0101011011 | 2 | 676 | 1010100100 | −2 |
| 169 | 010101001 | 681 | 1010101001 | 0 | | | |
| 170 | 010101010 | 682 | 1010101010 | 0 | | | |
| 171 | 010101011 | 171 | 0010101011 | 0 | | | |
| 172 | 010101100 | 684 | 1010101100 | 0 | | | |
| 173 | 010101101 | 173 | 0010101101 | 0 | | | |
| 174 | 010101110 | 174 | 0010101110 | 0 | | | |
| 175 | 010101111 | 343 | 0101010111 | 2 | 680 | 1010101000 | −2 |
| 176 | 010110000 | 315 | 0100111011 | 2 | 708 | 1011000100 | −2 |
| 177 | 010110001 | 689 | 1010110001 | 0 | | | |
| 178 | 010110010 | 690 | 1010110010 | 0 | | | |
| 179 | 010110011 | 179 | 0010110011 | 0 | | | |
| 180 | 010110100 | 692 | 1010110100 | 0 | | | |
| 181 | 010110101 | 181 | 0010110101 | 0 | | | |
| 182 | 010110110 | 182 | 0010110110 | 0 | | | |
| 183 | 010110111 | 359 | 0101100111 | 2 | 664 | 1010011000 | −2 |
| 184 | 010111000 | 696 | 1010111000 | 0 | | | |
| 185 | 010111001 | 185 | 0010111001 | 0 | | | |
| 186 | 010111010 | 186 | 0010111010 | 0 | | | |
| 187 | 010111011 | 363 | 0101101011 | 2 | 660 | 1010010100 | −2 |
| 188 | 010111100 | 188 | 0010111100 | 0 | | | |
| 189 | 010111101 | 365 | 0101101101 | 2 | 658 | 1010010010 | −2 |
| 190 | 010111110 | 366 | 0101101110 | 2 | 657 | 1010010001 | −2 |
| 191 | 010111111 | 375 | 0101110111 | 4 | 648 | 1010001000 | −4 |
| 192 | 011000000 | 638 | 1001111110 | 4 | 385 | 0110000001 | −4 |
| 193 | 011000001 | 246 | 0011110110 | 2 | 777 | 1100001001 | −2 |
| 194 | 011000010 | 245 | 0011110101 | 2 | 778 | 1100001010 | −2 |
| 195 | 011000011 | 707 | 1011000011 | 0 | | | |
| 196 | 011000100 | 243 | 0011110011 | 2 | 780 | 1100001100 | −2 |
| 197 | 011000101 | 709 | 1011000101 | 0 | | | |
| 198 | 011000110 | 710 | 1011000110 | 0 | | | |
| 199 | 011000111 | 199 | 0011000111 | 0 | | | |
| 200 | 011001000 | 219 | 0011011011 | 2 | 804 | 1100100100 | −2 |

TABLE 24-continued

Total encoding and decoding table of 9B10B according to another application embodiment of the present invention

| | | | | | | | | |
|---|---|---|---|---|---|---|---|---|
| 201 | 011001001 | 713 | 1011001001 | 0 | | | |
| 202 | 011001010 | 714 | 1011001010 | 0 | | | |
| 203 | 011001011 | 203 | 0011001011 | 0 | | | |
| 204 | 011001100 | 716 | 1011001100 | 0 | | | |
| 205 | 011001101 | 205 | 0011001101 | 0 | | | |
| 206 | 011001110 | 206 | 0011001110 | 0 | | | |
| 207 | 011001111 | 407 | 0110010111 | 2 | 616 | 1001101000 | −2 |
| 208 | 011010000 | 187 | 0010111011 | 2 | 836 | 1101000100 | −2 |
| 209 | 011010001 | 721 | 1011010001 | 0 | | | |
| 210 | 011010010 | 722 | 1011010010 | 0 | | | |
| 211 | 011010011 | 211 | 0011010011 | 0 | | | |
| 212 | 011010100 | 724 | 1011010100 | 0 | | | |
| 213 | 011010101 | 213 | 0011010101 | 0 | | | |
| 214 | 011010110 | 214 | 0011010110 | 0 | | | |
| 215 | 011010111 | 423 | 0110100111 | 2 | 600 | 1001011000 | −2 |
| 216 | 011011000 | 728 | 1011011000 | 0 | | | |
| 217 | 011011001 | 217 | 0011011001 | 0 | | | |
| 218 | 011011010 | 218 | 0011011010 | 0 | | | |
| 219 | 011011011 | 427 | 0110101011 | 2 | 596 | 1001010100 | −2 |
| 220 | 011011100 | 220 | 0011011100 | 0 | | | |
| 221 | 011011101 | 429 | 0110101101 | 2 | 594 | 1001010010 | −2 |
| 222 | 011011110 | 430 | 0110101110 | 2 | 593 | 1001010001 | −2 |
| 223 | 011011111 | 439 | 0110110111 | 4 | 584 | 1001001000 | −4 |
| 224 | 011100000 | 123 | 0001111011 | 2 | 900 | 1110000100 | −2 |
| 225 | 011100001 | 737 | 1011100001 | 0 | | | |
| 226 | 011100010 | 738 | 1011100010 | 0 | | | |
| 227 | 011100011 | 227 | 0011100011 | 0 | | | |
| 228 | 011100100 | 740 | 1011100100 | 0 | | | |
| 229 | 011100101 | 229 | 0011100101 | 0 | | | |
| 230 | 011100110 | 230 | 0011100110 | 0 | | | |
| 231 | 011100111 | 455 | 0111000111 | 2 | 568 | 1000111000 | −2 |
| 232 | 011101000 | 744 | 1011101000 | 0 | | | |
| 233 | 011101001 | 233 | 0011101001 | 0 | | | |
| 234 | 011101010 | 234 | 0011101010 | 0 | | | |
| 235 | 011101011 | 459 | 0111001011 | 2 | 564 | 1000110100 | −2 |
| 236 | 011101100 | 236 | 0011101100 | 0 | | | |
| 237 | 011101101 | 461 | 0111001101 | 2 | 562 | 1000110010 | −2 |
| 238 | 011101110 | 462 | 0111001110 | 2 | 561 | 1000110001 | −2 |
| 239 | 011101111 | 471 | 0111010111 | 4 | 552 | 1000101000 | −4 |
| 240 | 011110000 | 697 | 1010111001 | 2 | 326 | 0101000110 | −2 |
| 241 | 011110001 | 241 | 0011110001 | 0 | | | |
| 242 | 011110010 | 242 | 0011110010 | 0 | | | |
| 243 | 011110011 | 467 | 0111010011 | 2 | 556 | 1000101100 | −2 |
| 244 | 011110100 | 244 | 0011110100 | 0 | | | |
| 245 | 011110101 | 469 | 0111010101 | 2 | 554 | 1000101010 | −2 |
| 246 | 011110110 | 470 | 0111010110 | 2 | 553 | 1000101001 | −2 |
| 247 | 011110111 | 487 | 0111100111 | 4 | 536 | 1000011000 | −4 |
| 248 | 011111000 | 317 | 0100111101 | 2 | 706 | 1011000010 | −2 |
| 249 | 011111001 | 473 | 0111011001 | 2 | 550 | 1000100110 | −2 |
| 250 | 011111010 | 474 | 0111011010 | 2 | 549 | 1000100101 | −2 |
| 251 | 011111011 | 491 | 0111101011 | 4 | 532 | 1000010100 | −4 |
| 252 | 011111100 | 476 | 0111011100 | 2 | 547 | 1000100011 | −2 |
| 253 | 011111101 | 493 | 0111101101 | 4 | 530 | 1000010010 | −4 |
| 254 | 011111110 | 494 | 0111101110 | 4 | 529 | 1000010001 | −4 |
| 255 | 011111111 | 574 | 1000111110 | 2 | 449 | 0111000001 | −2 |
| 256 | 100000000 | 221 | 0011011101 | 2 | 802 | 1100100010 | −2 |
| 257 | 100000001 | 825 | 1100111001 | 2 | 198 | 0011000110 | −2 |
| 258 | 100000010 | 506 | 0111111010 | 4 | 517 | 1000000101 | −4 |
| 259 | 100000011 | 504 | 0111111000 | 2 | 519 | 1000000111 | −2 |
| 260 | 100000100 | 502 | 0111110110 | 4 | 521 | 1000001001 | −4 |
| 261 | 100000101 | 500 | 0111110100 | 2 | 523 | 1000001011 | −2 |
| 262 | 100000110 | 498 | 0111110010 | 2 | 525 | 1000001101 | −2 |
| 263 | 100000111 | 670 | 1010011110 | 2 | 353 | 0101100001 | −2 |
| 264 | 100001000 | 499 | 0111110011 | 4 | 524 | 1000001100 | −4 |
| 265 | 100001001 | 444 | 0110111100 | 2 | 579 | 1001000011 | −2 |
| 266 | 100001010 | 442 | 0110111010 | 2 | 581 | 1001000101 | −2 |
| 267 | 100001011 | 779 | 1100001011 | 0 | | | |
| 268 | 100001100 | 414 | 0110011110 | 2 | 609 | 1001100001 | −2 |
| 269 | 100001101 | 781 | 1100001101 | 0 | | | |
| 270 | 100001110 | 782 | 1100001110 | 0 | | | |
| 271 | 100001111 | 826 | 1100111010 | 2 | 197 | 0011000101 | −2 |
| 272 | 100010000 | 478 | 0111011110 | 4 | 545 | 1000100001 | −4 |
| 273 | 100010001 | 380 | 0101111100 | 2 | 643 | 1010000011 | −2 |
| 274 | 100010010 | 378 | 0101111010 | 2 | 645 | 1010000101 | −2 |
| 275 | 100010011 | 787 | 1100010011 | 0 | | | |
| 276 | 100010100 | 350 | 0101011110 | 2 | 673 | 1010100001 | −2 |
| 277 | 100010101 | 789 | 1100010101 | 0 | | | |

TABLE 24-continued

Total encoding and decoding table of 9B10B according to
another application embodiment of the present invention

| | | | | | | | |
|---|---|---|---|---|---|---|---|
| 278 | 100010110 | 790 | 1100010110 | 0 | | | |
| 279 | 100010111 | 279 | 0100010111 | 0 | | | |
| 280 | 100011000 | 318 | 0100111110 | 2 | 705 | 1011000001 | −2 |
| 281 | 100011001 | 793 | 1100011001 | 0 | | | |
| 282 | 100011010 | 794 | 1100011010 | 0 | | | |
| 283 | 100011011 | 283 | 0100011011 | 0 | | | |
| 284 | 100011100 | 796 | 1100011100 | 0 | | | |
| 285 | 100011101 | 285 | 0100011101 | 0 | | | |
| 286 | 100011110 | 286 | 0100011110 | 0 | | | |
| 287 | 100011111 | 567 | 1000110111 | 2 | 456 | 0111001000 | −2 |
| 288 | 100100000 | 446 | 0110111110 | 4 | 577 | 1001000001 | −4 |
| 289 | 100100001 | 252 | 0011111100 | 2 | 771 | 1100000011 | −2 |
| 290 | 100100010 | 250 | 0011111010 | 2 | 773 | 1100000101 | −2 |
| 291 | 100100011 | 803 | 1100100011 | 0 | | | |
| 292 | 100100100 | 222 | 0011011110 | 2 | 801 | 1100100001 | −2 |
| 293 | 100100101 | 805 | 1100100101 | 0 | | | |
| 294 | 100100110 | 806 | 1100100110 | 0 | | | |
| 295 | 100100111 | 295 | 0100100111 | 0 | | | |
| 296 | 100101000 | 190 | 0010111110 | 2 | 833 | 1101000001 | −2 |
| 297 | 100101001 | 809 | 1100101001 | 0 | | | |
| 298 | 100101010 | 810 | 1100101010 | 0 | | | |
| 299 | 100101011 | 299 | 0100101011 | 0 | | | |
| 300 | 100101100 | 812 | 1100101100 | 0 | | | |
| 301 | 100101101 | 301 | 0100101101 | 0 | | | |
| 302 | 100101110 | 302 | 0100101110 | 0 | | | |
| 303 | 100101111 | 599 | 1001010111 | 2 | 424 | 0110101000 | −2 |
| 304 | 100110000 | 126 | 0001111110 | 2 | 897 | 1110000001 | −2 |
| 305 | 100110001 | 817 | 1100110001 | 0 | | | |
| 306 | 100110010 | 818 | 1100110010 | 0 | | | |
| 307 | 100110011 | 307 | 0100110011 | 0 | | | |
| 308 | 100110100 | 820 | 1100110100 | 0 | | | |
| 309 | 100110101 | 309 | 0100110101 | 0 | | | |
| 310 | 100110110 | 310 | 0100110110 | 0 | | | |
| 311 | 100110111 | 615 | 1001100111 | 2 | 408 | 0110011000 | −2 |
| 312 | 100111000 | 824 | 1100111000 | 0 | | | |
| 313 | 100111001 | 313 | 0100111001 | 0 | | | |
| 314 | 100111010 | 314 | 0100111010 | 0 | | | |
| 315 | 100111011 | 619 | 1001101011 | 2 | 404 | 0110010100 | −2 |
| 316 | 100111100 | 316 | 0100111100 | 0 | | | |
| 317 | 100111101 | 621 | 1001101101 | 2 | 402 | 0110010010 | −2 |
| 318 | 100111110 | 622 | 1001101110 | 2 | 401 | 0110010001 | −2 |
| 319 | 100111111 | 631 | 1001110111 | 4 | 392 | 0110001000 | −4 |
| 320 | 101000000 | 382 | 0101111110 | 4 | 641 | 1010000001 | −4 |
| 321 | 101000001 | 761 | 1011111001 | 4 | 262 | 0100000110 | −4 |
| 322 | 101000010 | 757 | 1011110101 | 4 | 266 | 0100001010 | −4 |
| 323 | 101000011 | 835 | 1101000011 | 0 | | | |
| 324 | 101000100 | 733 | 1011011101 | 4 | 290 | 0100100010 | −4 |
| 325 | 101000101 | 837 | 1101000101 | 0 | | | |
| 326 | 101000110 | 838 | 1101000110 | 0 | | | |
| 327 | 101000111 | 327 | 0101000111 | 0 | | | |
| 328 | 101001000 | 701 | 1010111101 | 4 | 322 | 0101000010 | −4 |
| 329 | 101001001 | 841 | 1101001001 | 0 | | | |
| 330 | 101001010 | 842 | 1101001010 | 0 | | | |
| 331 | 101001011 | 331 | 0101001011 | 0 | | | |
| 332 | 101001100 | 844 | 1101001100 | 0 | | | |
| 333 | 101001101 | 333 | 0101001101 | 0 | | | |
| 334 | 101001110 | 334 | 0101001110 | 0 | | | |
| 335 | 101001111 | 663 | 1010010111 | 2 | 360 | 0101101000 | −2 |
| 336 | 101010000 | 637 | 1001111101 | 4 | 386 | 0110000010 | −4 |
| 337 | 101010001 | 849 | 1101010001 | 0 | | | |
| 338 | 101010010 | 850 | 1101010010 | 0 | | | |
| 339 | 101010011 | 339 | 0101010011 | 0 | | | |
| 340 | 101010100 | 852 | 1101010100 | 0 | | | |
| 341 | 101010101 | 341 | 0101010101 | 0 | | | |
| 342 | 101010110 | 342 | 0101010110 | 0 | | | |
| 343 | 101010111 | 679 | 1010100111 | 2 | 344 | 0101011000 | −2 |
| 344 | 101011000 | 856 | 1101011000 | 0 | | | |
| 345 | 101011001 | 345 | 0101011001 | 0 | | | |
| 346 | 101011010 | 346 | 0101011010 | 0 | | | |
| 347 | 101011011 | 683 | 1010101011 | 2 | 340 | 0101010100 | −2 |
| 348 | 101011100 | 348 | 0101011100 | 0 | | | |
| 349 | 101011101 | 685 | 1010101101 | 2 | 338 | 0101010010 | −2 |
| 350 | 101011110 | 686 | 1010101110 | 2 | 337 | 0101010001 | −2 |
| 351 | 101011111 | 695 | 1010110111 | 4 | 328 | 0101001000 | −4 |
| 352 | 101100000 | 925 | 1110011101 | 4 | 98 | 0001100010 | −4 |
| 353 | 101100001 | 865 | 1101100001 | 0 | | | |
| 354 | 101100010 | 866 | 1101100010 | 0 | | | |

TABLE 24-continued

Total encoding and decoding table of 9B10B according to
another application embodiment of the present invention

| | | | | | | | |
|---|---|---|---|---|---|---|---|
| 355 | 101100011 | 355 | 0101100011 | 0 | | | |
| 356 | 101100100 | 868 | 1101100100 | 0 | | | |
| 357 | 101100101 | 357 | 0101100101 | 0 | | | |
| 358 | 101100110 | 358 | 0101100110 | 0 | | | |
| 359 | 101100111 | 711 | 1011000111 | 2 | 312 | 0100111000 | −2 |
| 360 | 101101000 | 872 | 1101101000 | 0 | | | |
| 361 | 101101001 | 361 | 0101101001 | 0 | | | |
| 362 | 101101010 | 362 | 0101101010 | 0 | | | |
| 363 | 101101011 | 715 | 1011001011 | 2 | 308 | 0100110100 | −2 |
| 364 | 101101100 | 364 | 0101101100 | 0 | | | |
| 365 | 101101101 | 717 | 1011001101 | 2 | 306 | 0100110010 | −2 |
| 366 | 101101110 | 718 | 1011001110 | 2 | 305 | 0100110001 | −2 |
| 367 | 101101111 | 727 | 1011010111 | 4 | 296 | 0100101000 | −4 |
| 368 | 101110000 | 669 | 1010011101 | 2 | 354 | 0101100010 | −2 |
| 369 | 101110001 | 369 | 0101110001 | 0 | | | |
| 370 | 101110010 | 370 | 0101110010 | 0 | | | |
| 371 | 101110011 | 723 | 1011010011 | 2 | 300 | 0100101100 | −2 |
| 372 | 101110100 | 372 | 0101110100 | 0 | | | |
| 373 | 101110101 | 725 | 1011010101 | 2 | 298 | 0100101010 | −2 |
| 374 | 101110110 | 726 | 1011010110 | 2 | 297 | 0100101001 | −2 |
| 375 | 101110111 | 743 | 1011100111 | 4 | 280 | 0100011000 | −4 |
| 376 | 101111000 | 376 | 0101111000 | 0 | | | |
| 377 | 101111001 | 729 | 1011011001 | 2 | 294 | 0100100110 | −2 |
| 378 | 101111010 | 730 | 1011011010 | 2 | 293 | 0100100101 | −2 |
| 379 | 101111011 | 747 | 1011101011 | 4 | 276 | 0100010100 | −4 |
| 380 | 101111100 | 732 | 1011011100 | 2 | 291 | 0100100011 | −2 |
| 381 | 101111101 | 749 | 1011101101 | 4 | 274 | 0100010010 | −4 |
| 382 | 101111110 | 750 | 1011101110 | 4 | 273 | 0100010001 | −4 |
| 383 | 101111111 | 606 | 1001011110 | 2 | 417 | 0110100001 | −2 |
| 384 | 110000000 | 797 | 1100011101 | 2 | 226 | 0011100010 | −2 |
| 385 | 110000001 | 505 | 0111111001 | 4 | 518 | 1000000110 | −4 |
| 386 | 110000010 | 501 | 0111110101 | 4 | 522 | 1000001010 | −4 |
| 387 | 110000011 | 899 | 1110000011 | 0 | | | |
| 388 | 110000100 | 477 | 0111011101 | 4 | 546 | 1000100010 | −4 |
| 389 | 110000101 | 901 | 1110000101 | 0 | | | |
| 390 | 110000110 | 902 | 1110000110 | 0 | | | |
| 391 | 110000111 | 391 | 0110000111 | 0 | | | |
| 392 | 110001000 | 445 | 0110111101 | 4 | 578 | 1001000010 | −4 |
| 393 | 110001001 | 905 | 1110001001 | 0 | | | |
| 394 | 110001010 | 906 | 1110001010 | 0 | | | |
| 395 | 110001011 | 395 | 0110001011 | 0 | | | |
| 396 | 110001100 | 908 | 1110001100 | 0 | | | |
| 397 | 110001101 | 397 | 0110001101 | 0 | | | |
| 398 | 110001110 | 398 | 0110001110 | 0 | | | |
| 399 | 110001111 | 791 | 1100010111 | 2 | 232 | 0011101000 | −2 |
| 400 | 110010000 | 381 | 0101111101 | 4 | 642 | 1010000010 | −4 |
| 401 | 110010001 | 913 | 1110010001 | 0 | | | |
| 402 | 110010010 | 914 | 1110010010 | 0 | | | |
| 403 | 110010011 | 403 | 0110010011 | 0 | | | |
| 404 | 110010100 | 916 | 1110010100 | 0 | | | |
| 405 | 110010101 | 405 | 0110010101 | 0 | | | |
| 406 | 110010110 | 406 | 0110010110 | 0 | | | |
| 407 | 110010111 | 807 | 1100100111 | 2 | 216 | 0011011000 | −2 |
| 408 | 110011000 | 920 | 1110011000 | 0 | | | |
| 409 | 110011001 | 409 | 0110011001 | 0 | | | |
| 410 | 110011010 | 410 | 0110011010 | 0 | | | |
| 411 | 110011011 | 811 | 1100101011 | 2 | 212 | 0011010100 | −2 |
| 412 | 110011100 | 412 | 0110011100 | 0 | | | |
| 413 | 110011101 | 813 | 1100101101 | 2 | 210 | 0011010010 | −2 |
| 414 | 110011110 | 814 | 1100101110 | 2 | 209 | 0011010001 | −2 |
| 415 | 110011111 | 823 | 1100110111 | 4 | 200 | 0011001000 | −4 |
| 416 | 110100000 | 253 | 0011111101 | 4 | 770 | 1100000010 | −4 |
| 417 | 110100001 | 929 | 1110100001 | 0 | | | |
| 418 | 110100010 | 930 | 1110100010 | 0 | | | |
| 419 | 110100011 | 419 | 0110100011 | 0 | | | |
| 420 | 110100100 | 932 | 1110100100 | 0 | | | |
| 421 | 110100101 | 421 | 0110100101 | 0 | | | |
| 422 | 110100110 | 422 | 0110100110 | 0 | | | |
| 423 | 110100111 | 839 | 1101000111 | 2 | 184 | 0010111000 | −2 |
| 424 | 110101000 | 936 | 1110101000 | 0 | | | |
| 425 | 110101001 | 425 | 0110101001 | 0 | | | |
| 426 | 110101010 | 426 | 0110101010 | 0 | | | |
| 427 | 110101011 | 843 | 1101001011 | 2 | 180 | 0010110100 | −2 |
| 428 | 110101100 | 428 | 0110101100 | 0 | | | |
| 429 | 110101101 | 845 | 1101001101 | 2 | 178 | 0010110010 | −2 |
| 430 | 110101110 | 846 | 1101001110 | 2 | 177 | 0010110001 | −2 |
| 431 | 110101111 | 855 | 1101010111 | 4 | 168 | 0010101000 | −4 |

TABLE 24-continued

Total encoding and decoding table of 9B10B according to another application embodiment of the present invention

| | | | | | | | |
|---|---|---|---|---|---|---|---|
| 432 | 110110000 | 633 | 1001111001 | 2 | 390 | 0110000110 | −2 |
| 433 | 110110001 | 433 | 0110110001 | 0 | | | |
| 434 | 110110010 | 434 | 0110110010 | 0 | | | |
| 435 | 110110011 | 851 | 1101010011 | 2 | 172 | 0010101100 | −2 |
| 436 | 110110100 | 436 | 0110110100 | 0 | | | |
| 437 | 110110101 | 853 | 1101010101 | 2 | 170 | 0010101010 | −2 |
| 438 | 110110110 | 854 | 1101010110 | 2 | 169 | 0010101001 | −2 |
| 439 | 110110111 | 871 | 1101100111 | 4 | 152 | 0010011000 | −4 |
| 440 | 110111000 | 440 | 0110111000 | 0 | | | |
| 441 | 110111001 | 857 | 1101011001 | 2 | 166 | 0010100110 | −2 |
| 442 | 110111010 | 858 | 1101011010 | 2 | 165 | 0010100101 | −2 |
| 443 | 110111011 | 875 | 1101101011 | 4 | 148 | 0010010100 | −4 |
| 444 | 110111100 | 860 | 1101011100 | 2 | 163 | 0010100011 | −2 |
| 445 | 110111101 | 877 | 1101101101 | 4 | 146 | 0010010010 | −4 |
| 446 | 110111110 | 878 | 1101101110 | 4 | 145 | 0010010001 | −4 |
| 447 | 110111111 | 636 | 1001111100 | 2 | 387 | 0110000011 | −2 |
| 448 | 111000000 | 861 | 1101011101 | 4 | 162 | 0010100010 | −4 |
| 449 | 111000001 | 961 | 1111000001 | 0 | | | |
| 450 | 111000010 | 962 | 1111000010 | 0 | | | |
| 451 | 111000011 | 451 | 0111000011 | 0 | | | |
| 452 | 111000100 | 964 | 1111000100 | 0 | | | |
| 453 | 111000101 | 453 | 0111000101 | 0 | | | |
| 454 | 111000110 | 454 | 0111000110 | 0 | | | |
| 455 | 111000111 | 903 | 1110000111 | 2 | 120 | 0001111000 | −2 |
| 456 | 111001000 | 968 | 1111001000 | 0 | | | |
| 457 | 111001001 | 457 | 0111001001 | 0 | | | |
| 458 | 111001010 | 458 | 0111001010 | 0 | | | |
| 459 | 111001011 | 907 | 1110001011 | 2 | 116 | 0001110100 | −2 |
| 460 | 111001100 | 460 | 0111001100 | 0 | | | |
| 461 | 111001101 | 909 | 1110001101 | 2 | 114 | 0001110010 | −2 |
| 462 | 111001110 | 910 | 1110001110 | 2 | 113 | 0001110001 | −2 |
| 463 | 111001111 | 919 | 1110010111 | 4 | 104 | 0001101000 | −4 |
| 464 | 111010000 | 605 | 1001011101 | 2 | 418 | 0110100010 | −2 |
| 465 | 111010001 | 465 | 0111010001 | 0 | | | |
| 466 | 111010010 | 466 | 0111010010 | 0 | | | |
| 467 | 111010011 | 915 | 1110010011 | 2 | 108 | 0001101100 | −2 |
| 468 | 111010100 | 468 | 0111010100 | 0 | | | |
| 469 | 111010101 | 917 | 1110010101 | 2 | 106 | 0001101010 | −2 |
| 470 | 111010110 | 918 | 1110010110 | 2 | 105 | 0001101001 | −2 |
| 471 | 111010111 | 935 | 1110100111 | 4 | 88 | 0001011000 | −4 |
| 472 | 111011000 | 472 | 0111011000 | 0 | | | |
| 473 | 111011001 | 921 | 1110011001 | 2 | 102 | 0001100110 | −2 |
| 474 | 111011010 | 922 | 1110011010 | 2 | 101 | 0001100101 | −2 |
| 475 | 111011011 | 939 | 1110101011 | 4 | 84 | 0001010100 | −4 |
| 476 | 111011100 | 924 | 1110011100 | 2 | 99 | 0001100011 | −2 |
| 477 | 111011101 | 941 | 1110101101 | 4 | 82 | 0001010010 | −4 |
| 478 | 111011110 | 942 | 1110101110 | 4 | 81 | 0001010001 | −4 |
| 479 | 111011111 | 700 | 1010111100 | 2 | 323 | 0101000011 | −2 |
| 480 | 111100000 | 573 | 1000111101 | 2 | 450 | 0111000010 | −2 |
| 481 | 111100001 | 481 | 0111100001 | 0 | | | |
| 482 | 111100010 | 482 | 0111100010 | 0 | | | |
| 483 | 111100011 | 931 | 1110100011 | 2 | 92 | 0001011100 | −2 |
| 484 | 111100100 | 484 | 0111100100 | 0 | | | |
| 485 | 111100101 | 933 | 1110100101 | 2 | 90 | 0001011010 | −2 |
| 486 | 111100110 | 934 | 1110100110 | 2 | 89 | 0001011001 | −2 |
| 487 | 111100111 | 967 | 1111000111 | 4 | 56 | 0000111000 | −4 |
| 488 | 111101000 | 488 | 0111101000 | 0 | | | |
| 489 | 111101001 | 937 | 1110101001 | 2 | 86 | 0001010110 | −2 |
| 490 | 111101010 | 938 | 1110101010 | 2 | 85 | 0001010101 | −2 |
| 491 | 111101011 | 971 | 1111001011 | 4 | 52 | 0000110100 | −4 |
| 492 | 111101100 | 940 | 1110101100 | 2 | 83 | 0001010011 | −2 |
| 493 | 111101101 | 973 | 1111001101 | 4 | 50 | 0000110010 | −4 |
| 494 | 111101110 | 974 | 1111001110 | 4 | 49 | 0000110001 | −4 |
| 495 | 111101111 | 634 | 1001111010 | 2 | 389 | 0110000101 | −2 |
| 496 | 111110000 | 798 | 1100011110 | 2 | 225 | 0011100001 | −2 |
| 497 | 111110001 | 945 | 1110110001 | 2 | 78 | 0001001110 | −2 |
| 498 | 111110010 | 946 | 1110110010 | 2 | 77 | 0001001101 | −2 |
| 499 | 111110011 | 979 | 1111010011 | 4 | 44 | 0000101100 | −4 |
| 500 | 111110100 | 948 | 1110110100 | 2 | 75 | 0001001011 | −2 |
| 501 | 111110101 | 981 | 1111010101 | 4 | 42 | 0000101010 | −4 |
| 502 | 111110110 | 982 | 1111010110 | 4 | 41 | 0000101001 | −4 |
| 503 | 111110111 | 698 | 1010111010 | 2 | 325 | 0101000101 | −2 |
| 504 | 111111000 | 952 | 1110111000 | 2 | 71 | 0001000111 | −2 |
| 505 | 111111001 | 985 | 1111011001 | 4 | 38 | 0000100110 | −4 |
| 506 | 111111010 | 986 | 1111011010 | 4 | 37 | 0000100101 | −4 |
| 507 | 111111011 | 756 | 1011110100 | 2 | 267 | 0100001011 | −2 |
| 508 | 111111100 | 988 | 1111011100 | 4 | 35 | 0000100011 | −4 |

TABLE 24-continued

Total encoding and decoding table of 9B10B according to
another application embodiment of the present invention

| 509 | 111111101 | 760 | 1011111000 | 2 | 263 | 0100000111 | −2 |
| 510 | 111111110 | 754 | 1011110010 | 2 | 269 | 0100001101 | −2 |
| 511 | 111111111 | 775 | 1100000111 | 0 | | | |

Control character coding

| | 10B (The difference value is positive) | | | 10B (The difference value is negative) | | |
|---|---|---|---|---|---|---|
| Control character | Decimal system | Binary system | Difference value | decimal system | binary system | Difference value |
| Control character 1 | 254 | 0011111110 | 4 | 769 | 1100000001 | −4 |
| Control character 2 | 508 | 0111111100 | 4 | 515 | 1000000011 | −4 |
| Control character 3 | 889 | 1101111001 | 4 | 134 | 0010000110 | −4 |
| Control character 4 | 885 | 1101110101 | 4 | 138 | 0010001010 | −4 |
| Control character 5 | 881 | 1101110001 | 2 | 142 | 0010001110 | −2 |
| Control character 6 | 829 | 1100111101 | 4 | 194 | 0011000010 | −4 |
| Control character 7 | 953 | 1110111001 | 4 | 70 | 0001000110 | −4 |
| Control character 8 | 949 | 1110110101 | 4 | 74 | 0001001010 | −4 |

In this embodiment, the 9B10B encoding and decoding table shown in Table 24 can be obtained by classified calculation, but after the 9B10B encoding and decoding table is obtained according to the present invention, the 9-bit source sequence can still be encoded into a 10-bit target sequence by the traditional table lookup method. For example, in this embodiment, the 9-bit source sequence "110110110" is encoded. After obtaining Table 24, one of the 10-bit target sequences "1101010110" and "00101001" is selected as the encoding of the 9-bit source sequence "11010110". According to the present invention, different implementations of obtaining the 9B10B codec table and encoding it are all within the protection scope of the present invention.

According to the encoding method of encoding a 9-bit source sequence set into a 10-bit target sequence set provided by the present invention, a decoding method of decoding a 10-bit target sequence set into a 9-bit source sequence set can be obtained. The decoding method is the inverse transformation of the encoding method, that is, according to the encoding and decoding tables 23 and 24, the corresponding 9-bit source sequence can be obtained from the 10-bit target sequence. For example, in this embodiment, the 10-bit target sequence "11010110" is decoded. After obtaining Table 24, according to the lookup result, the decoding result of the 10-bit target sequence is the 9-bit source sequence "110110110".

The inverse transformation of the coding method, that is, decoding, can also be realized by other means such as classification calculation. For example, in this embodiment, for a 10-bit target balanced sequence encoded by the sequence in the first type of 9-bit source sequence, the highest bit of the 10-bit target balanced sequence is deleted, and the decoded 9-bit source sequence can be obtained. For another example, in this embodiment, for a pair of 10-bit target unbalanced sequences with a difference value of ±2 obtained by sequence coding in the second type of 9-bit source sequence set, the 10-bit target unbalanced sequence with a difference value of 2 is taken, and after the number of "1" in this sequence is sequentially counted up to 3 from the lowest bit to the highest bit, there is 1-bit data "0", and this 1-bit data "0" is deleted to obtain the decoded 9. According to the present invention, different implementations of obtaining the 9B10B codec table and decoding it are all within the protection scope of the present invention.

It can be understood by those skilled in the art that all or part of the steps in the above-mentioned embodiment can be completed by instructing related hardware through a program, which can be stored in a computer-readable storage medium. Such as read-only memory, random access memory, magnetic disk, optical disk, USB flash drive, etc.

The above is only the preferred embodiment of the present invention, but the protection scope of the present invention is not limited to this, and any changes or substitutions that can be easily thought of by those familiar with the technical field within the technical scope disclosed by the present invention should be included in the protection scope of the present invention.

What is claimed is:

1. A 9B/10B encoding method for encoding a 9-bit source sequence set into a 10-bit target sequence set, wherein each sequence in the 9-bit source sequence set is a 9-bit binary number, and each sequence in the encoded 10-bit target sequence set is a 10-bit binary number, and the 10-bit target sequence set comprises balanced sequences and unbalanced sequences, and different 9-bit source sequences are encoded into different 10-bit target sequences, wherein, the 9-bit source sequence set comprises a first type of 9-bit source sequence set, a second type of 9-bit source sequence set and a third type of 9-bit source sequence set, wherein the three types of 9-bit source sequence sets are disjoint, and a unified set of the three types of 9-bit source sequence sets has 512 non-repetitive 9-bit source sequences in total, the first type of 9-bit source sequence set only comprises 9-bit source sequences with difference values of 1 and −1, and each 9-bit source sequence in the first type of 9-bit source sequence set is encoded into a 10-bit target balanced sequence after inserting 1-bit data "0" or "1" at a same position of each 9-bit source sequence in the first type of 9-bit source sequence set, the second type of 9-bit source sequence set alternatively comprises only 9-bit source sequences with a difference value of 3 or only 9-bit source sequences with a difference value of −3, if the second type of 9-bit source sequence set only comprises 9-bit source sequences with a difference value of 3, 1-bit data "0" is inserted into the 9-bit source sequence, and the formed 10-bit target sequence and an opposite number thereof form a pair of 10-bit target unbalanced sequences with a difference value of ±2, which are codes of the 9-bit source sequence with a difference value of 3, if the second type of 9-bit source sequence set only comprises 9-bit source sequences with a difference value of −3, 1-bit data is inserted into the 9-bit source sequence, and the formed 10-bit target sequence and an opposite number thereof form a pair of 10-bit target unbalanced sequences with a difference value of ±2, which are codes of the 9-bit source sequence with a difference value of −3, each 9-bit source sequence comprised in the third type of 9-bit source sequence set is encoded into a pair of 10-bit target unbalanced sequences that are opposite numbers for each other.

2. The 9B/10B coding method according to claim 1, wherein, when i1-bit data is inserted at the same position of each 9-bit source sequence in the first type of 9-bit source sequence set, the same position is the leftmost or rightmost position of the 9-bit source sequence, and the inserted 1-bit data is at a highest or lowest bit in the encoded 10-bit target balanced sequence.

3. The 9B/10B coding method according to claim 1, wherein, when 1-bit data "0" is inserted into the 9-bit source sequence of the second type of 9-bit source sequence set, the position of inserting the data is as follows: after a count number of "1" in the 9-bit source sequence from a lowest bit to a high bit sequentially reaches 3, or after a count number of "1" in the 9-bit source sequence from a highest bit to the low bit sequentially reaches 3;

when 1-bit data "1" is inserted into the 9-bit source sequence of the second type of 9-bit source sequence set, the position of inserting the data is: after a count number of "0" in the 9-bit source sequence from a lowest bit to a high bit sequentially reaches 3, or after a count number of "0" in the 9-bit source sequence from a highest bit to the low bit sequentially reaches 3.

4. The 9B/10B coding method according to claim 1, wherein, the third type of 9-bit source sequence set comprises a fourth type of 9-bit source sequence set and a fifth type of 9-bit source sequence set, which are disjoint, and a unified set of the fourth type of 9-bit source sequence set and the fifth type of 9-bit source sequence set is the third type of 9-bit source sequence set, the fourth type of 9-bit source sequence set alternatively only comprises 9-bit source sequences with a difference value of 5 or only comprises 9-bit source sequences with a difference value of −5, if the fourth type of 9-bit source sequence set only comprises 9-bit source sequences with a difference value of 5, 1-bit data "0" is inserted into the 9-bit source sequence, and the formed 10-bit target sequence and an opposite number thereof form a pair of 10-bit target unbalanced sequences with a difference value of ±4, which are codes of the 9-bit source sequence with a difference value of 5, if the fourth type of 9-bit source sequence set only comprises 9-bit source sequences with a difference value of −5, 1-bit data is inserted into the 9-bit source sequence, and the formed 10-bit target sequence and an opposite number thereof form a pair of 10-bit target unbalanced sequences with a difference value of ±4, which are codes of the 9-bit source sequence with a difference value of −5, each 9-bit source sequence comprised in the fifth type of 9-bit source sequence set is encoded into a pair of 10-bit target unbalanced sequences that are opposite numbers for each other.

5. The 9B/10B coding method according to claim 4, wherein, when 1-bit data "0" is inserted into a 9-bit source sequence in the fourth type of 9-bit source sequence set, the position of inserting data is as follows: after a count number of "1" in the 9-bit source sequence from a lowest bit to a high bit sequentially reaches 3, or after a count number of "1" in the 9-bit source sequence from a highest bit to the low bit sequentially reaches 3;

when 1-bit data "1" is inserted into a 9-bit source sequence in the fourth type of 9-bit source sequence set, the position of inserting data is as follows: after a count number of "0" in the 9-bit source sequence from a lowest bit to a high bit sequentially reaches 3, or after a count number of "0" in the 9-bit source sequence from a highest bit to the low bit sequentially reaches 3.

6. The 9B/10B coding method according to claim 1, wherein, the 10-bit target sequence set only comprises sequences with difference values of −4, −2, 0, 2 and 4, the 10-bit target sequence set does not comprise a sequence with the lowest 4 bits being 4 bits of "0000" or "1111" or a sequence with the highest 5 bits being 5 bits of "00000" or "11111".

7. The 9B/10B coding method according to claim 1, wherein, the 10-bit target sequence set only comprises sequences with difference values of −4, −2, 0, 2 and 4, the 10-bit target sequence set does not comprise a sequence with the lowest 5 bits being 5 bits of "00000" or "11111" or a sequence with the highest 4 bits being 4 bits of "0000" or "1111".

8. The 9B/10B coding method according to claim 1, wherein, the 10-bit target sequence set comprises 784 codewords, comprising 240 10-bit target balanced sequences and 544 10-bit target unbalanced sequences, which can form 272 pairs of 10-bit target unbalanced sequences which are opposite numbers for each other, the 240 10-bit target balanced sequences and the 272 pairs of 10-bit target unbalanced sequences are the codes of 512 9-bit source sequences in the 9-bit source sequence set.

9. The 9B/10B coding method according to claim 8, wherein, the 272 pairs of 10-bit target unbalanced sequences which are opposite numbers for each other comprise 189 pairs of 10-bit target unbalanced sequences with a difference value of ±2 and 83 pairs of 10-bit target unbalanced sequences with a difference value of ±4.

10. The 9B/10B coding method according to claim 8, wherein, the 10-bit target sequence set further comprises 16 10-bit target unbalanced sequences to represent control characters, and the 16 10-bit target unbalanced sequences can form 8 pairs of 10-bit target unbalanced sequences which are opposite numbers for each other, wherein each pair of 10-bit target unbalanced sequences which are opposite numbers for each other is a code of a control character.

11. A 9B/10B encoding method for encoding a 9-bit source sequence set into a 10-bit target sequence set, wherein each sequence in the 9-bit source sequence set is a 9-bit binary number, and each sequence in the encoded 10-bit target sequence set is a 10-bit binary number, and the 10-bit target sequence set comprises a balanced sequence and an unbalanced sequence, and different 9-bit source sequences are encoded into different 10-bit target sequences, wherein,
the 9-bit source sequence set comprises a first type of 9-bit source sequence set, a second type of 9-bit source sequence set and a third type of 9-bit source sequence set, wherein the three types of 9-bit source sequence sets are disjoint, and a unified set of the three types of 9-bit source sequence sets has 512 non-repetitive 9-bit source sequences,
the first type of 9-bit source sequence set only comprises 9-bit source sequences with difference values of 1 and −1, and each 9-bit source sequence in the first type of 9-bit source sequence set is encoded into a 10-bit target balanced sequence after inserting 1-bit data "0" or "1" at a same position,
the second type of 9-bit source sequence set alternatively comprises only 9-bit source sequences with a difference value of 3 or only 9-bit source sequences with a difference value of −3,
if the second type of 9-bit source sequence set only comprises 9-bit source sequences with a difference value of 3, 1-bit data "0" is inserted into the 9-bit source sequence, and the formed 10-bit target sequence and an opposite number thereof form a pair of 10-bit target unbalanced sequences with a difference value of ±2, which are codes of the 9-bit source sequence with a difference value of 3,
if the second type of 9-bit source sequence set only comprises 9-bit source sequences with a difference value of −3, 1-bit data is inserted into the 9-bit source sequence, and the formed 10-bit target sequence and an opposite number thereof form a pair of 10-bit target unbalanced sequences with a difference value of ±2, which are codes of the 9-bit source sequence with a difference value of −3,
the third type of 9-bit source sequence set comprises a third type of 9-bit source sequence subset A and a third type of 9-bit source sequence subset B, which are disjoint, and a unified set of the third type of 9-bit source sequence subset A and the third type of 9-bit source sequence subset B is the third type of 9-bit source sequence set,
each 9-bit source sequence comprised in the third type 9-bit source sequence subset A is encoded into a 10-bit target balanced sequence,
each 9-bit source sequence comprised in the third type of 9-bit source sequence subset B is encoded into a pair of 10-bit target unbalanced sequences that are opposite numbers for each other.

12. The 9B/10B coding method according to claim 11, wherein,
the third type of 9-bit source sequence subset A comprises two sequences: "00000000" and "11111111".

13. The 9B/10B coding method according to claim 11, wherein,
when inserting 1-bit data at a same position of each 9-bit source sequence in the first type of 9-bit source sequence set, the same position is a leftmost or rightmost position of the 9-bit source sequence, and the inserted 1-bit data is at a highest or lowest bit in the encoded 10-bit target balanced sequence.

14. The 9B/10B coding method according to claim 11, wherein,
when 1-bit data "0" is inserted into the 9-bit source sequence of the second type of 9-bit source sequence set, the position of inserting data is as follows: after a count number of "1" in the 9-bit source sequence from a lowest bit to a high bit sequentially reaches 3, or after a count number of "1" in the 9-bit source sequence from a highest bit to the low bit sequentially reaches 3;
when 1-bit data "1" is inserted into the 9-bit source sequence of the second type of 9-bit source sequence set, the position of inserting data is: after a count number of "0" in the 9-bit source sequence from a lowest bit to a high bit sequentially reaches 3, or after a count number of "0" in the 9-bit source sequence from a highest bit to the low bit sequentially reaches 3.

15. The 9B/10B coding method according to claim 11, wherein,
the third type of 9-bit source sequence subset B comprises a sixth type of 9-bit source sequence set and a seventh type of 9-bit source sequence set, which are disjoint, and a unified set of the sixth type of 9-bit source sequence set the seventh type of 9-bit source sequence set is the third type of 9-bit source sequence subset B,
the sixth type of 9-bit source sequence set alternatively comprises only 9-bit source sequences with a difference value of 5 or only 9-bit source sequences with a difference value of −5,
if the sixth type of 9-bit source sequence set only comprises 9-bit source sequences with a difference value of 5, 1-bit data "0" is inserted into the 9-bit source sequence, and the formed 10-bit target sequence and an opposite number thereof form a pair of 10-bit target unbalanced sequences with a difference value of ±4, which are codes of the 9-bit source sequence with a difference value of 5,
if the sixth type of 9-bit source sequence set only comprises 9-bit source sequences with a difference value of −5, 1-bit data is inserted into the 9-bit source sequence, and the formed 10-bit target sequence and an opposite number thereof form a pair of 10-bit target unbalanced sequences with a difference value of ±4, which are codes of the 9-bit source sequence with a difference value of −5,
each 9-bit source sequence comprised in the seventh type of 9-bit source sequence set is encoded into a pair of 10-bit target unbalanced sequences that are opposite numbers for each other.

16. The 9B/10B coding method according to claim 15, wherein,
when 1-bit data "0" is inserted into the 9-bit source sequence in the sixth type of 9-bit source sequence set, the position of inserting data is as follows: after a count number of "1" in the 9-bit source sequence from a lowest bit to a high bit sequentially reaches 3, or after a count number of "1" in the 9-bit source sequence from a highest bit to the low bit sequentially reaches 3;
when 1-bit data "1" is inserted into a 9-bit source sequence in the sixth type of 9-bit source sequence set, the position of the inserted data is: after a count number of "0" in the 9-bit source sequence from a lowest bit to a high bit sequentially reaches 3, or after a count number of "0" in the 9-bit source sequence from a highest bit to the low bit sequentially reaches 3.

17. The 9B/10B coding method according to claim 11, wherein,
the 10-bit target sequence set only comprises sequences with difference values of −4, −2, 0, 2 and 4,
the 10-bit target sequence set does not comprise a sequence with the lowest 4 bits being 4 bits of "0000" or "1111" or a sequence with the highest 5 bits being 5 bits of "00000" or "11111".

18. The 9B/10B coding method according to claim 11, wherein,
the 10-bit target sequence set only comprises sequences with difference values of −4, −2, 0, 2 and 4,
the 10-bit target sequence set does not comprise a sequence with the lowest 5 bits being 5 bits of "00000" or "11111" or a sequence with the highest 4 bits being 4 bits of "0000" or "1111".

19. The 9B/10B coding method according to claim 11, wherein,
the 10-bit target sequence set comprises 784 codewords, comprising 240 10-bit target balanced sequences and 544 10-bit target unbalanced sequences, which can form 272 pairs of 10-bit target unbalanced sequences which are opposite numbers for each other,
the 240 10-bit target balanced sequences and the 272 pairs of 10-bit target unbalanced sequences are the codes of 512 9-bit source sequences in the 9-bit source sequence set.

20. The 9B/10B coding method according to claim 19, wherein,
the 272 pairs of 10-bit target unbalanced sequences which are opposite numbers for each other comprise 189 pairs of 10-bit target unbalanced sequences with a difference value of ±2 and 83 pairs of 10-bit target unbalanced sequences with a difference value of ±4.

21. The 9B/10B coding method according to claim 19, wherein,
the 10-bit target sequence set further comprises 16 10-bit target unbalanced sequences to represent control characters, and the 16 10-bit target unbalanced sequences can form 8 pairs of 10-bit target unbalanced sequences which are opposite numbers for each other, wherein each pair of 10-bit target unbalanced sequences which are opposite numbers for each other is a code of a control character.

22. A 9B/10B decoding method for decoding a 10-bit target sequence set into a 9-bit source sequence set, wherein the decoding method is an inverse transformation of an encoding method, and the encoding method is used for encoding the 9-bit source sequence set into a 10-bit target sequence set, each sequence in the 9-bit source sequence set is a 9-bit binary number, each sequence in the encoded 10-bit target sequence set is a 10-bit binary number, and the 10-bit target sequence set comprises a balanced sequence and an unbalanced sequence,
wherein,
the 9-bit source sequence set comprises a first type of 9-bit source sequence set, a second type of 9-bit source sequence set and a third type of 9-bit source sequence set, wherein the three types of 9-bit source sequence sets are disjoint, and a unified set of the three types of 9-bit source sequence sets has 512 non-repetitive 9-bit source sequences, the first type of 9-bit source sequence set only comprises 9-bit source sequences with difference values of 1 and −1, and each 9-bit source sequence in the first type of 9-bit source sequence set is encoded into a 10-bit target balanced sequence after inserting 1-bit data "0" or "1" at a same position,
the second type of 9-bit source sequence set alternatively comprises only 9-bit source sequences with a difference value of 3 or only 9-bit source sequences with a difference value of −3,
if the second type of 9-bit source sequence set only comprises 9-bit source sequences with a difference value of 3, 1-bit data "0" is inserted into the 9-bit source sequence, and the formed 10-bit target sequence and an opposite number thereof form a pair of 10-bit target unbalanced sequences with a difference value of ±2, which are codes of the 9-bit source sequence with a difference value of 3,
if the second type of 9-bit source sequence set only comprises 9-bit source sequences with a difference value of −3, 1-bit data is inserted into the 9-bit source sequence, and the formed 10-bit target sequence and an opposite number thereof form a pair of 10-bit target unbalanced sequences with a difference value of ±2, which are codes of the 9-bit source sequence with a difference value of −3,
each 9-bit source sequence comprised in the third type of 9-bit source sequence set is encoded into a pair of 10-bit target unbalanced sequences that are opposite numbers for each other.

23. The 9B/10B decoding method according to claim 22, wherein,
when inserting 1-bit data at the same position of each 9-bit source sequence in the first type of 9-bit source sequence set, the same position is a leftmost or rightmost position of the 9-bit source sequence, and the inserted 1-bit data is at a highest or lowest bit in the encoded 10-bit target balanced sequence.

24. The 9B/10B decoding method according to claim 22, wherein,
when 1-bit data "0" is inserted into the 9-bit source sequence of the second type of 9-bit source sequence set, the position of inserting data is as follows: after a count number of "1" in the 9-bit source sequence from a lowest bit to a high bit sequentially reaches 3, or after a count number of "1" in the 9-bit source sequence from a highest bit to the low bit sequentially reaches 3;
when 1-bit data "1" is inserted into the 9-bit source sequence of the second type of 9-bit source sequence set, the position of inserting data is: after a count number of "0" in the 9-bit source sequence from a lowest bit to a high bit sequentially reaches 3, or after a count number of "0" in the 9-bit source sequence from a highest bit to the low bit sequentially reaches 3.

25. The 9B/10B decoding method according to claim 22, wherein,
the third type of 9-bit source sequence set comprises a fourth type of 9-bit source sequence set and a fifth type of 9-bit source sequence set, which are disjoint, and the unified set of the fourth type and the fifth type of 9-bit source sequence set is the third type of 9-bit source sequence set,
the fourth type of 9-bit source sequence set alternatively comprises only 9-bit source sequences with a difference value of 5 or only 9-bit source sequences with a difference value of −5,
if the fourth type of 9-bit source sequence set only comprises 9-bit source sequences with a difference value of 5, 1-bit data "0" is inserted into the 9-bit source sequence, and the formed 10-bit target sequence and an opposite number thereof form a pair of 10-bit target unbalanced sequences with a difference value of ±4, which are codes of the 9-bit source sequence with a difference value of 5, if the fourth type of 9-bit source sequence set only comprises 9-bit source sequences with a difference value of −5, 1-bit data is inserted into the 9-bit source sequence, and the formed 10-bit target sequence and an opposite number thereof form a pair of 10-bit target unbalanced sequences with a difference value of ±4, which are codes of the 9-bit source sequence with a difference value of −5, each 9-bit source sequence comprised in the fifth type of 9-bit source sequence set is encoded into a pair of 10-bit target unbalanced sequences that are opposite numbers for each other.

26. The 9B/10B decoding method according to claim 25, wherein,
when 1-bit data "0" is inserted into a 9-bit source sequence in the fourth type of 9-bit source sequence set, the position of inserting data is as follows: after a count number of "1" in the 9-bit source sequence from a lowest bit to a high bit sequentially reaches 3, or after a count number of "1" in the 9-bit source sequence from a highest bit to the low bit sequentially reaches 3;
when 1-bit data "1" is inserted into a 9-bit source sequence in the fourth type of 9-bit source sequence set, the position of inserting data is as follows: after a count number of "0" in the 9-bit source sequence from a lowest bit to a high bit sequentially reaches 3, or after a count number of "0" in the 9-bit source sequence from a highest bit to the low bit sequentially reaches 3.

27. The 9B/10B decoding method according to claim 22, wherein,
the 10-bit target sequence set only comprises sequences with difference values of −4, −2, 0, 2 and 4,
the 10-bit target sequence set does not comprise a sequence with the lowest 4 bits being 4 bits of "0000" or "1111" or a sequence with the highest 5 bits being 5 bits of "00000" or "11111".

28. The 9B/10B decoding method according to claim 22, wherein,
the 10-bit target sequence set only comprises sequences with difference values of −4, −2, 0, 2 and 4,
the 10-bit target sequence set does not comprise a sequence with the lowest 5 bits being 5 bits of "00000" or "11111" or a sequence with the highest 4 bits being 4 bits of "0000" or "1111".

29. The 9B/10B decoding method according to claim 22, wherein,
the 10-bit target sequence set comprises 784 codewords, comprising 240 10-bit target balanced sequences and 544 10-bit target unbalanced sequences, which can form 272 pairs of 10-bit target unbalanced sequences which are opposite numbers for each other,
the 240 10-bit target balanced sequences and the 272 pairs of 10-bit target unbalanced sequences are the codes of 512 9-bit source sequences in the 9-bit source sequence set.

30. The 9B/10B decoding method according to claim 29, wherein,
the 272 pairs of 10-bit target unbalanced sequences which are opposite numbers for each other comprise 189 pairs of 10-bit target unbalanced sequences with a difference value of ±2 and 83 pairs of 10-bit target unbalanced sequences with a difference value of ±4.

31. The 9B/10B decoding method according to claim 29, wherein,
the 10-bit target sequence set further comprises 16 10-bit target unbalanced sequences to represent control characters, and the 16 10-bit target unbalanced sequences can form 8 pairs of 10-bit target unbalanced sequences which are opposite numbers for each other, wherein each pair of 10-bit target unbalanced sequences which are opposite numbers for each other is a code of a control character.

32. A 9B/10B decoding method for decoding a 10-bit target sequence set into a 9-bit source sequence set, wherein the decoding method is an inverse transformation of an encoding method, and the encoding method is used for encoding the 9-bit source sequence set into a 10-bit target sequence set, each sequence in the 9-bit source sequence set is a 9-bit binary number, each sequence in the encoded 10-bit target sequence set is a 10-bit binary number, and the 10-bit target sequence set comprises a balanced sequence and an unbalanced sequence,
wherein,
the 9-bit source sequence set comprises a first type of 9-bit source sequence set, a second type of 9-bit source sequence set and a third type of 9-bit source sequence set, wherein the three types of 9-bit source sequence sets are disjoint, and a unified set of the three types of 9-bit source sequence sets has 512 non-repetitive 9-bit source sequences,
the first type of 9-bit source sequence set only comprises 9-bit source sequences with difference values of 1 and −1, and each 9-bit source sequence in the first type of 9-bit source sequence set is encoded into a 10-bit target balanced sequence after inserting 1-bit data "0" or "1" at a same position,
the second type of 9-bit source sequence set alternatively comprises only 9-bit source sequences with a difference value of 3 or only 9-bit source sequences with a difference value of −3,
if the second type of 9-bit source sequence set only comprises 9-bit source sequences with a difference value of 3, 1-bit data "0" is inserted into the 9-bit source sequence, and the formed 10-bit target sequence and an opposite number thereof form a pair of 10-bit target unbalanced sequences with a difference value of ±2, which are codes of the 9-bit source sequence with a difference value of 3,
if the second type of 9-bit source sequence set only comprises 9-bit source sequences with a difference value of −3, 1-bit data is inserted into the 9-bit source sequence, and the formed 10-bit target sequence and an opposite number thereof form a pair of 10-bit target unbalanced sequences with a difference value of ±2, which are codes of the 9-bit source sequence with a difference value of −3,
the third type of 9-bit source sequence set comprises a third type of 9-bit source sequence subset A and a third type of 9-bit source sequence subset B, which are disjoint, and the unified set of the third type of 9-bit source sequence subset A and the third type of 9-bit source sequence subset B is the third type of 9-bit source sequence set,
each 9-bit source sequence comprised in the third type 9-bit source sequence subset A is encoded into a 10-bit target balanced sequence, each 9-bit source sequence comprised in the third type of 9-bit source sequence subset B is encoded into a pair of 10-bit target unbalanced sequences that are opposite numbers for each other.

33. The 9B/10B decoding method according to claim 32, wherein, the third type of 9-bit source sequence subset A comprises two sequences: "00000000" and "11111111".

34. The 9B/10B decoding method according to claim 32, wherein, when inserting 1-bit data at a same position of each 9-bit source sequence in the first type of 9-bit source sequence set, the same position is a leftmost or rightmost position of the 9-bit source sequence, and the inserted 1-bit data is at a highest or lowest bit in the encoded 10-bit target balanced sequence.

35. The 9B/10B decoding method according to claim 32, wherein, when 1-bit data "0" is inserted into the 9-bit source sequence of the second type of 9-bit source sequence set, the position of inserting data is as follows: after a count number of "1" in the 9-bit source sequence from a lowest bit to a high bit sequentially reaches 3, or after a count number of "1" in the 9-bit source sequence from a highest bit to the low bit sequentially reaches 3;

when 1-bit data "1" is inserted into the 9-bit source sequence of the second type of 9-bit source sequence set, the position of inserting data is: after a count number of "0" in the 9-bit source sequence from a lowest bit to a high bit sequentially reaches 3, or after a count number of "0" in the 9-bit source sequence from a highest bit to the low bit sequentially reaches 3.

36. The 9B/10B decoding method according to claim 32, wherein, the third type of 9-bit source sequence subset B comprises a sixth type of 9-bit source sequence set and a seventh type of 9-bit source sequence set, which are disjoint, and the unified set of the sixth type of 9-bit source sequence set and the seventh type of 9-bit source sequence set is the third type of 9-bit source sequence subset B, the sixth type of 9-bit source sequence set alternatively comprises only 9-bit source sequences with a difference value of 5 or only 9-bit source sequences with a difference value of −5, if the sixth type of 9-bit source sequence set only comprises 9-bit source sequences with a difference value of 5, 1-bit data "0" is inserted into the 9-bit source sequence, and the formed 10-bit target sequence and an opposite number thereof form a pair of 10-bit target unbalanced sequences with a difference value of ±4, which are codes of the 9-bit source sequence with a difference value of 5, if the sixth type of 9-bit source sequence set only comprises 9-bit source sequences with a difference value of −5, 1-bit data is inserted into the 9-bit source sequence, and the formed 10-bit target sequence and an opposite number thereof form a pair of 10-bit target unbalanced sequences with a difference value of ±4, which are codes of the 9-bit source sequence with a difference value of −5, each 9-bit source sequence comprised in the seventh type of 9-bit source sequence set is encoded into a pair of 10-bit target unbalanced sequences that are opposite numbers for each other.

37. The 9B/10B decoding method according to claim 36, wherein, when 1-bit data "0" is inserted into the 9-bit source sequence in the sixth type of 9-bit source sequence set, the position of inserting data is as follows: after a count number of "1" in the 9-bit source sequence from a lowest bit to a high bit sequentially reaches 3, or after a count number of "1" in the 9-bit source sequence from a highest bit to the low bit sequentially reaches 3;

when 1-bit data "1" is inserted into a 9-bit source sequence in the sixth type of 9-bit source sequence set, the position of the inserted data is: after a count number of "0" in the 9-bit source sequence from a lowest bit to a high bit sequentially reaches 3, or after a count number of "0" in the 9-bit source sequence from a highest bit to the low bit sequentially reaches 3.

38. The 9B/10B decoding method according to claim 32, wherein, the 10-bit target sequence set only comprises sequences with difference values of −4, −2, 0, 2 and 4, the 10-bit target sequence set does not comprise a sequence with the lowest 4 bits being 4 bits of "0000" or "1111" or a sequence with the highest 5 bits being 5 bits of "00000" or "11111".

39. The 9B/10B decoding method according to claim 32, wherein, the 10-bit target sequence set only comprises sequences with difference values of −4, −2, 0, 2 and 4, the 10-bit target sequence set does not comprise a sequence with the lowest 5 bits being 5 bits of "00000" or "11111" or a sequence with the highest 4 bits being 4 bits of "0000" or "1111".

40. The 9B/10B decoding method according to claim 32, wherein, the 10-bit target sequence set comprises 784 codewords, comprising 240 10-bit target balanced sequences and 544 10-bit target unbalanced sequences, which can form 272 pairs of 10-bit target unbalanced sequences which are opposite numbers for each other, the 240 10-bit target balanced sequences and the 272 pairs of 10-bit target unbalanced sequences are the codes of 512 9-bit source sequences in the 9-bit source sequence set.

41. The 9B/10B decoding method according to claim 40, wherein, the 272 pairs of 10-bit target unbalanced sequences which are opposite numbers for each other comprise 189 pairs of 10-bit target unbalanced sequences with a difference value of ±2 and 83 pairs of 10-bit target unbalanced sequences with a difference value of ±4.

42. The 9B/10B decoding method according to claim 40, wherein, the 10-bit target sequence set further comprises 16 10-bit target unbalanced sequences to represent control characters, and the 16 10-bit target unbalanced sequences can form 8 pairs of 10-bit target unbalanced sequences which are opposite numbers for each other, wherein each pair of 10-bit target unbalanced sequences which are opposite numbers for each other is a code of a control character.

* * * * *